US008817143B2

(12) United States Patent
Murata et al.

(10) Patent No.: US 8,817,143 B2
(45) Date of Patent: Aug. 26, 2014

(54) SOLID-STATE IMAGING DEVICE COMPRISING A HOLDING CIRCUIT AND DRIVING METHOD THEREOF

(75) Inventors: Takahiko Murata, Osaka (JP);
Takayoshi Yamada, Hyogo (JP);
Yoshihisa Kato, Shiga (JP); Shigetaka Kasuga, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/271,466

(22) Filed: Oct. 12, 2011

(65) Prior Publication Data

US 2012/0033117 A1  Feb. 9, 2012

Related U.S. Application Data

(63) Continuation of application No. PCT/JP2010/002769, filed on Apr. 16, 2010.

(30) Foreign Application Priority Data

Apr. 16, 2009 (JP) ................................. 2009-100313
Nov. 10, 2009 (JP) ................................. 2009-257260
Jan. 8, 2010 (JP) ................................. 2010-003368

(51) Int. Cl.
*H04N 3/14* (2006.01)
*H04N 5/217* (2011.01)

(52) U.S. Cl.
USPC .......................................... 348/294; 348/241

(58) Field of Classification Search
USPC .................. 348/294–308, 241–257
See application file for complete search history.

(56) References Cited

U.S. PATENT DOCUMENTS 4,807,038 A    2/1989  Michon
6,084,229 A *  7/2000  Pace et al. ................. 250/208.1
(Continued)

FOREIGN PATENT DOCUMENTS

EP      1014683      6/2000
JP      1-241278     9/1989
(Continued)

OTHER PUBLICATIONS

International Search Report mailed May 25, 2010 for corresponding International Patent Application PCT/JP2010/002769.

(Continued)

*Primary Examiner* — Tuan Ho
*Assistant Examiner* — Selam Gebriel
(74) *Attorney, Agent, or Firm* — McDermott Will & Emery LLP

(57) ABSTRACT

A plurality of pixel circuits arranged in rows and columns, and each of which outputs an electric signal according to an amount of received light; a first column signal line provided for each of the columns, and for sequentially transferring the electric signals from said pixel circuits in a corresponding column; and a holding circuit provided for each of the pixel circuits in each column, and which holds the electric signal transferred through the column signal line in the corresponding column are provided. A holding circuit includes a first capacitor which holds a first electric signal of the corresponding pixel circuit in a reset state; and a second capacitor which holds a second electric signal after the corresponding pixel circuit receives light. A difference circuit calculates a difference between two electric signals held by the first capacitor and the second capacitor in a same holding circuit.

29 Claims, 35 Drawing Sheets

(56) References Cited

U.S. PATENT DOCUMENTS

| | | |
|---|---|---|
| 6,730,898 B2 * | 5/2004 | Machida .................... 250/208.1 |
| 6,757,018 B1 * | 6/2004 | Fowler ......................... 348/301 |
| 7,443,435 B2 * | 10/2008 | Loose ........................... 348/294 |
| 7,598,992 B2 * | 10/2009 | Matsuda ....................... 348/294 |
| 7,652,708 B2 | 1/2010 | Nakajima |
| 7,667,171 B2 * | 2/2010 | Kasuga et al. ............. 250/208.1 |
| 7,683,817 B2 | 3/2010 | Murata et al. |
| 7,791,524 B2 | 9/2010 | Kasuga et al. |
| 7,956,916 B2 | 6/2011 | Murata et al. |
| 7,973,840 B2 | 7/2011 | Kasuga et al. |
| 8,018,510 B2 | 9/2011 | Murata et al. |
| 8,040,418 B2 | 10/2011 | Murata et al. |
| 8,279,310 B2 | 10/2012 | Ui |
| 2003/0052252 A1 | 3/2003 | Sugiyama et al. |
| 2004/0080637 A1 * | 4/2004 | Nakamura et al. ............ 348/255 |
| 2004/0141077 A1 * | 7/2004 | Ohkawa ........................ 348/308 |
| 2005/0094012 A1 * | 5/2005 | Gomi et al. ................... 348/308 |
| 2005/0173618 A1 | 8/2005 | Sugiyama et al. |
| 2005/0174612 A1 | 8/2005 | Sugiyama et al. |
| 2005/0253946 A1 * | 11/2005 | Shinohara .................... 348/300 |
| 2005/0259167 A1 * | 11/2005 | Inoue et al. .................. 348/300 |
| 2005/0285958 A1 * | 12/2005 | Matsuda ....................... 348/300 |
| 2006/0164529 A1 | 7/2006 | Shimizu |
| 2007/0030372 A1 * | 2/2007 | Inagaki et al. ................ 348/308 |
| 2007/0109432 A1 * | 5/2007 | Yamaguchi et al. .......... 348/294 |
| 2007/0132868 A1 * | 6/2007 | Lee et al. ..................... 348/308 |
| 2008/0018760 A1 | 1/2008 | Nakajima |
| 2008/0186394 A1 * | 8/2008 | Panicacci ..................... 348/308 |
| 2008/0291223 A1 * | 11/2008 | Yamazaki et al. ............ 345/690 |
| 2009/0040349 A1 * | 2/2009 | Xu ................................ 348/302 |
| 2009/0073279 A1 | 3/2009 | Ui |
| 2009/0256937 A1 * | 10/2009 | Noda et al. .................... 348/300 |
| 2010/0073524 A1 * | 3/2010 | Tu et al. ....................... 348/243 |
| 2010/0097371 A1 * | 4/2010 | Willassen ..................... 345/214 |
| 2011/0272751 A1 * | 11/2011 | Inagaki et al. ............... 257/292 |
| 2012/0324714 A1 | 12/2012 | Ui |
| 2013/0032697 A1 * | 2/2013 | De Wit ...................... 250/208.1 |

FOREIGN PATENT DOCUMENTS

| | | |
|---|---|---|
| JP | 2000-184282 | 6/2000 |
| JP | 2003-169251 | 6/2003 |
| JP | 2003-319265 A | 11/2003 |
| JP | 2004-159155 | 6/2004 |
| JP | 2005-277709 A | 10/2005 |
| JP | 2006-093816 | 4/2006 |
| JP | 2006-094192 A | 4/2006 |
| JP | 2006-270292 | 10/2006 |
| JP | 2007-143067 | 6/2007 |
| JP | 2008-028517 A | 2/2008 |
| JP | 2009-076966 A | 4/2009 |

OTHER PUBLICATIONS

Japanese Office Action issued in Japanese Patent Application No. 2010-003368 mailed on Jul. 23, 2013.

Japanese Office Action issued in Japanese Patent Application No. 2009-257260 mailed on Jul. 23, 2013.

Japanese Office Action issued in Japanese Patent Application No. 2009-100313 mailed on Jul. 23, 2013.

* cited by examiner

SOLID-STATE IMAGING DEVICE COMPRISING A HOLDING CIRCUIT AND DRIVING METHOD THEREOF

CROSS REFERENCE TO RELATED APPLICATION

This is a continuation application of PCT application No. PCT/JP2010/002769 filed on Apr. 16, 2010, designating the United States of America.

BACKGROUND OF THE INVENTION (1) Field of the Invention

The present invention relates to a Complementary Metal Oxide Semiconductor (CMOS) solid-state imaging device.

(2) Description of the Related Art

A conventional solid-state imaging device shall be described with reference to FIG. 1.

FIG. 1 illustrates a circuit configuration for one pixel in the conventional solid-state imaging device according to Patent Literature 1: Japanese Unexamined Patent Application Publication No. 2004-159155. As illustrated in FIG. 1, the pixel includes a switching circuit 900 and a photodiode 910, and the switching circuit includes a transfer transistor TRt, a capacitor C, a reset transistor TRr, a sense amplifier transistor TRa, and a switching transistor TRs.

Along a pixel row, an address line A1, a transfer control line T and a reset line R are provided. The transfer control line T and the reset line R are connected to a vertical scanning circuit (not illustrated). Along a pixel column, a signal line L1 and a bias line B are provided.

Next, a conventional solid-state imaging device shall be described with reference to FIG. 2. As illustrated in FIG. 2, when assuming a global shutter input mode, which is a short-time exposure method, the vertical scanning circuit sends all-reset signal in high (H) level for an instant simultaneously to the reset lines in all rows in response to an input of a trigger signal. At the same time, the vertical scanning circuit sends all transfer signal in H level to transfer control lines T in all rows. With this, the pixel signal accumulated in the photodiodes 910 and capacitors C in all pixels is discharged through the reset transistors TRr, resetting the photodiodes 910 and the capacitors C in all pixels.

Subsequently, the vertical scanning circuit resends the all transfer signal in H level for an instant before negating the vertical synchronization signal. With this, the transfer transistor TRt is turned off for a short period of time, and the photodiodes 910 in all of the pixels are exposed to light in the meantime. In all of the pixels, the pixel signals move to the capacitors C from the photodiodes 910 to the capacitors C through the transfer transistor TRt when resending all of the transfer signals, and the pixel signals are temporarily accumulated in the capacitors C.

Subsequently, the vertical scanning circuit sends an address line selection signal for each row. With this, the pixel signal obtained by exposing all of the pixels to light is sent to the sense amplifier transistor TRa and amplified. Furthermore, the amplified pixel signal is sent to the signal line L1 through the switching transistor TRs, and an image signal can be obtained.

SUMMARY OF THE INVENTION

However, in the conventional solid-state imaging device, the capacitor C arranged between the photodiode 910 and the sense-amplifier transistor TRa is a so-called floating diffusion (FD) unit, and has a large dark current. Accordingly, in a pixel which holds electric charge for a long time (for example, time equal to one frame at the maximum in the global shutter operation), there is a problem that the noise called white spot due to the dark current is generated, degrading image quality.

The present invention has been conceived in view of the conventional problem above, and it is an object of the present invention to provide a solid-state imaging device applicable to various shutter operations including the global shutter operations, and is capable of suppressing the reduction in the image quality of the obtained image.

In order to achieve the object above, the solid-state imaging device according to the present invention includes: a plurality of pixel circuits arranged in rows and columns, and each of which outputs an electric signal according to an amount of received light; a column signal line provided for each of the columns, and for sequentially transferring the electric signals from the pixel circuits in a corresponding column; and at least one holding circuit provided for each of at least one pixel circuit in each column, and which holds the electric signal transferred from the corresponding pixel circuit through the column signal line in the corresponding column.

With this configuration, in the global operation, after the electric signal according to the amount of received light is transferred from the pixel circuit to the holding circuit and held in the holding circuit, the electric signal can be output to outside of the solid-state imaging device from the holding circuit after a predetermined waiting time adjusted to the requirement from outside such as the frame rate.

Here, regardless of the request from outside, the electric signal may be transferred from the pixel circuit to the holding circuit at a highest-speed capacity of the column signal line. Thus, the time during which the pixel circuit has to hold the electric signal is as long as a time necessary for finishing the transfer from the entire pixel circuits in one column to the holding circuit at maximum. The electric signal is held by the holding circuit for the rest of the time waiting for the output to outside.

The holding circuit is arranged at a location for receiving the electric signal transferred from the pixel circuit to the column signal line; that is, outside of the pixel circuit, and thus there is no strong demand for reducing the area of the footprint compared to the pixel circuit. Accordingly, by providing a device such as a relatively large capacitor, the holding circuit can hold the electric signal at low noise for longer time, compared to the case in which the electric signal is held in the pixel circuit.

Accordingly, compared to the conventional global operation in which the signal charge is held by the pixel circuit for as long as one frame at maximum, the noise due to the dark current is reduced, allowing the global operation suppressing the reduction in the image quality to be implemented by the solid-state imaging device.

Furthermore, each of the at least one holding circuit may include: a first capacitor which holds a first electric signal of the corresponding pixel circuit in a reset state; and a second capacitor which holds a second electric signal after the corresponding pixel circuit receives light, and the solid-state imaging device may further include a difference circuit provided for each column, and which calculates a difference between the first electric signal held by the first capacitor and the second electric signal held by the second capacitor, the first capacitor and the second capacitor being included in the holding circuit in the corresponding column.

According to this configuration, calculating the difference between the electric signal in reset state and the electric signal after receiving light for each pixel circuit cancels variation in the characteristics between the pixel circuits, and a signal with high S/N ratio can be obtained.

Furthermore, each of the pixel circuits may include: a photodiode which generates electric charge according to the amount of received light; a transfer transistor connected to an output of the photodiode; a floating diffusion unit configured to convert the electric charge generated by the photodiode and transferred via the transfer transistor into voltage; a reset transistor which sets the floating diffusion unit to a reset state; and an output transistor having a gate connected to the floating diffusion unit, and which outputs an electric signal according to the voltage converted by the floating diffusion unit, and gates of the transfer transistors may be commonly connected and gates of the reset transistor are commonly connected.

With this configuration, the electric signal having the synchronism with the same light-exposure period can be obtained.

Furthermore, the pixel circuits may be grouped for each predetermined number of rows, and gates of the transfer transistors in the pixel circuits in a group may be commonly connected and gates of the reset transistor in the pixel circuits in a group may be commonly connected.

With this configuration, the processing including the exposure to light and transfer of the electric signal can be sequentially performed for each group. In this case, instead of losing the synchronism in all of the pixels during the exposure period, the time necessary for holding the electric signal in the pixel circuit can be reduced to a time necessary for finishing the transfer from all of the pixel circuits in one group to the holding circuits at maximum. Thus, it is effective for a case focusing on the reduction in noise due to the dark current.

Furthermore, each of the pixel circuits may further include another transfer transistor inserted between the floating diffusion unit and the output transistor, and which is different from the transfer transistor.

With this configuration, after distributing the electric charge in the floating diffusion unit to the parasitic capacitance of the output transistor, the floating diffusion unit can be electrically isolated from the parasitic capacitance. The electric signal according to the amount of electric charge distributed to the parasitic capacitance is output from the pixel circuit. With this, the noise due to the dark current in the floating diffusion unit is reduced.

Furthermore, the solid-state imaging device may further include a buffer circuit provided for each column and sequentially outputs a voltage signal according to an output current from the pixel circuits in the corresponding column to the column signal line in the corresponding column, in which the holding circuit in each column may hold the voltage signal transferred from the buffer circuit in the corresponding column through the column signal line of the corresponding column.

Furthermore, the buffer circuit may include a current mirror circuit and a difference circuit.

With this configuration, the electric signal from the pixel circuit is extracted as the current signal. Thus, the voltage change in the lines in which the electric signal flows, suppressing the reduction in the transfer speed due to the influence of the line capacitance. As a result, it is possible to transfer the electric signal at high speed from the pixel circuit to the holding circuit.

Furthermore, the solid-state imaging device may further include a plurality of sets of the buffer circuit and the column signal line, each of the sets being provided for a corresponding column, in which the buffer circuit in each set outputs the voltage signal according to an output current from the pixel circuits to the column signal line in the set, the pixel circuits being different for each set of the corresponding column, and the holding circuit in each column may hold the voltage signal transferred from the buffer circuit in the set in the corresponding column through the column signal line in the set.

With this configuration, by having multiple transfer paths, the time necessary for transferring the electric signal from the pixel circuits to the holding circuit is reduced.

Furthermore, the solid-state imaging device may further include a column amplifier inserted between the column signal line in the corresponding column and the holding circuit in the corresponding column, for each column.

With this configuration, the holding circuit can hold the electric signal with high S/N ratio after amplified by the column amplifier.

Furthermore, the solid-state imaging device may further include a vertical scanning circuit which generates a driving signal for each row for driving the pixel circuit in valid periods which are independent from each other such that the valid periods of the driving signals for all row are identical, and the valid period for another row starts within the valid period of the driving signal for one row, and which supplies the pixel circuit in the corresponding row with the generated driving signal.

With this configuration, the vertical scanning circuit starts the valid period of the driving signal for another row during the valid period of each driving signal. Thus, by driving a next row in a driving pulse period for one row the driving pulse is given for multiple rows allowing reading out the electric signal. Furthermore, the driving signals are supplied to each row slightly delayed with a predetermined timing, and the rows are simultaneously driven. Thus, the electric signals are transferred at high-speed, reducing the shutter time difference for each row, reducing the distortion in image.

Here, each of the pixel circuits may include: a photodiode which generates electric charge according to the amount of received light; a transfer transistor connected to an output of the photodiode; a floating diffusion unit which converts the electric charge generated by the photodiode and transferred via the transfer transistor into voltage; a reset transistor which sets the floating diffusion unit to a reset state; and an output transistor having a gate connected to the floating diffusion unit, and which outputs a first electric signal when the floating diffusion unit is in reset state and a second electric signal according to the voltage signal, in which the driving signal includes a reset gate driving signal for turning ON the reset transistor included in the pixel circuit and a transfer gate driving signal for turning ON the transfer transistor included in the pixel circuit, and the vertical scanning circuit generates one of or both of the reset gate driving signal and the transfer gate driving signal to supply the generated signal to the pixel circuit in the corresponding row.

With this configuration, at least one of the reset gate driving signal and the transfer gate driving signal is generated by the vertical scanning circuit as the driving signal and supplied to the pixel circuit. Accordingly, the pixel circuit outputs the reset signal and the electric signal with a predetermined timing, reducing the shutter time difference for each row.

Furthermore after supplying the pixel circuit in one row with the reset-gate driving signal and supplying the pixel circuit in another row with the reset-gate driving signal, the vertical scanning circuit supplies the pixel circuit in the one row with the transfer gate signal.

With this configuration, after supplying the reset gate driving signal in the pixel circuit in one row, the pixel circuit supplies the pixel circuit in the other row with the reset gate driving signal before supplying the pixel circuit in one row with the transfer gate driving signal. Thus, it is possible to simultaneously drive multiple rows, reducing the shutter time difference for each column.

Furthermore, output of the first electric signal from the pixel circuit in one row and the second electric signal from the pixel circuit in another row may be sequentially provided to the column signal line.

With this configuration, the reset signal which is the first electric signal and the voltage signal which is the second electric signal are sequentially output from the pixel circuits in different rows. Thus, it is possible to transfer these signals at higher speed, reducing the shutter time difference for each row.

Furthermore, the solid-state imaging device may further include a memory scanning circuit for selecting, among the at least one holding circuit, a holding circuit to hold the first electric signal, and a holding circuit to hold the second electric signal, in synchronization with the vertical scanning circuit.

With this configuration, the memory scanning circuit selects the first and second holding circuits in synchronization with the vertical scanning circuit. Thus, it is possible to store the electric signal output from the pixel circuit in the holding circuit efficiently, reducing the shutter time difference for each row.

Furthermore, the column signal line may include a load transistor included in a source follower circuit together with the output transistor, and the source follower circuit may sequentially output the electric signals from the pixel circuits to the column signal line.

Furthermore, the column signal line may include a load transistor included in a current amplifier circuit together with the output transistor, and the current amplifier circuit may sequentially output the electric signals from the pixel circuits to the column signal line.

With this configuration, the source follower circuit or the column amplifier circuit is provided in the column signal line, allowing an efficient output of the electric signal from the pixel circuit to the column signal line.

Furthermore, the vertical scanning circuit may generate a selection signal for the pixel circuit to output the electric signal in a part of a valid period of the driving signal in a corresponding row, and may supply the pixel circuit in the corresponding row with the generated selection signal.

Furthermore, the vertical scanning circuit may generate the selection signal for each row in a predetermined period immediately before an end of the driving signal in the corresponding row.

With this configuration, supplying the selection signal to the pixel circuit in a part of the valid period of the driving signal allows an efficient output of the electric signal from the pixel circuit in each row to the column signal line with a predetermined timing.

Furthermore, the solid-state imaging device may further include a second holding circuit for holding an output signal from a first holding circuit, which is the holding circuit.

With this, at the time of global operation, the electric signal according to the amount of received light is transferred from the pixel circuit to the first holding circuit. After that, after transferring the electric signal to the second holding circuit for holding, the electric signal can be output to outside of the solid-state imaging device from the second holding circuit after the predetermined waiting time adjusted to the request from outside such as the frame rate has passed. As described above, the two types of the holding circuits for holding the electric signal output from the pixel are arranged outside of the pixel with no strong demand for reducing the area of the footprint, and by further using a relatively large capacitor for the holding circuit, for example, allows holding the electric signal for longer period of time with low noise, compared to the case in which the electric signal is held in the pixel circuit.

Furthermore, the first holding circuit may include: a first capacitor which holds a first electric signal of the pixel circuit in a reset state; and a second capacitor which holds a second electric signal after the corresponding pixel circuit receives light, and the solid-state imaging device further includes a difference circuit provided for each column, and which calculates a difference between the first electric signal held by the first capacitor and the second electric signal held by the second capacitor, the first capacitor and the second capacitor being included in the holding circuit in the corresponding column, and the second holding circuit may hold an electric signal representing the difference calculated by the difference circuit.

With this, even when the electric signals in reset state in the pixel corresponding to one period is output, and the electric signals after receiving light in the pixel corresponding to another period are output, it is possible to obtain the difference between the reset signal in the corresponding pixel and the signal after receiving light. Thus, the second holding circuit holding the electric signal composed of the capacitor for one pixel circuit allows reducing the area of the holding circuit.

Furthermore, the first holding circuit may include a capacitor which holds an electric signal of a corresponding pixel circuit in a reset state, the solid-state imaging device may further include a difference circuit provided for each column, and which calculates a difference between a first electric signal held by the capacitor in the first holding circuit in a corresponding column and the first electric signal after the corresponding pixel circuit receives light, and the second holding circuit holds an electric signal representing the difference in the difference circuit.

With this, even when the electric signal in the reset state in the corresponding pixel and the electric signal after receiving light are alternately output, it is possible to obtain the difference between the reset signal in the corresponding pixel and the electric signal after receiving light. Thus, by holding the electric signal with the second holding circuit having the capacitor as much as one pixel circuit allows reducing the area of the holding circuit.

Furthermore, the first holding circuit and the second holding circuit may hold the electric signal as an analog value.

With this, it is possible to hold a toned signal by a small capacitor.

Furthermore, a capacitance value of the first holding circuit may be larger than a capacitance value of the second holding circuit.

With this, it is possible to make the noise generated in the first holding circuit smaller than the noise generated in the second holding circuit.

Note that, the present invention may not only be implemented as a solid-state imaging device, but also as a driving method of the solid-state imaging device.

As described above, according to the solid-state imaging device according to the present invention, the holding circuit for holding the electric signal output from each pixel circuit is arranged outside of the pixel circuit with no strong demand for reducing the area of the footprint. Thus, by using a relatively large capacitor, for example, the holding circuit can be configured to be capable of holding the electric signal for longer time with low noise, compared to the case in which the electric signal is held in the pixel circuit.

In this configuration, after transferring the electric signal according to the amount of received light from the pixel circuit to the holding circuit and holding the electric signal, after the predetermined waiting time suitable for external request such as frame rate, the electric signal is output to outside of the solid-state imaging device from the holding circuit. With this, the electric signal is held for a longer period of time by the holding circuit than by the pixel circuit before the output to outside. Thus, the noise due to the dark current is reduced.

These effects can be obtained in the shutter operations including at least the global shutter operation as described above. As a result, the solid-state imaging device applicable to the various shutter operations including the global shutter operation and is capable of suppressing the reduction of the image quality of the image to be obtained can be implemented.

FURTHER INFORMATION ABOUT TECHNICAL BACKGROUND TO THIS APPLICATION

The disclosure of Japanese Patent Application No. 2009-100313 filed on Apr. 16, 2009, including specification, drawings and claims is incorporated herein by reference in its entirety.

The disclosure of Japanese Patent Application No. 2009-257260 filed on Nov. 10, 2009, including specification, drawings and claims is incorporated herein by reference in its entirety.

The disclosure of Japanese Patent Application No. 2010-003368 filed on Jan. 8, 2010 including specification, drawings and claims is incorporated herein by reference in its entirety.

The disclosure of PCT application No. PCT/JP2010/002769 filed on Apr. 16, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

The following shall describe the solid-state imaging device according to Embodiments of the present invention with reference to the drawings. Note that, although the description of the present invention shall be made using the following Embodiments and the attached drawings, these are merely for illustrating example, and it is not intended to limit the present invention with them.

Embodiment 1

The configuration and operations of the solid-state imaging device according to Embodiment 1 shall be described.

The solid-state imaging device according to Embodiment 1 is a MOS solid-state imaging device. Main features of the solid-state imaging device includes having more than one pixel circuit arranged in rows and columns and at least one holding circuit each corresponding to one of the pixel circuits is provided in addition to the pixel circuits separate from the pixel circuit, and each of the holding circuits holds an electric signal transferred from the corresponding pixel circuit through the column signal line.

Basic Configuration of Embodiment 1

Figure 1:
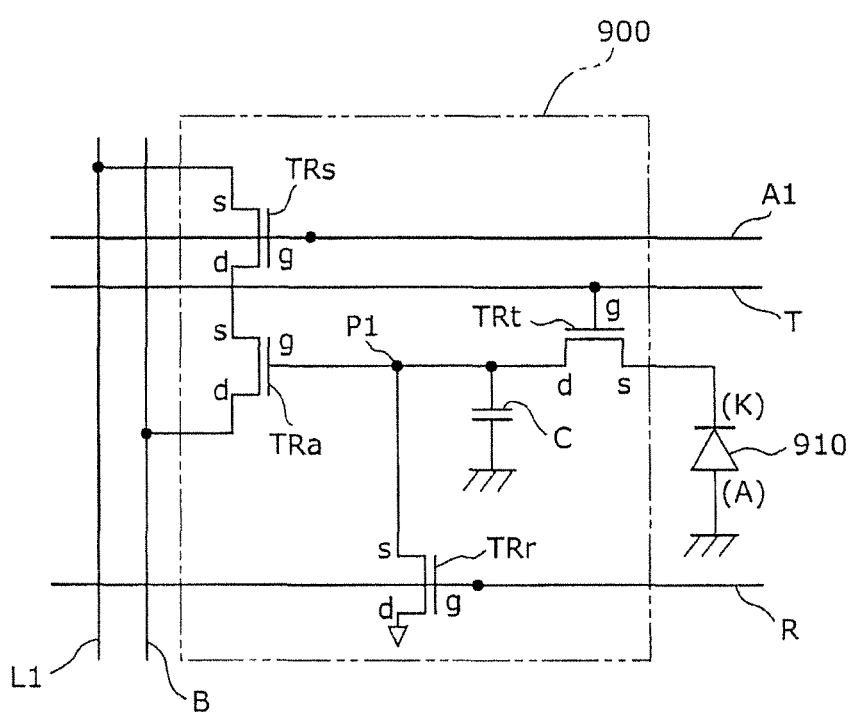
FIG. 1 is a circuit diagram illustrating the configuration for one pixel of a conventional solid-state imaging device.
Figure 2:
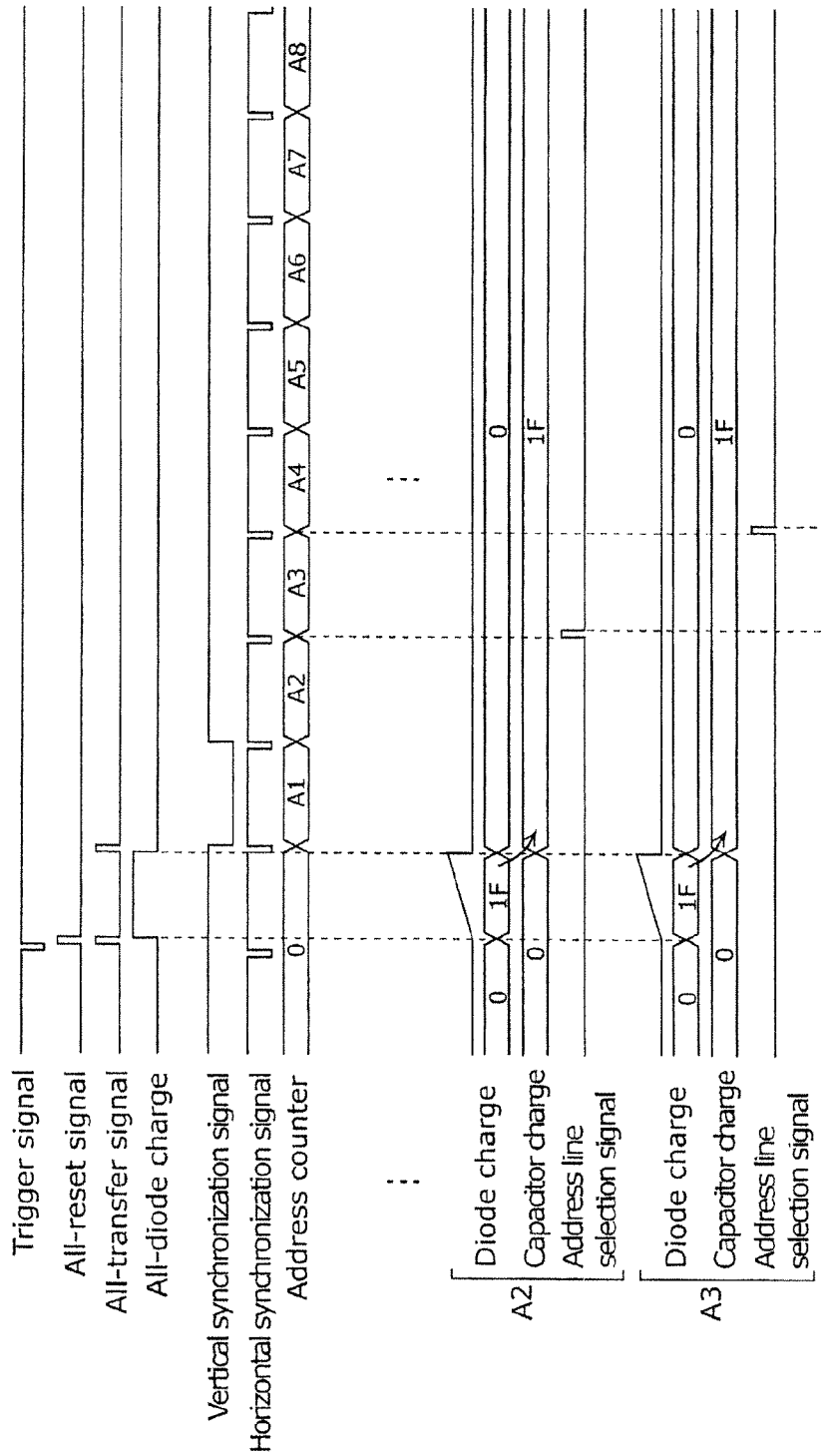
FIG. 2 is a timing chart for describing the operations by the conventional solid-state imaging device.
Figure 3:
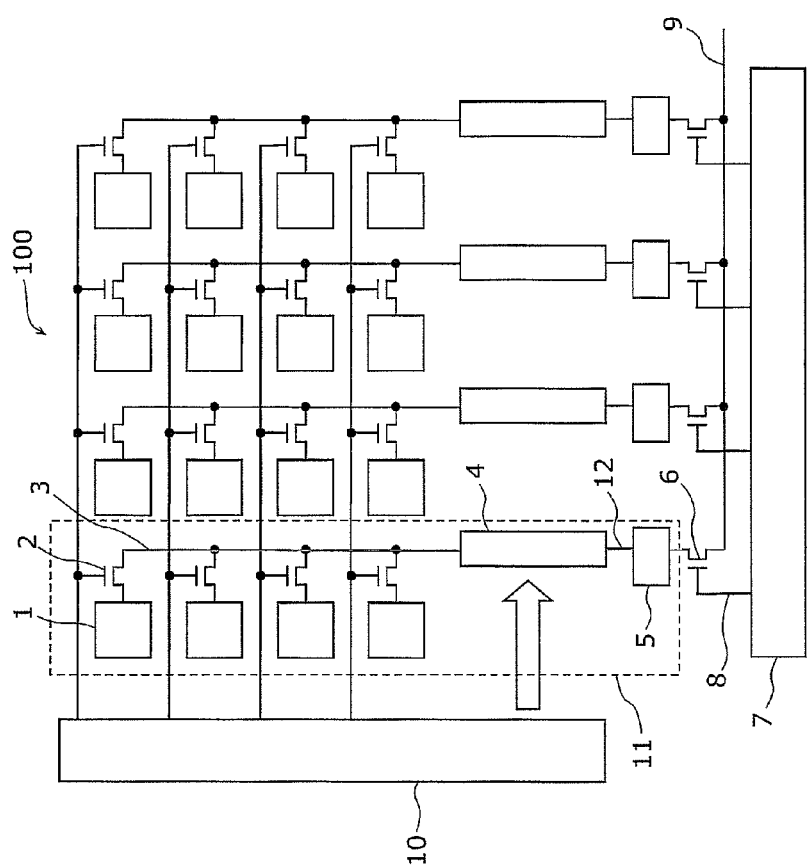
FIG. 3 is a block diagram illustrating the configuration of a solid-state imaging device according to Embodiment 1 of the present invention.

FIG. 3 is a block diagram illustrating a basic configuration of the solid-state imaging device according to Embodiment 1. As an example, FIG. 3 illustrates a configuration with four rows and four columns included in the solid-state imaging device.

The solid-state imaging device 100 in FIG. 3 includes pixel circuits 1, row selection transistors 2, first column signal lines 3, second column signal lines 12, storage units 4, difference circuits 5, column selection transistors 6, a horizontal scanning circuit 7, column selection signal lines 8, a common signal line 9, and a vertical scanning circuit 10. Note that, the horizontal scanning circuit 7 is also referred to as a column scanning circuit, and the vertical scanning circuit 10 is also referred to as a row scanning circuit.

Each of the pixel circuits 1 is arranged in a matrix, and outputs an electric signal at a voltage corresponding to incident light to the row selection transistor 2. More specifically, the pixel circuit 1 is controlled according to an output signal from the vertical scanning circuit 10, and the pixel circuit 1 outputs a voltage according to the incident light to the row selection transistor 2. The row selection transistor 2 is switched between the conduction state and non-conduction state according to the output signal from the vertical scanning circuit 10, and the row selection transistor 2 outputs the electric signal from the pixel circuit 1 to the first column signal line 3 while in conduction state.

The first column signal line 3 outputs the output voltage from the row selection transistor 2 to the storage unit 4, and a signal voltage is held by the storage unit 4. The voltage held by the storage unit 4 is output to the difference circuit 5 through the second column signal line 12. The difference circuit 5 outputs a difference between the two signals in the storage unit 4. The column selection transistor 6 is switched between the conduction state and the non-conduction state according to the output signal from the horizontal scanning circuit 7 through the column selection signal line 8, and the column selection transistor 6 outputs the difference voltage held in the difference circuit 5 to the common signal line 9 while in conduction state.

Figure 4:
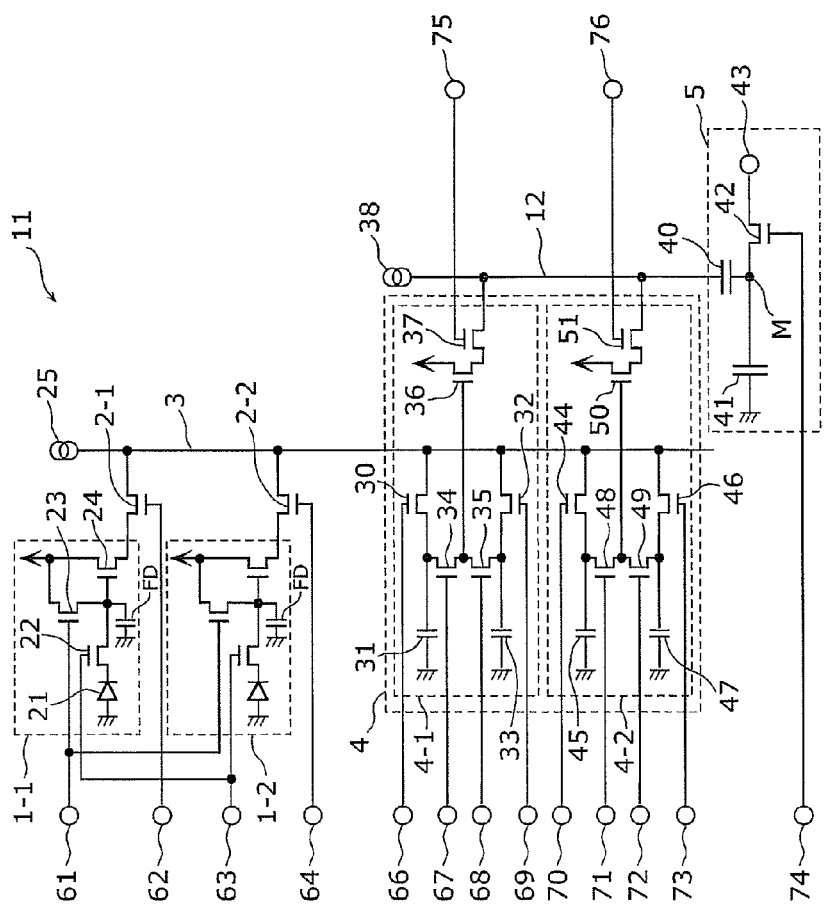
FIG. 4 is a circuit diagram illustrating an example of essential components of the solid-state imaging device according to Embodiment 1.

FIG. 4 illustrates an example of the configuration of the column circuit 11 illustrated in broken lines in FIG. 3.

In FIG. 4, the pixel circuit 1-1 corresponds to the pixel circuit 1 in FIG. 3, and includes a photodiode 21, a transfer transistor 22, a reset transistor 23, and a transistor 24. The pixel circuit 1-2 is another pixel circuit with the configuration identical to that of the pixel circuit 1-1. Note that, an MOS transistor is suitably used for each of the transistors in this Specification.

In the pixel circuit 1-1, the anode of the photodiode 21 is grounded, and the cathode is connected to the drain of the transfer transistor 22. The source of the transfer transistor 22 is connected to the source of the reset transistor 23 and the gate of the transistor 24, and the connecting area forms a diffusion capacitance which is referred to as an FD unit. The gate of the transfer transistor 22 is connected to the terminal 63.

The drain of the reset transistor 23 is connected to a power supply, and the gate is connected to the terminal 61. The drain of the transistor 24 is connected to the power supply, and the source is connected to the drain of the row selection transistor 2-1.

The current source 25 is connected to the first column signal line 3. The row selection transistor 2-1 corresponds to the row selection transistor 2 in FIG. 3, and the row selection transistor 2-1 forms a source follower circuit with the transistor 24 and the current source 25 when in the conduction state. A row selection transistor 2-2 is a row selection transistor for another pixel circuit and functions in the same manner as the row selection transistor 2-1.

The outputs of the pixel circuit 1-1 and the pixel circuit 1-2 are connected to the first column signal line 3 through the row selection transistor 2-1 and the row selection transistor 2-2, respectively. The gate of the row selection transistor 2-1 is connected to the terminal 62, and the gate of the row selection transistor 2-2 is connected to the terminal 64.

In the storage unit 4, a holding circuit 4-1 is provided corresponding to the pixel circuit 1-1. The holding circuit 4-1 has the following configuration.

The drain of the transistor 30 is connected to the first column signal line 3, and the source of the transistor 30 is connected to the first terminal of a capacitor 31. The second terminal of the capacitor 31 is grounded.

The drain of the transistor 32 is connected to the first column signal line 3, and the source of the transistor 32 is connected to the first terminal of a capacitor 33. The second terminal of the capacitor 33 is grounded.

The first terminal of the capacitor 31 is connected to the drain of the transistor 34, and the source of the transistor 34 is connected to the source of the transistor 35 and the gate of the transistor 36.

The first terminal of the capacitor 33 is connected to the drain of the transistor 35, and the source of the transistor 35 is connected to the source of the transistor 34 and the gate of the transistor 36.

The gate of the transistor 30 is connected to the terminal 66, the gate of the transistor 32 is connected to the terminal 69, the gate of the transistor 34 is connected to the terminal 67, and the gate of the transistor 35 is connected to the terminal 68.

The drain of the transistor 36 is connected to the power supply, and the source is connected to the drain of the row selection transistor 37. The gate of the row selection transistor 37 is connected to the terminal 75, and the source is connected to the second column signal line 12.

The current source 38 is connected to the second column signal line 12.

The circuit configured of the transistor 36, the row selection transistor 37, and the current source 38 performs the operations same as that of a circuit configured of the transistor 24, the row selection transistor 2-1, and the current source 25, and when the row selection transistor 37 is in conduction state, a source follower circuit is formed with the row selection transistor 37, the transistor 36 and the current source 38.

Similarly, the holding circuit 4-2 is provided corresponding to the pixel circuit 1-2. The holding circuit 4-2 has the following configuration.

The drain of the transistor 44 is connected to the first column signal line 3, and the source of the transistor 44 is connected to the first terminal of a capacitor 45. The other terminal of the capacitor 45 is grounded.

The drain of the transistor 46 is connected to the first column signal line 3, and the source of the transistor 46 is connected to the first terminal of the capacitor 47. The other terminal of the capacitor 47 is grounded.

The first terminal of the capacitor 45 is connected to the drain of the transistor 48, and the source of the transistor 48 is connected to the source of the transistor 49 and the gate of the transistor 50.

The first terminal of the capacitor 47 is connected to the drain of the transistor 49, and the source of the transistor 49 is connected to the source of the transistor 48 and the gate of the transistor 50.

The gate of the transistor 44 is connected to the terminal 70, the gate of the transistor 46 is connected to the terminal 73, the gate of the transistor 48 is connected to the terminal 71, and the gate of the transistor 49 is connected to the terminal 72.

The drain of the transistor 50 is connected to the power supply, and the source is connected to the drain of the row selection transistor 51. The gate of the row selection transistor 51 is connected to the terminal 76, and the source is connected to the second column signal line 12.

The circuit configured of the transistor 50, the row selection transistor 51, and the current source 38 performs the operations same as that of a circuit configured of the transistor 24, the row selection transistor 2-1, and the current source 25, and when the row selection transistor 51 is in conduction state, a source follower circuit is formed with the row selection transistor 51, the transistor 50, and the current source 38.

The difference circuit 5 is configured of the capacitors 40, 41 and the transistor 42.

The second column signal line 12 is connected to the first terminal of the capacitor 40, and the second terminal of the capacitor 40 is connected to the first terminal of the capacitor 41 and the drain of the transistor 42. The second terminal of the capacitor 41 is grounded.

The gate of the transistor 42 is connected to the terminal 74, and the source is connected to the terminal 43. The terminal 43 is set at a reference voltage Vref.

Driving Method According to Embodiment 1

Figure 5:
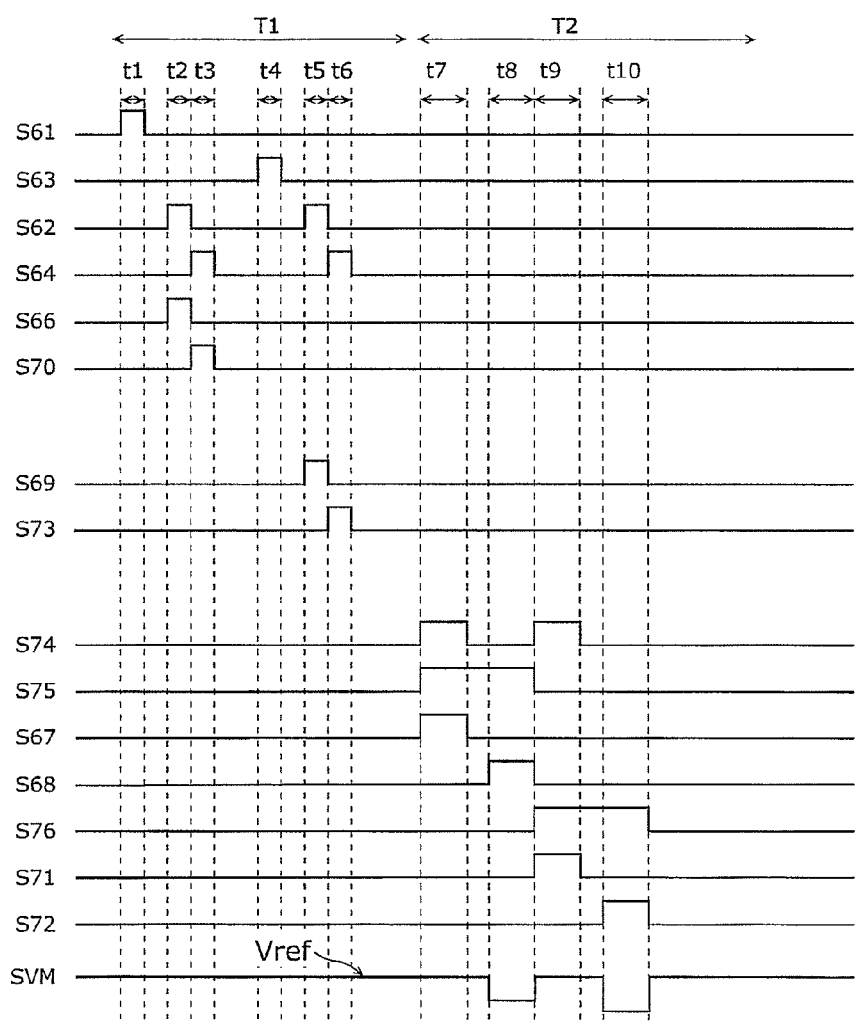
FIG. 5 is a timing chart illustrating temporal changes of major signals in the solid-state imaging device according to Embodiment 1.

The following shall describe a method of driving the solid-state imaging device according to Embodiment 1 with reference to FIGS. 4 and 5. The solid-state imaging device performs a global shutter operation based on the driving method.

FIG. 5 is a timing chart illustrating temporal changes of major signals in the solid-state imaging device driven by the driving method according to Embodiment 1.

FIG. 5 illustrates control signal applied to each terminal in FIG. 4, and voltage signals SVM at a point connecting the capacitor 40 and the capacitor 41 in FIG. 4. Each control signal is represented by a sign with S added to the sign of the terminal to which the control signal is applied.

The period T1 in FIG. 5 is a period for transferring signal voltage from the pixel circuits 1-1 and 1-2 to the holding circuits 4-1 and 4-2, respectively, and the period T2 is a period for calculating the difference between the signals held by the storage unit 4, and outputs the difference from the common signal line 9.

The operations of the solid-state imaging device 100 in the period T1 shall be described.

In the period t1, the gate of the reset transistor 23 in each pixel circuit is switched to "high" for conduction, resetting the FD unit in each pixel circuit by simultaneously connecting the FD units to the power supply.

In the period t2, the gates of the row selection transistor 2-1 and the transistor 30 are switched to "high" for conduction. With this, the voltage during the reset state of the FD unit in the pixel circuit 1-1 (hereafter referred to as reset voltage) is held by the capacitor 31 through the transistor 24, the row selection transistor 2-1, and the transistor 30. For example, when the reset voltage of the FD unit is Vr, a voltage drop in the transistor 24 is Vt1, and the gain is A1, a voltage calculated by (A1*Vr−Vt1) is held by the capacitor 31.

In the period t3, the gates of the row selection transistor 2-2 and the transistor 44 are switched to "HIGH" for conduction, selecting the row selection transistor 2-2. Accordingly, in the same manner as the period t2, the reset voltage of the pixel circuit 1-2 is held by the capacitor 45. Assuming the voltage drop in the transistor in the pixel circuit 1-2 corresponding to the transistor 24 is Vt2, and the gain is A2, the voltage calculated by (A2*Vr−Vt2) is held by the capacitor 45.

In the period t4, the gate of the transfer transistor 22 in each pixel circuit is switched to "HIGH" for conduction, and the charges generated at the photodiode 21 in each pixel circuit are transferred to the FD unit simultaneously. A voltage according to the amount of transferred charge (hereafter referred to as a signal voltage) is generated at the FD unit. The voltage generated at the FD unit in the pixel circuit 1-1 is referred to as Vs1, and the voltage generated at the FD unit of the pixel circuit 1-2 is referred to as Vs2.

In the period t5, the gates of the row selection transistor 2-1 and the transistor 32 are switched to "HIGH" for conduction. With this, the voltage of the FD unit in the pixel circuit 1-1 is held by the capacitor 33 through the transistor 24, the row selection transistor 2-1, and the transistor 32. The voltage at the FD unit is (Vr−Vs1), and the voltage held by the capacitor 33 is {A1*(Vr−Vs1)−Vt1}.

In the period t6, the row selection transistor 2-2 is selected, and in the same manner as the period t5, the voltage of the FD unit in the pixel circuit 1-2 is held by the capacitor 47. The voltage held by the capacitor 47 is {A2*(Vr−Vs2)−Vt2}.

The description above only includes the operations related to the two pixel circuits in FIG. 4. However, when there are N (N rows) pixel circuits in total in the row direction, the operations similar to those in the period t2 and the period t3, and the operations similar to those in the period t5 and the period t6 are performed for N times.

As described above, a period from the period t1 to the period t6, that is, a period T1 is an operation period for resetting the FD unit in each pixel circuit simultaneously, and holding, by the corresponding holding circuit in the storage unit 4, a voltage generated by transferring the charges in the photodiode in each pixel circuit simultaneously.

In the period T1, each of the holding circuits in the storage unit 4 holds the following voltage.

In the holding circuit 4-1, the capacitor 31 holds a reset voltage (A1*Vr−Vt1) of the pixel circuit 1-1, and the capacitor 33 holds a signal voltage {A1*(Vr−Vs1)−Vt1} of the pixel circuit 1-1.

In the holding circuit 4-2, the capacitor 45 holds a reset voltage (A2*Vr−Vt2) of the pixel circuit 1-2, and the capacitor 47 holds a signal voltage {A2*(Vr−Vs2)−Vt2} of the pixel circuit 1-2.

The reset voltages and the signal voltages are synchronous.

The voltage (A1*Vs1) is obtained by calculating the difference between the voltage held by the capacitor 31 and the voltage held by the capacitor 33, and the voltage (A2*Vs2) is obtained by calculating the difference between the voltage held by the capacitor 45 and the voltage held by the capacitor 47. The voltages are signal components according to the amount of light received by the photodiodes in the pixel circuits 1-1 and the pixel circuit 1-2, and are signals with Vt variations compensated. In other words, the signal components do not include the voltage drop Vt1 of the row selection transistor 2-1, or the voltage drop Vt2 of the row selection transistor 2-2.

The operations of the solid-state imaging device 100 in the period T2 shall be described next.

In the period t7, the gates of the transistor 34, the row selection transistor 37, and the transistor 42 are switched to "HIGH" for conduction, and the voltage held by the capacitor 31 (A1*Vr−Vt1) is transmitted to the capacitor 40 through the transistor 34, the transistor 36, and the row selection transistor 37.

The transistor 42 is also conducted, setting the voltage at the point M connecting the capacitor 41 and the capacitor 40 at the reference voltage Vref of the terminal 43. Assuming that the voltage drop in the transistor 36 is Vt3, and the gain is A3, the voltage at the terminal of the capacitor 40 connected to the second column signal line 12 is {A3*(A1*Vr−Vt1)−Vt3}, and the voltage of the terminal connected to the connecting point M is Vref.

In the period t8, the gates of the transistor 35 and the row selection transistor 37 are switched to "HIGH" for conduction, and the voltage held by the capacitor 33 {A1*(Vr−Vs1)−Vt1} is transmitted to the capacitor 40 through the transistor 35, the transistor 36, and the row selection transistor 37.

The gate of the transistor 42 is in "LOW", and the transistor 42 is not conducted. Accordingly, there is a voltage change at the connecting point M at an intensity equal to the voltage change at the terminal of the capacitor 40 connected to the second column signal line 12 distributed according to the capacitance values of the capacitor 40 and the capacitor 41.

The voltage at the terminal of the capacitor 40 connected to the second column signal line 12 is [A3*{A1*(Vr−Vs1)−Vt1}−Vt3]. Accordingly, the absolute value of the voltage change at the terminal is |{A3*(A1*Vr−Vt1)−Vt3}−[A3*{A1*(Vr−Vs1)−Vt1}−Vt3]|, that is |A3*A1*Vs1|.

Assuming the capacitance value of the capacitor 40 is C0, and the capacitance value of the capacitor 41 is C1, the voltage at the connecting point M is {Vref−|A3*A1*Vs1|*C0/(C0+C1)}.

In the period t9, the gates of the transistor 48, the row selection transistor 51, and the transistor 42 are switched to "HIGH" for conduction, and the voltage held by the capacitor 45 (A2*Vr−Vt2) is transmitted to the capacitor 40 through the transistor 48, the transistor 50, and the row selection transistor 51.

The transistor 42 is also conducted, setting the voltage at the point M connecting the capacitor 41 and the capacitor 40 at the reference voltage Vref of the terminal 43. Assuming that the voltage drop in the transistor 50 is Vt4, and the gain is A4, the voltage at the terminal of the capacitor 40 connected to the second column signal line 12 is {A4*(A2*Vr−Vt2)−Vt4}, and the voltage of the terminal connected to the connecting point M is Vref.

In the period t10, the gates of the transistor 49 and the row selection transistor 51 are switched to "HIGH" for conduction, and the voltage held by the capacitor 47 {A2*(Vr−Vs2)−Vt2} is transmitted to the capacitor 40 through the transistor 49, the transistor 50, and the row selection transistor 51.

The gate of the transistor 42 is in "LOW", and the transistor 42 is not conducted. Accordingly, there is a voltage change at the connecting point M at an intensity equal to as the voltage change at the terminal of the capacitor 40 connected to the second column signal line 12 distributed according to the capacitance values of the capacitor 40 and the capacitor 41.

The voltage at the terminal of the capacitor 40 connected to the second column signal line 12 is [A4*{A2*(Vr−Vs2)−Vt2}−Vt4]. Accordingly, the absolute value of the voltage change at the terminal is |{A4*(A2*Vr−Vt2)Vt4}−[A4*{A2*(Vr−Vs2)−Vt2}−Vt4]|, that is |A4*A2*Vs|.

Assuming the capacitance value of the capacitor 40 is C0, and the capacitance value of the capacitor 41 is C1, the voltage at the connecting point M is {Vref−|A4*A2*Vs|*C0/(C0+C1)}.

Assuming that the gains A1, A2, A3, and A4 of the transistor are equal to A, the signal voltage Vout1 in the pixel circuit 1-1 at the connecting point M output in the period t8 is {Vref−|A*A*Vs1|*C0/C0+C1)}, and the signal voltage Vout2 in the pixel circuit 1-2 at the connecting point M output in the period t10 is {Vref−|A*A*Vs2|*C0/(C0+C1)}. As such, signals without voltage drops Vt1, Vt2, Vt3, and Vt4 which are commonly known as Vt variations are obtained.

Connecting point M in each column is connected to the column selection transistor 6 of the column. The column selection transistor 6 is conducted or non-conducted according to the output signal from the horizontal scanning circuit 7 through the column selection signal line 8, and a difference voltage at the connecting point M in each column is output to the common signal line 9 while the column selection transistor 6 is conducted.

Variation 1 of Embodiment 1

Next, as Variation 1 based on the basic configuration of Embodiment 1 described above, a configuration in which a new transfer transistor is included in each pixel circuit shall be described.

Figure 6:
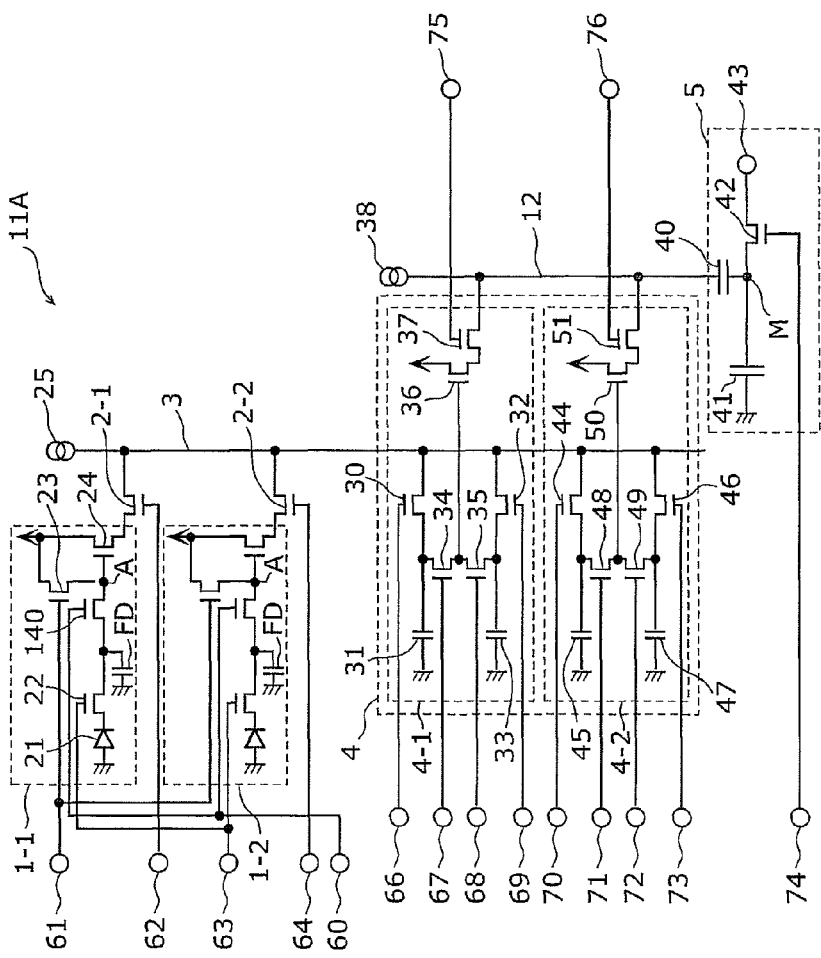
FIG. 6 is a circuit diagram illustrating an example of essential components of the solid-state imaging device according to Variation 1 in Embodiment 1.

FIG. 6 is a circuit diagram illustrating an example of the detailed configuration of a column circuit 11A in a solid-state imaging device according to Variation 1 corresponding to the column circuit 11 in the solid-state imaging device in FIG. 6. The solid-state imaging device 101 according to this variation is different from the corresponding part of the solid-state imaging device in FIG. 4 only in that a new transfer transistor is added to each pixel circuit.

For example, in the pixel circuit 1-1, a new transfer transistor 140 is inserted between the point A connecting the source of the reset transistor 23 and the gate of the transistor 24 and the drain of the transfer transistor 22. Another new transfer transistor is inserted to the same position in the pixel circuit 1-2.

The new transfer transistor added to each pixel circuit is switched between conduction and non-conduction for all pixels simultaneously according to the signal applied to the terminal 60, and the electric charge held in the FD unit in each of the pixel circuit is distributed to the gate capacitance of the transistor 24 during the conduction.

Figure 7:
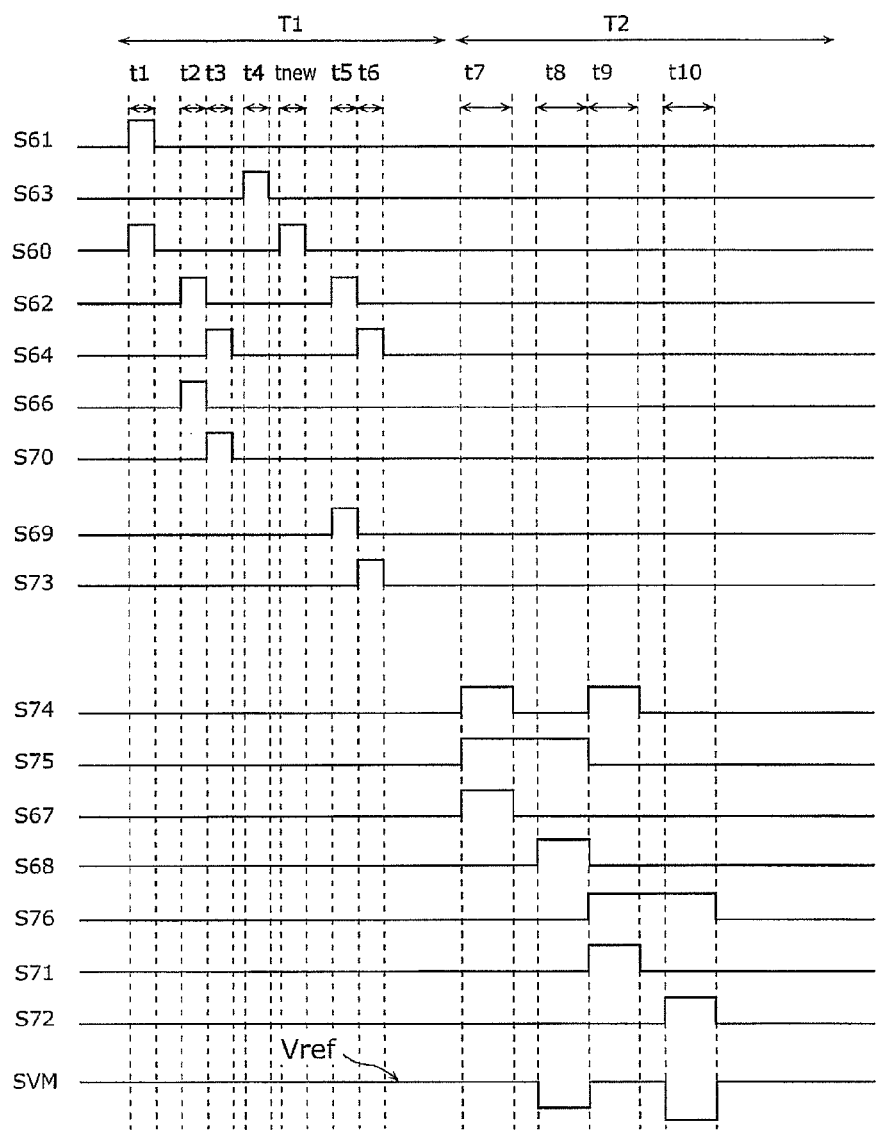
FIG. 7 is a timing chart illustrating temporal changes of major signals in the solid-state imaging device according to Variation 1 in Embodiment 1.

FIG. 7 is a timing chart illustrating temporal change in the major signals in the solid-state imaging device according to Variation 1.

The timing chart in FIG. 7 is different from the timing chart in FIG. 5 in that part of the period T1 is changed due to the addition of the signal S60. The following shall mainly focus on the changes from the timing chart in FIG. 5.

In the period t1, the gates of the reset transistor 23 in each pixel circuit and the new transistor in each pixel circuit are set to "HIGH" for conduction, connecting all of FD units to the power supply simultaneously for all of the pixels for resetting.

In the periods t2 and t3, the reset voltage in the pixel circuits 1-1 and 1-2 are held by the capacitors 31 and 45, respectively.

In the period t4, the gate of the transfer transistor 22 in each pixel circuit is switched to "HIGH" for conduction, and the charges generated at the photodiode 21 in each pixel circuit are transferred to the FD unit simultaneously.

A period tnew is inserted between the period t4 and the period t5.

In the period tnew, the gate of the new transfer transistor 140 in each pixel circuit is set to "HIGH" for conduction, and the electric charges held by the FD unit is distributed to the gate capacitance of the transistor 24. The voltage at the connecting point A is determined according to the amount of electric charge distributed to the gate capacitance of the transistor 24.

In the period t5, the gates of the row selection transistor 2-1 and the transistor 32 are switched to "HIGH" for conduction. With this, the voltage of the connecting point A in the pixel circuit 1-1 is held by the capacitor 33 through the transistor 24, the row selection transistor 2-1, and the transistor 32.

In the period t6, the row selection transistor 2-2 is selected, and in the same manner as the period t5, the voltage of connecting point A in the pixel circuit 1-2 is held by the capacitor 47.

In the period T2, in the same manner as the operation described in the timing chart in FIG. 5, the difference in the signals in the storage unit 4 is calculated, and the calculated difference is output from the common signal line 9.

In such a configuration, the dark current in the gate capacitance of the transistor 24 is generally smaller than the dark current at the FD unit. Thus, the noise (voltage variation) at the connecting point A caused by leakage current is mild compared to the FD unit.

As a result, compared to the case in which the signal voltage held by the FD unit, the time during which the pixel circuit holds the signal voltage at a desired accuracy is extended, and thereby lowering the transfer speed of the signal voltage from the pixel circuit to the storage unit 4.

Variation 2 of Embodiment 1

Next, as Variation 2 based on the basic configuration of Embodiment 1, a configuration in which the electric signal from each pixel circuit is read based on the current value, instead of the source follower circuit.

Figure 8:
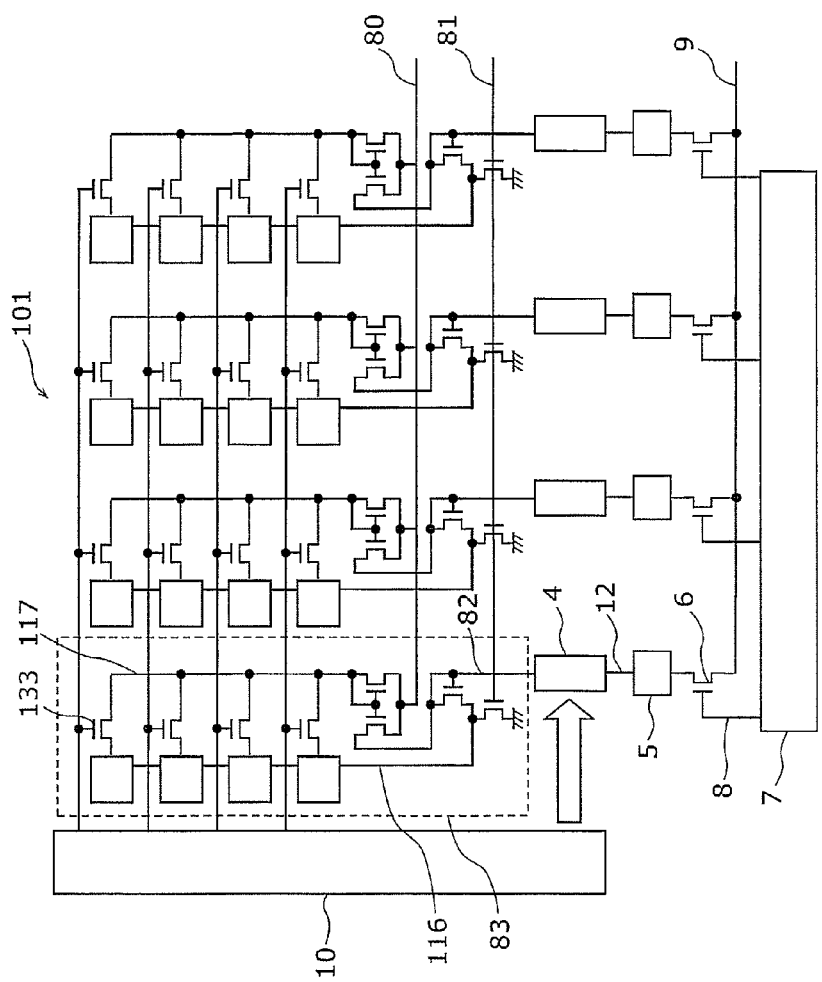
FIG. 8 is a block diagram illustrating the configuration of the solid-state imaging device according to Variation 2 in Embodiment 1.

FIG. 8 is a block diagram illustrating the configuration of the solid-state imaging device 101 according to Variation 2. The solid-state imaging device according to this variation has a different configuration from the solid-state imaging device 100 in FIG. 4 for transmitting electric signals from each pixel circuit to the storage unit 4.

Figure 9:
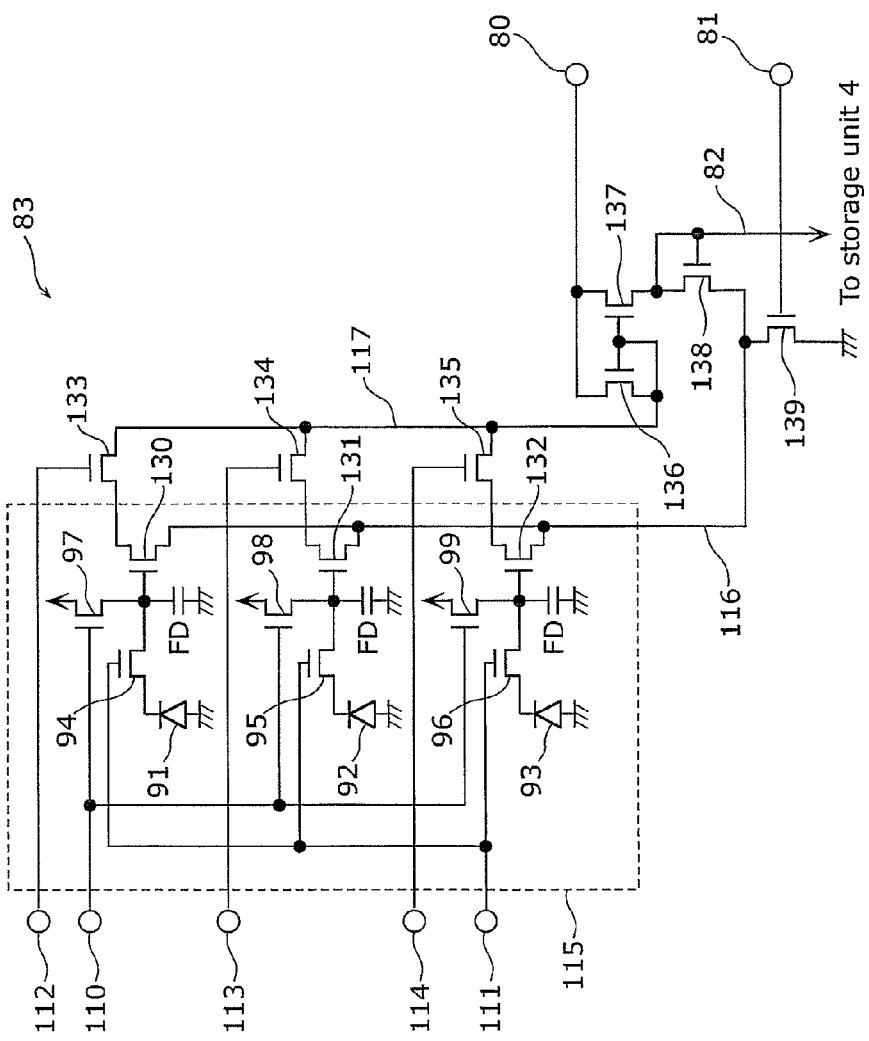
FIG. 9 is a circuit diagram illustrating an example of essential components of the solid-state imaging device according to Variation 2 in Embodiment 1.

FIG. 9 illustrates an example of the detailed configuration of the column circuit 83 illustrated in broken lines in FIG. 8. FIG. 9 includes a column circuit 115 including three pixel circuits in the column circuit 83.

In FIG. 9, the photodiode 91, the transfer transistor 94, the reset transistor 97, and the transistor 130 compose a pixel circuit for row 1. Similarly, the photodiode 92, the transfer transistor 95, the reset transistor 98, and the transistor 131 compose a pixel circuit for row 2, and the photodiode 93, the transfer transistor 96, the reset transistor 99, and the transistor 132 compose a pixel circuit for row 3.

The anode of the photodiode 91 is grounded, and the cathode of the photodiode 91 is connected to the drain of the transfer transistor 94.

The source of the transfer transistor 94 is connected to the source of the reset transistor 97 and the gate of the transistor 130, and the connecting area forms a diffusion capacitance which is referred to as an FD unit. The gate of the transfer transistor 94 is connected to the terminal 111.

The drain of the reset transistor 97 is connected to a power supply, and the gate is connected to the terminal 110.

The drain of the transistor 130 is connected to the source of the row selection transistor 133, and the source of the transistor 130 is connected to the common signal line 116.

The gate of the row selection transistor 133 is connected to the terminal 112, and the drain of the row selection transistor 133 is connected to the common signal line 117.

The pixel circuits in rows 2 and 3 are connected in the same manner, and the gates of the transfer transistors 94, 95, and 96 are commonly connected to the terminal 111, and the gates of the reset transistors 97, 98, and 99 are commonly connected to the terminal 110. The gate of the row selection transistor 133 is connected to the terminal 112, the gate of the row selection transistor 134 is connected to the terminal 113, the gate of the row selection transistor 135 is connected to the terminal 114, and the drain of the row selection transistor 135 is connected to the common signal line 117.

The drains of the transistors 136 and 137 are connected to the terminal 80, and the terminal 80 is connected to the power supply. The gates of the transistors 136 and 137 are commonly connected to the source of the transistor 136. The source of the transistor 136 is connected to the common signal line 117.

The drain and the gate of the transistor 138 are commonly connected to the source of the transistor 137, and are connected to the storage unit 4 through the third column signal line 82. The source of the transistor 138 is connected to the common signal line 116.

The drain of the transistor 139 is connected to the common signal line 116, and the source of the transistor 139 is grounded. The gate is connected to the terminal 81 and is DC biased.

Figure 10:
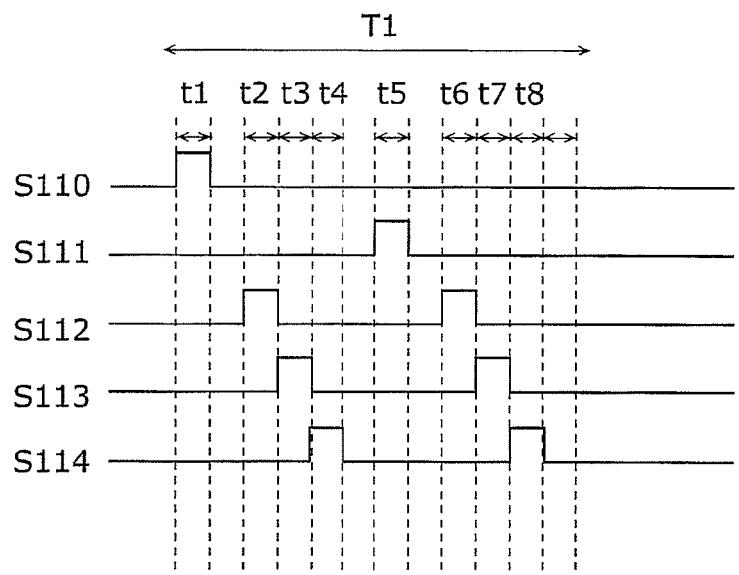
FIG. 10 is a timing chart illustrating temporal changes of major signals in the solid-state imaging device according to Variation 2 in Embodiment 1.

FIG. 10 is a timing chart illustrating temporal change in the major signals in the solid-state imaging device according to Variation 2. The signals are referred to in the same manner as FIG. 5.

The operations of the solid-state imaging device according to Variation 2 shall be described with reference to FIGS. 9 and 10.

In the period t1, the gates of the reset transistors 97, 98, and 99 of all of the pixel circuits are switched to "HIGH" for conduction, and the FD units are connected to the power supply simultaneously for all of the pixels, resetting the pixel circuits.

In the period t2, the gate of the row selection transistor 133 is switched to "HIGH" for conduction, and the drain of the transistor 130 is connected to the source of the transistor 136, and the source of the transistor 130 is connected to the source of the transistor 138.

Figure 11:
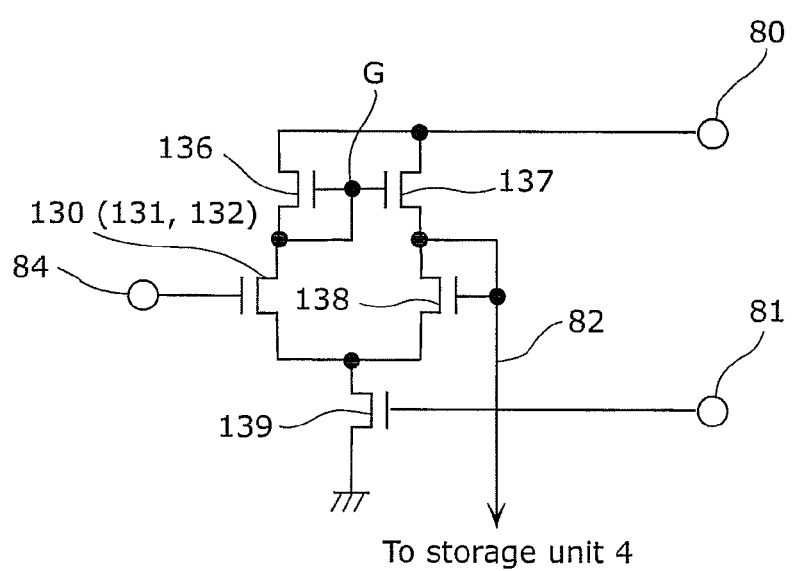
FIG. 11 is a circuit diagram illustrating a buffer circuit in the solid-state imaging device according to Variation 2 in Embodiment 1.

Here, the circuit in the solid-state imaging device including the transistor 130 serves as an equivalent for a buffer circuit illustrated in FIG. 11. The transistor 130 serves as an input transistor of the buffer circuit in FIG. 11.

The common signal line 117 in FIG. 9 corresponds to the circuit part G in FIG. 11, and even when a signal voltage with high amplitude is input to the input terminal 84, the voltage amplitude in the circuit part G corresponding to the common signal line 117 is small. Thus, the influence of the floating capacitance in the common signal line 117 is small, allowing a high-speed operation. In other words, the reset voltage of the FD unit corresponding to the transistor 130 is transferred to the storage unit 4 at high speed. The buffer circuit with this configuration is also referred to as a current mode output circuit.

In the periods t3 and t4, the gates of the row selection transistors 134 and 135 are switched to "HIGH" for conduction allows the transistors 131 and 132 to serve as input transistors for the buffer circuit in FIG. 11. With this, in the same manner as the period t2, the reset voltage of the FD unit corresponding to the transistors 131 and 132 are transferred to the storage unit 4 at high speed.

In the period t5, the gates of the transfer transistors 94, 95, and 96 of the entire pixel circuits are switched to "HIGH" for conduction, and the electric charges generated at the photodiodes 91, 92, and 93 are simultaneously transferred to the FD units.

In the periods t6, t7, and t8, in the same manner as the periods t2, t3, and t4, the signal voltage in each pixel circuit is transferred to the storage unit 4 at high speed.

The description above is the description for the period T1 for transferring the signal voltage from the pixel circuit to the storage unit 4, and the operation in the period T2 from calculating the difference in the signals held in the storage unit 4 to outputting the calculated difference from the common signal line 9 is the same as Embodiment 1.

As described above, in the solid-state imaging device according to Variation 2, the electric signal in each pixel circuit is read from each pixel circuit, not by a source follower circuit illustrated in the basic configuration, but by the current mode output circuit (buffer circuit), and output to the column signal line 82. Note that, in this Specification, the common signal line is included in the current mode output circuit.

Variation 3 of Embodiment 1

Next, as Variation 3 based on Variation 2 of Embodiment 1, a configuration with a new transfer transistor added to each pixel circuit shall be described.

Figure 12:
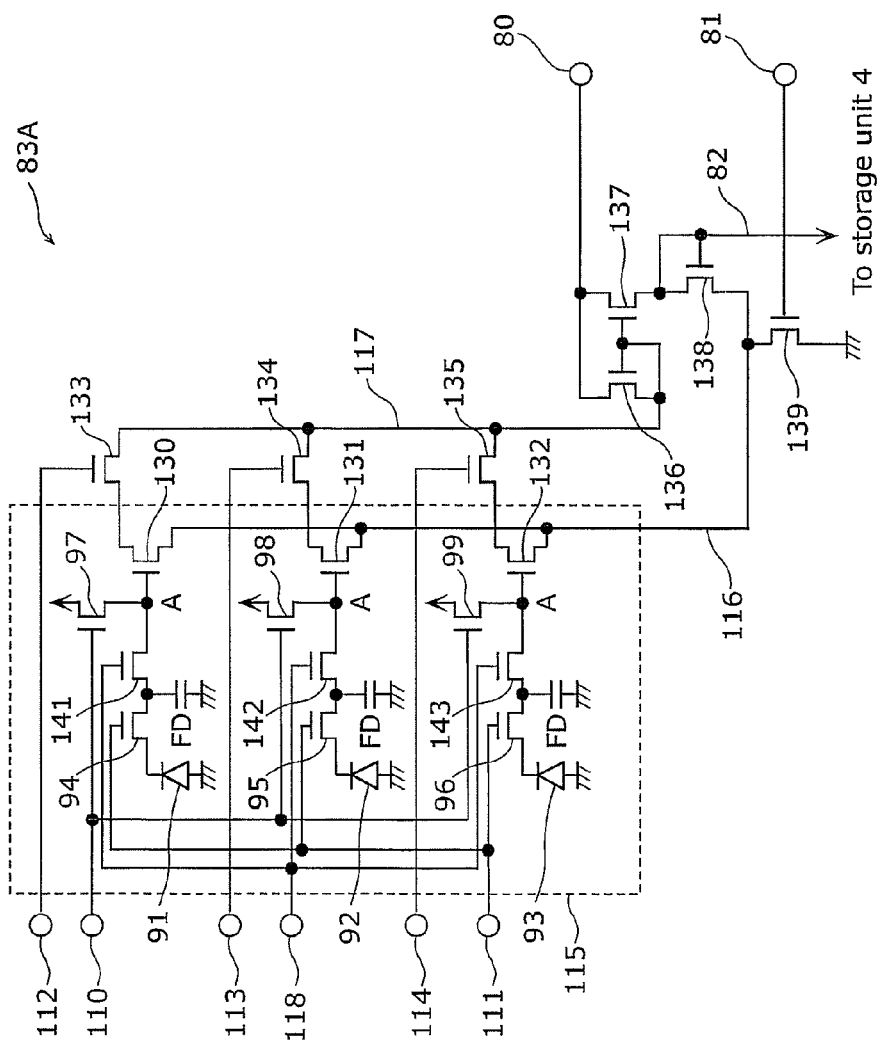
FIG. 12 is a circuit diagram illustrating an example of essential components of the solid-state imaging device according to Variation 3 in Embodiment 1.

FIG. 12 is a circuit diagram illustrating an example of detailed configuration of a column circuit 83A in a solid-state imaging device according to Variation 3. The column circuit 83A in FIG. 12 corresponds to the column circuit 83 (FIG. 9) in the solid-state imaging device 101 (FIG. 8) according to Variation 2. As illustrated in FIG. 12, in the column circuit 83A in the solid-state imaging device according to Variation 3, based on the idea described in Variation 1 of Embodiment 1, a new transfer transistor is added to each pixel circuit for the column circuit 83 in Variation 2 in FIG. 9.

A new transfer transistor 141 is inserted between the point A connecting the source of the reset transistor 97, and the gate of the transistor 130, and the gate of the transfer transistor 94. The new transistors 142 and 143 are added to the same positions in the other pixel circuits.

The new transfer transistors 141, 142, and 143 added to the pixel circuits switches between conduction and non-conduction simultaneously for all pixels, according to the signals applied to the terminal 118, and during the conduction period, the charge held by the FD units in the pixel circuits are distributed to the gate capacitance of the transistors 130, 131, and 132.

Figure 13:
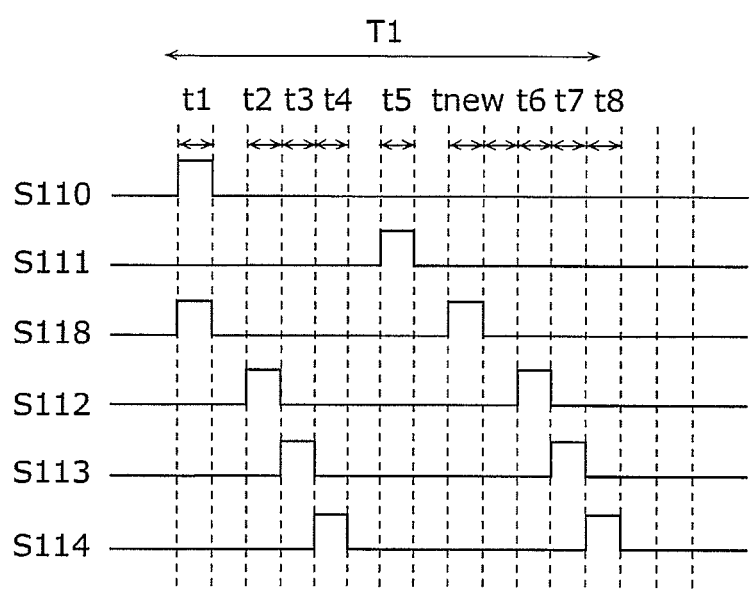
FIG. 13 is a timing chart illustrating temporal changes of major signals in the solid-state imaging device according to Variation 3 in Embodiment 1.

FIG. 13 is a timing chart illustrating temporal change in the major signals in the solid-state imaging device according to Variation 3. The timing chart in FIG. 13 is different from the timing chart in FIG. 10 in that part of the period T1 is changed due to the addition of the signal S118. The following shall mainly focus on the changes from the timing chart in FIG. 10.

In the period t1, the gates of the reset transistors 97, 98, and 99 of all of the pixel circuits and the new transfer transistors 141, 142, and 143 of the pixel circuits are switched to "HIGH" for conduction, connecting the FD units to the power supply simultaneously for all pixels for resetting.

In the periods t2, t3, and t4, the reset voltages of the pixel circuits are transferred to the storage unit 4.

In the period t5, the electric charges generated at the photodiodes 91, 92, and 93 are simultaneously transferred to the FD units in the pixel circuits.

A period tnew is inserted between the period t5 and the period t6. The gates of the new transfer transistors 141, 142, and 143 are switched to "HIGH" for conduction, and the electric charges held by the FD units are distributed to the gate capacitance of the transistors 130, 131, and 132. The voltage at the connecting point A is determined according to the amount of electric charges distributed to the gate capacitance of the transistors 130, 131, and 132.

In the periods t6, t7, and t8, the voltages at the connecting point A in the pixel circuits are transferred to the storage unit 4.

In this configuration, the dark current in the gate capacitance of the transistors 130, 131, and 132 is generally smaller than the dark current in the FD unit. Thus, the noise (voltage variation) at the connecting point A caused by leakage current is mild compared to the FD unit.

As a result, compared to the case in which the signal voltage held by the FD unit, the time during which the pixel circuit holds the signal voltage at a desired accuracy is extended, and thereby lowering the transfer speed of the signal voltage from the pixel circuit to the storage unit 4.

Variation 4 of Embodiment 1

Next, as Variation 4 based on Variation 2 of Embodiment 1, a configuration with more than one column signal lines in each column shall be described.

Figure 14:
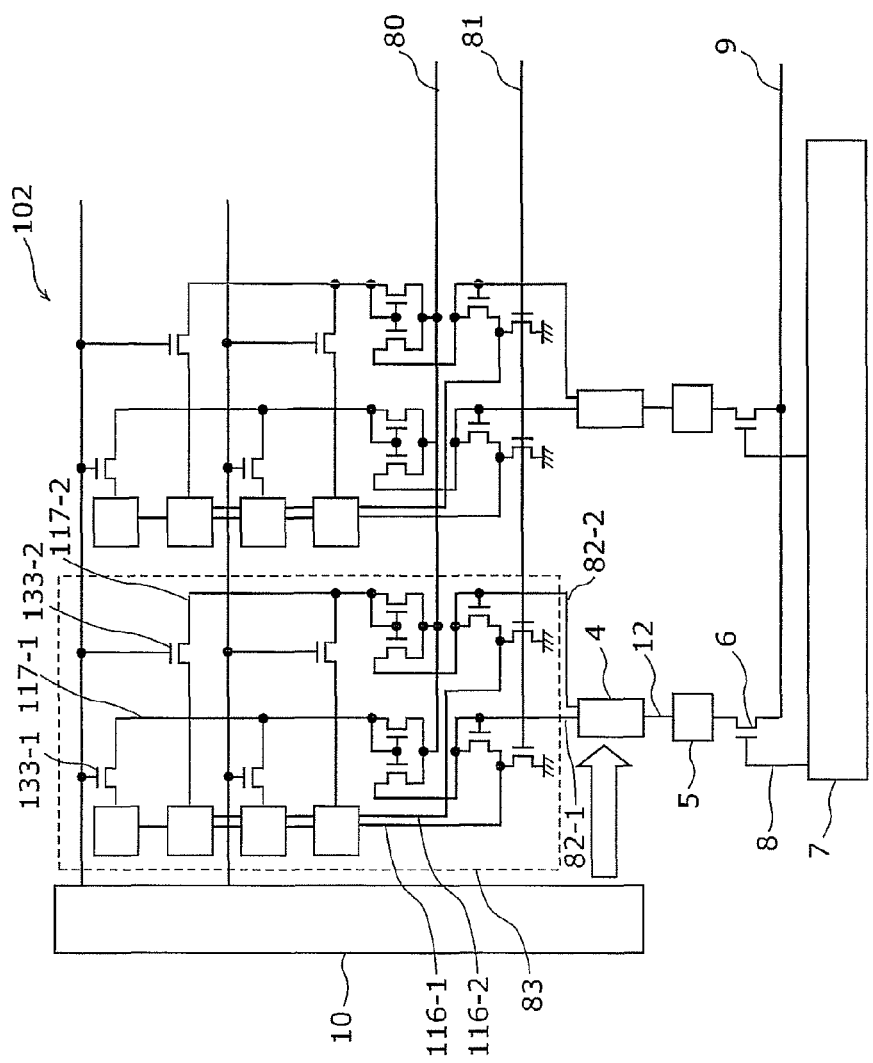
FIG. 14 is a block diagram illustrating the configuration of the solid-state imaging device according to Variation 4 in Embodiment 1.

FIG. 14 is a block diagram illustrating the configuration of the solid-state imaging device 102 according to Variation 4.

The solid-state imaging device 102 according to Variation 4 is different from the solid-state imaging device 101 in Variation 2 (FIG. 8) in that the time necessary for transferring signals from the pixel circuits to the storage unit 4 can be reduced by providing more than one column signal lines in each column.

In this configuration, a column signal line 82-1 corresponding to odd rows and a column signal line 82-2 corresponding to even rows are provided in one column. Furthermore, a current mode output circuit including common signal lines 116-1 and 117-1 corresponding to odd rows and a current mode output circuit including common signal lines 116-2 and 117-2 corresponding to even rows are provided.

The pixel circuits in odd rows are connected to the common signal line 117-1, and the pixel circuits in even rows are connected to the common signal line 117-2. Signals from the vertical scanning circuit 10 are applied to the gates of the row selection transistors 133-1 and 133-2, and the signals in odd rows and the signals in even rows are simultaneously transferred to the storage unit 4. The storage unit 4 includes a holding circuit corresponding to odd rows and the holding circuit corresponding to even rows.

Figure 15:
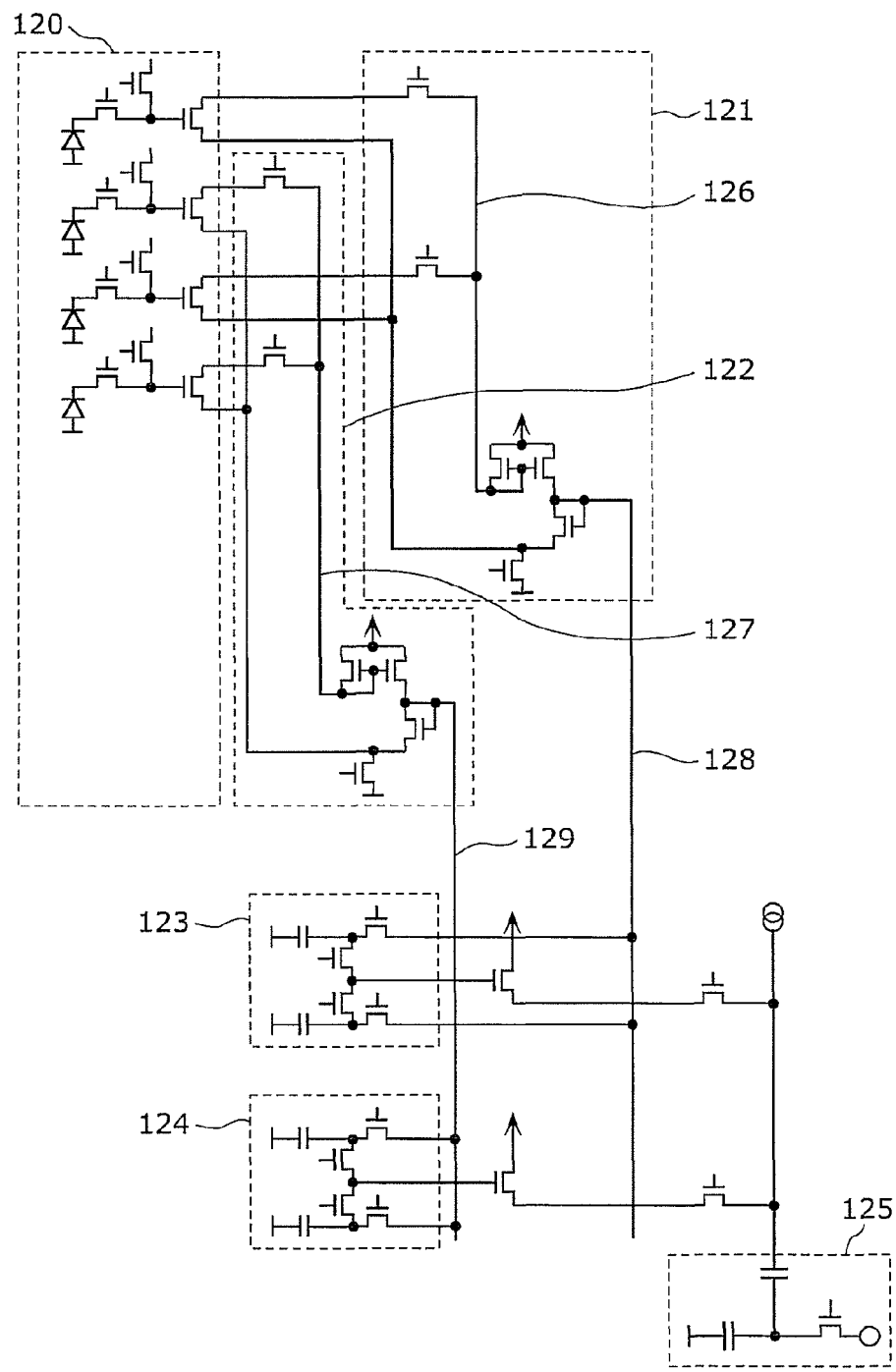
FIG. 15 is a circuit diagram illustrating an example of essential components of the solid-state imaging device according to Variation 4 in Embodiment 1.

The following is more detailed description with reference to FIG. 15.

The circuit illustrated in FIG. 15 includes the pixel circuit unit 120, the current mode output circuit 121 for odd rows (including the common signal line 126), the current mode output circuit 122 for even rows (including the common signal line 127), the holding circuit 123 for odd rows, the holding circuit 124 for even rows, the difference circuit 125, an output line 128 for the current mode output circuit 121, and an output line 129 for the current mode output circuit 122.

Here, the common signal lines 126 and 127 correspond to the common signal lines 117-1 and 117-2 in FIG. 14, respectively, and the output lines 128 and 129 correspond to column signal lines 82-1 and 82-2 in FIG. 14, respectively.

FIG. 15 illustrates only major portions of Variation 4, and the vertical scanning circuit, the horizontal scanning circuit, and the signal lines applying signals to gate of transistor are omitted. The reset voltage of the pixel circuits in odd rows and the reset voltage of the pixel circuits in even rows are simultaneously transferred to the capacitors in the holding circuits 123 and 124 through the output lines 128 and 129 of the current mode output circuits 121 and 122, respectively.

Furthermore, the voltage of the odd row pixel circuits after receiving light and the voltage of the even row pixel circuits after receiving light are simultaneously transferred to the other capacitors of the holding circuits 123 and 124 through the output lines 128 and 129 of the current mode output circuits 121 and 122, respectively.

Readout is performed through the difference circuit 125 which calculates difference of the voltages held by the holding circuits 123 and 124.

According to the solid-state imaging device with the configuration described above, the transfer from the pixel circuits in the odd rows and the even rows are simultaneously performed, allowing faster transfer.

Variation 5 of Embodiment 1

Next, as Variation 5 based on the basic configuration of Embodiment 1 described above, a configuration including a column amplifier for each column shall be described.

Figure 16:
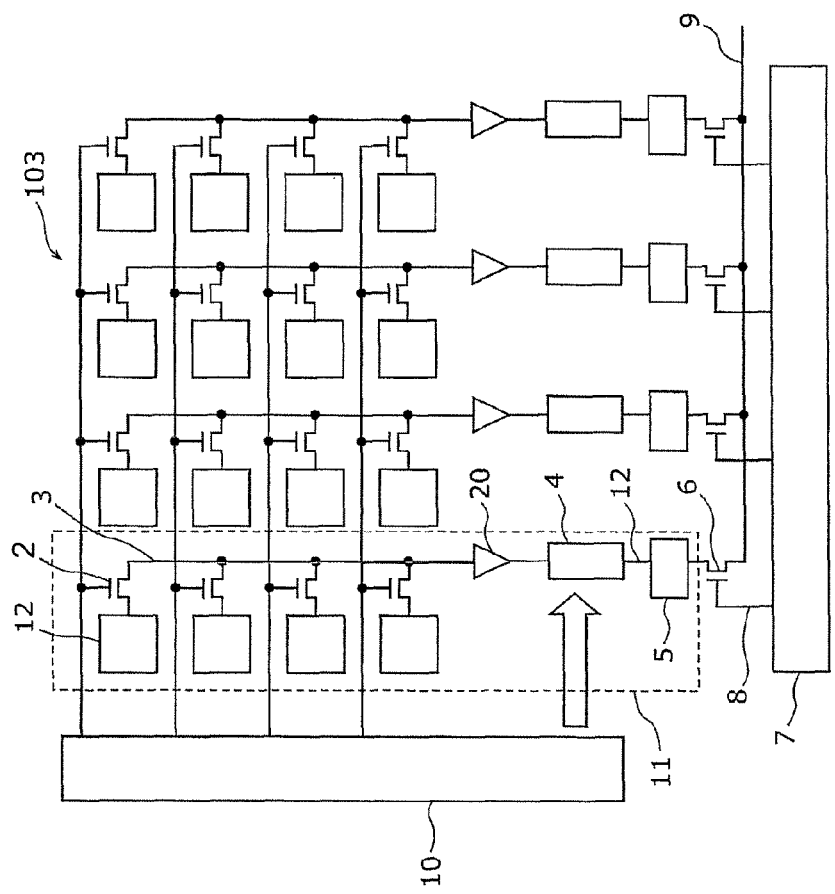
FIG. 16 is a block diagram illustrating the configuration of the solid-state imaging device according to Variation 5 in Embodiment 1.

FIG. 16 is a block diagram illustrating the configuration of the solid-state imaging device 103 according to Variation 5. The solid-state imaging device 103 according to Variation 5 is different from the solid-state imaging device 100 according to the basic configuration illustrated in FIG. 3 in that a column amplifier 20 is connected to the front stage of the storage unit 4.

In the storage unit 4, KTC noises are generated by the switching operation between the capacitor and the transistor. This noise is random, and the correction of the noise is difficult.

A value N of the KTC noise is represented as $N=(K*T/C)^{-0.5}$ when the capacitance value of the capacitor is C and an absolute temperature is T, and the larger the capacitance value C, the smaller the KTC noise value N. For example, when a signal value is S, a noise component value is N, a gain of the amplifier circuit is A, and the KTC noise in the storage unit 4 is NKTC, at the front stage of the column amplifier 20, the signal/noise is S/(N+NKTC) when there is no column amplifier 20.

In contrast, when there is a column amplifier 20, the signal/noise is AS/(AN+NKTC); that is, S/(N+NKTC/A). The KTC noise is reduced to substantially 1/A by providing the column amplifier 20. Therefore, a signal with small amount of noise component can be obtained.

Embodiment 2

The configuration and operations of the solid-state imaging device according to Embodiment 2 shall be described.

Basic Configuration of Embodiment 2

Figure 17:
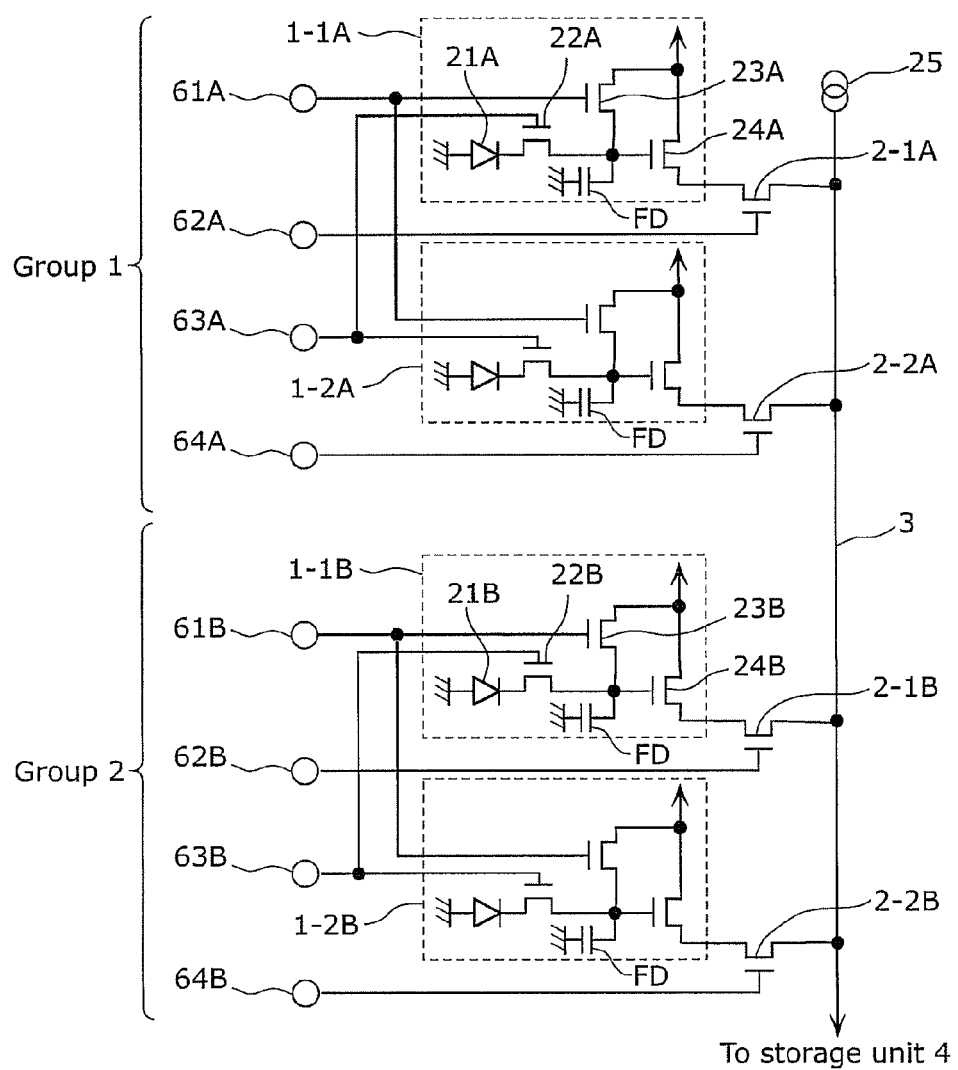
FIG. 17 is a block diagram illustrating the detailed configuration essential components of a solid-state imaging device according to Embodiment 2 of the present invention.

FIG. 17 is a circuit diagram illustrating an example of detailed configuration of the pixel circuits which are major components of the solid-state imaging device according to Embodiment 2. Compared to the corresponding portion of the solid-state imaging device according to Embodiment 1 illustrated in FIG. 4, the major component of the solid-state imaging device according to Embodiment 2 is different in that the pixel circuits are grouped for a predetermined number of rows, and the reset transistor 23 and the transfer transistor 22 are configured such that each of the groups can be independently controlled.

For example, the gates of the reset transistors 23A in the pixel circuit 1-1A and the pixel circuit 1-2A in group 1 are commonly connected to the terminal 61A, and the gates of the transfer transistors 22A are commonly connected to the terminal 63A.

The gates of the reset transistor 23B in the pixel circuit 1-1B and the pixel circuit 1-2B in group 2 are commonly connected to the terminal 61B, and the gates of the transfer transistor 22B are commonly connected to the terminal 63B.

Figure 18:
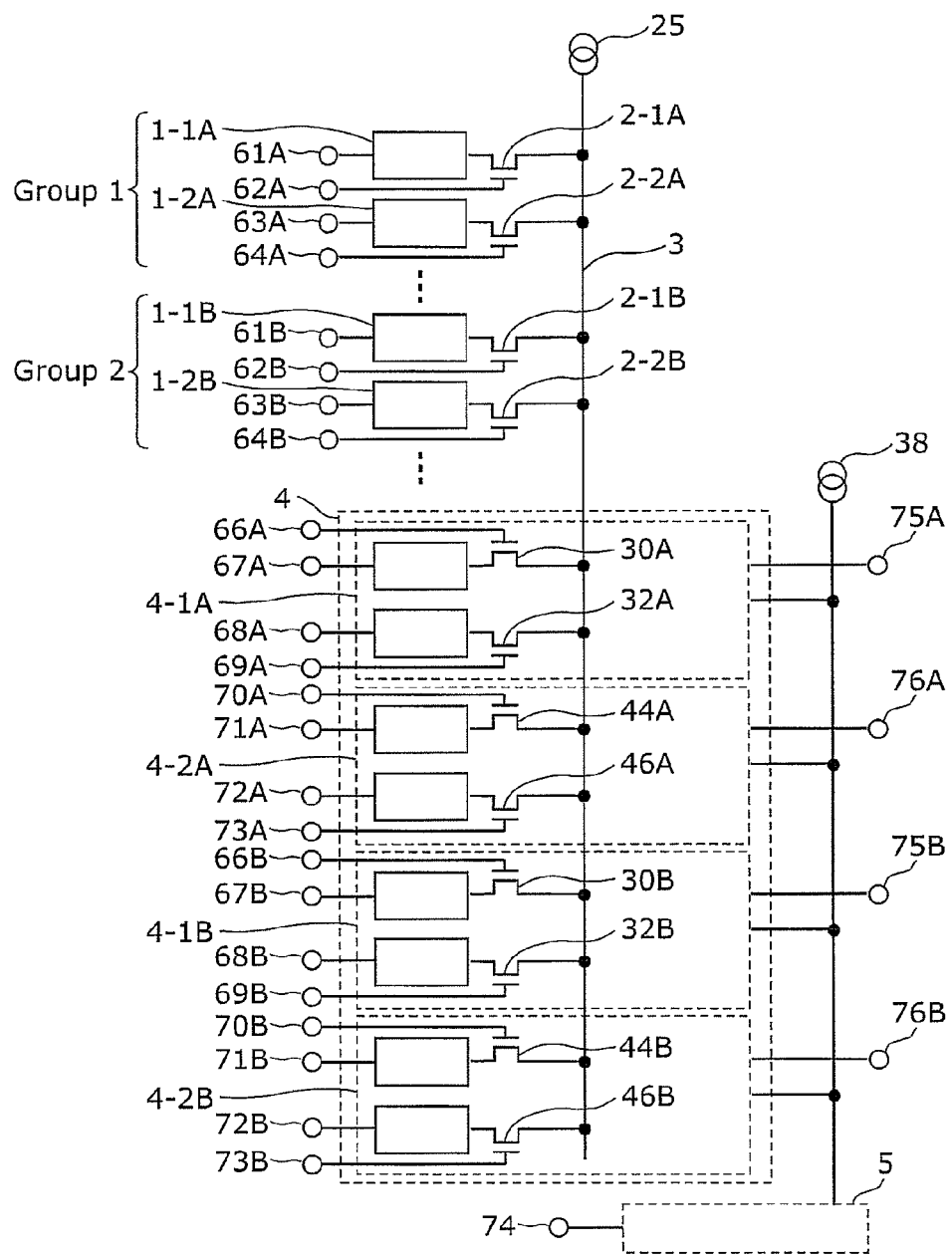
FIG. 18 is a block diagram for illustrating how the pixel circuits are grouped according to Embodiment 2.

FIG. 18 is a block diagram illustrating the grouping of the pixel circuits, and indicates the configuration of the grouped pixel circuits 1-1A, 1-2A, 1-1B, and 1-2B, and the storage unit 4. The storage unit 4 in FIG. 18 is substantially identical to the storage unit 4 in FIGS. 4 and 6, and the holding circuit for holding the reset voltage and the signal voltage is provided for each pixel circuit. In FIG. 18, for understanding, the holding circuits 4-1A, 4-2A, 4-1B, and 4-2B are indicated using the signs corresponding to the pixel circuits, and the signs for the terminals are changed accordingly.

Driving Method According to Embodiment 2

Figure 19:
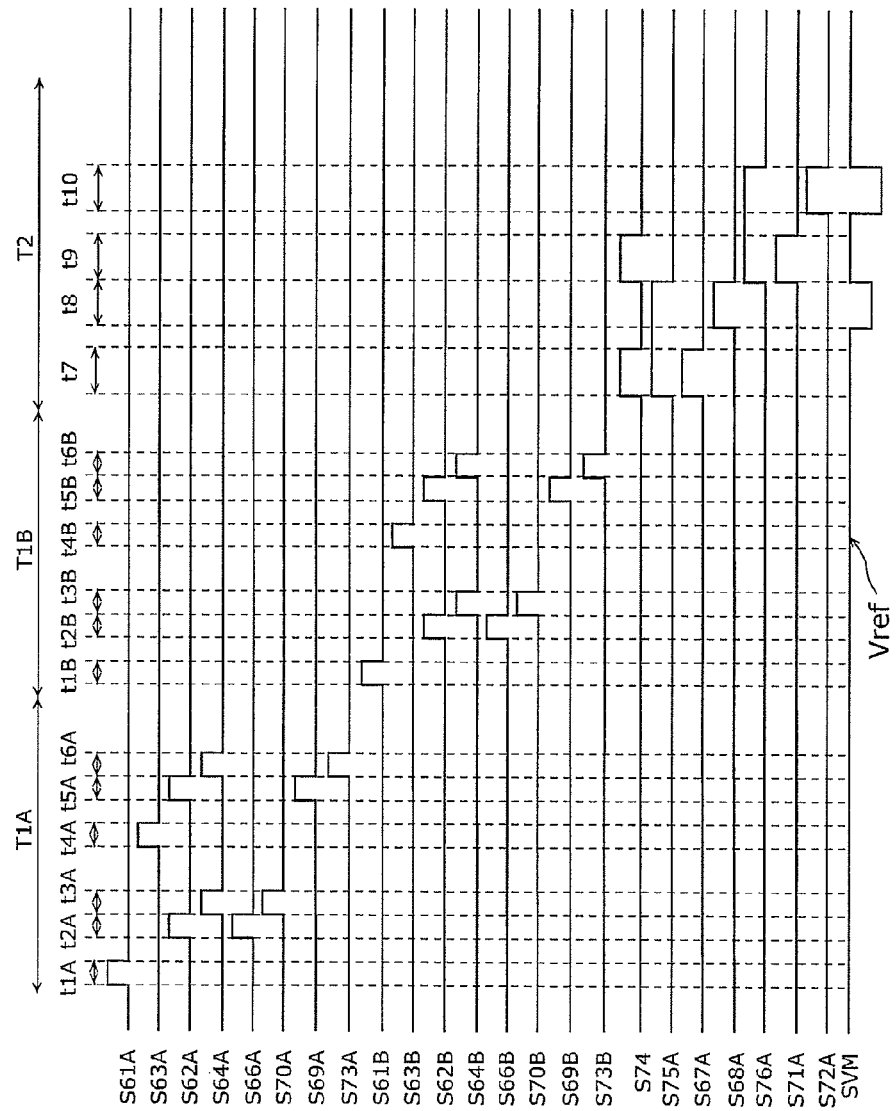
FIG. 19 is a timing chart illustrating temporal changes of major signals in the solid-state imaging device according to Embodiment 2.

The following shall describe a method of driving the solid-state imaging device according to Embodiment 2 with reference to FIGS. 18 and 19. According to this driving method, the solid-state imaging device performs the shutter operation simultaneously for each group.

FIG. 19 is a timing chart illustrating temporal changes of major signals in the solid-state imaging device driven by the driving method according to Embodiment 2. Compared with the timing chart in FIG. 5, the timing chart in FIG. 19 is different in that the operation in the period T1 is performed for each group according to the grouping of the pixel circuits (for example, group 1 in the period T1, and group 2 in the period T1B). The following shall mainly focus on the changes from the timing chart in FIG. 5.

The period T1A in FIG. 19 is a period for generating the reset voltage and the signal voltage by the pixel circuits 1-1A and 1-2A, and for transferring the generated reset voltage and the signal voltage to the holding circuits 4-1A and 4-2A. The period T1B is a period for generating the reset voltage and the signal voltage by the pixel circuits 1-1B and 1-2B, and for transferring the generated reset voltage and the signal voltage to the holding circuit 4-1B and 4-2B, and the period T2 is a period for calculating the difference between the reset voltage and the signal voltage held by the stored unit 4, and for outputting the calculated result of difference from the common signal line 9.

With this configuration, the operation by the pixel circuit for generating the reset voltage and the signal voltage and for transferring the reset voltage and the signal voltage to the storage unit 4 is performed for each group. Thus, in return for losing synchronism of the exposure period for all pixels, the time for the pixel circuit holding the pixel circuit can be reduced.

As a result, compared to the case in which the reset voltage and the signal voltage are generated by all of the pixel circuits and transferred to the storage unit 4, the noise caused by the leakage current included in the signal voltage transferred from the pixel circuits to the storage unit 4 is reduced.

As an example, practicality of the solid-state imaging device which includes 2 million pixel circuits in 1000 rows× 2000 columns, and one frame time is 16.6 msec (60 frames/sec) applied with the above-described configuration and the driving method shall be considered.

Assuming that the transfer clock of the first column signal line 3 is 10 MHz (transfer time per signal is 0.1 μsec), the time necessary for transferring the reset voltage and the signal voltage from one pixel circuit to the holding circuit of the storage unit 4 is 0.2 μsec.

Here, according to the first driving method, when the reset voltage and the signal voltage are generated simultaneously in 1000 pixel circuits in one column and the reset voltage and the signal voltage are transferred to the storage unit 4, the time that the pixel circuits holds the signal voltage is 0.2 μsec× 1000=200 μsec at a maximum.

In this case, although there is synchronism for all pixels, holding the signal voltage for 200 μsec at the pixel circuits may degrade image quality due to leakage current.

Thus, according to the second driving method, the 1000 rows are grouped into 50 groups each including 20 rows. The reset voltage and the signal voltage are generated for each group, and the generated reset voltage and the signal voltage are transferred to the storage unit 4. Here, the pixel circuits in one group holds the signal voltage for 0.2 μsec×20=4 μsec at a maximum. The time difference in generation of the reset voltage and the signal voltage in the pixel circuits in different groups is 4 μsec×50=200 μsec, and is 1/83 of one frame time; that is, 16.6 msec.

In this case, although there is no complete synchronism of all pixels, the non-synchronism 1/83 of one frame time is practical enough. Furthermore, the time for the pixel circuit to hold the signal voltage is reduced to 4 μsec, it is less likely to degrade image quality due to leakage current.

Variation in Embodiment 2

Next, as Variation based on the basic configuration of Embodiment 2, a configuration in which the electric signal from each pixel circuit is read based on the current value, instead of the source follower circuit.

Figure 20:
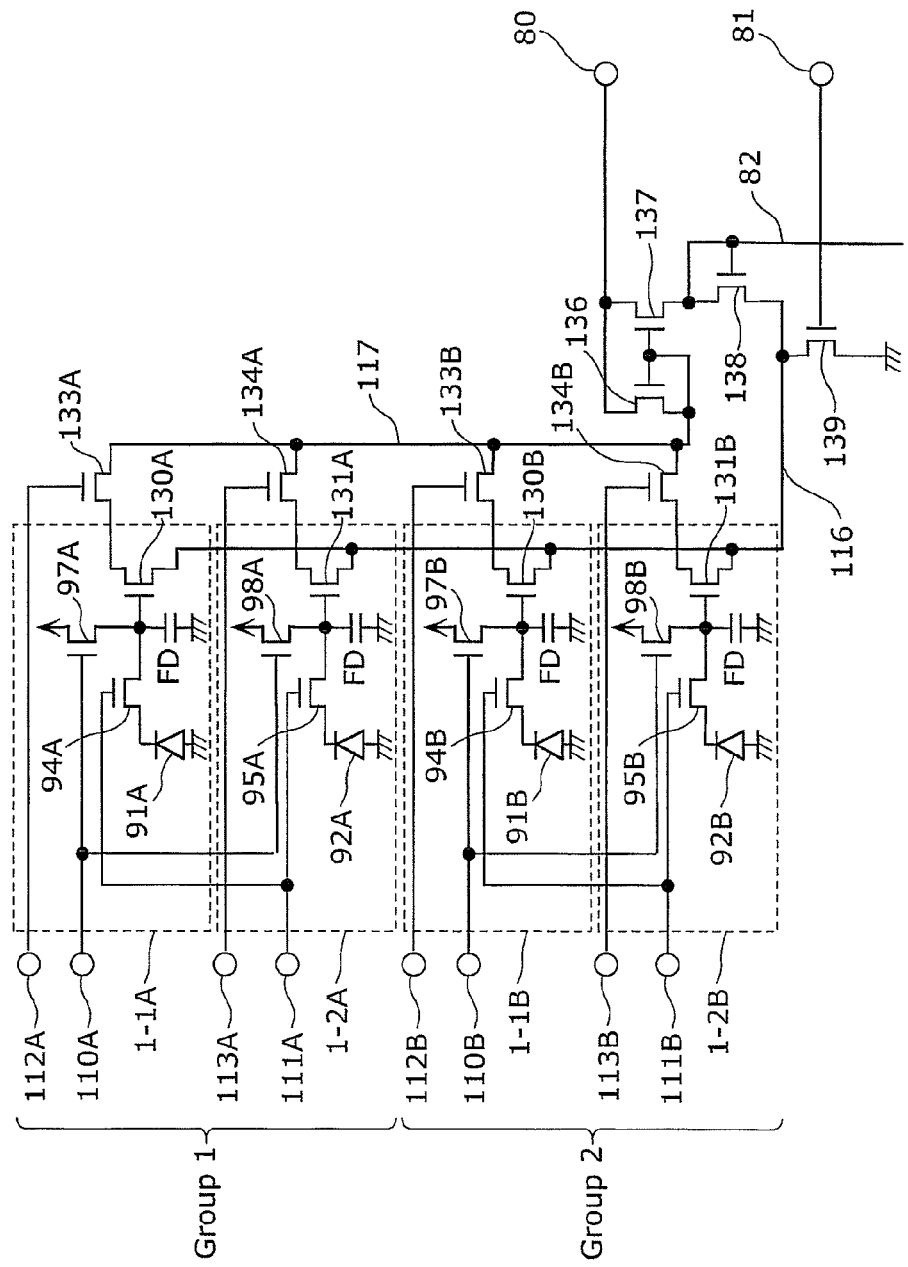
FIG. 20 is a circuit diagram illustrating essential components of the solid-state imaging device according to Variation in Embodiment 2.

FIG. 20 is a circuit diagram illustrating an example configuration of the essential components of the solid-state imaging device according to Embodiment 2. The solid-state imaging device according to Variation is configured by replacing the source follower circuit in FIG. 17 with the current mode output circuit or grouping the pixel circuits in FIG. 9 into groups.

The essential components of the solid-state imaging device in FIG. 20 are different from the corresponding part of the solid-state imaging device according to Variation 2 in Embodiment 1 in FIG. 9 in that the pixel circuits are grouped for a predetermined rows, and that the configuration allows the reset transistors 97A, 98A, 97B, and 98B, and the transfer transistors 94A, 95A, 94B, and 95B to be controlled independently for groups.

For example, the gates of the reset transistor 97A and 98A included in the pixel circuits 1-1A and 1-2A are commonly connected to the terminal 110A, and the gates of the transfer transistors 94A and 95A are commonly connected to the terminal 111A.

Furthermore, the gates of the reset transistors 97B and 98B included in the pixel circuits 1-1B and 1-2B are commonly connected to the terminal 1108, and the gates of the transfer transistors 94B and 95B are commonly connected to the terminal 111B.

Figure 21:
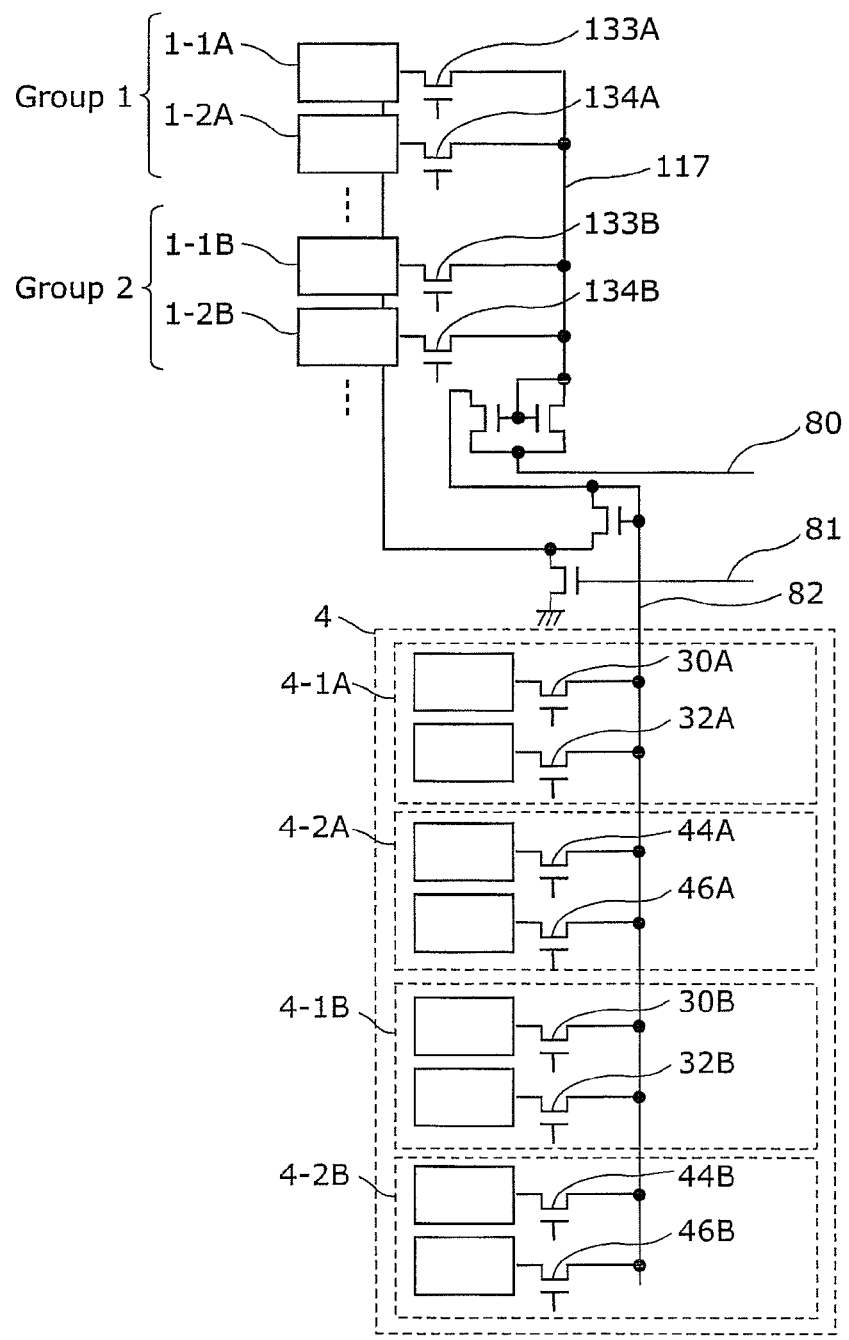
FIG. 21 is a block diagram for illustrating how the pixel circuits are grouped according to Variation in Embodiment 2.

FIG. 21 is a block diagram illustrating the grouping of the pixel circuits, and indicates the configuration of the grouped pixel circuits 1-1A, 1-2A, 1-1B, and 1-2B, and the storage unit 4. The storage unit 4 in FIG. 21 is substantially identical to the storage unit 4 in FIGS. 4 and 6, and the holding circuit for holding the reset voltage and the signal voltage are provided for each pixel circuit. In FIG. 21, for understanding, the holding circuits 4-1A, 4-2A, 4-1B, and 4-2B are indicated using the signs corresponding to the pixel circuits.

Figure 22:
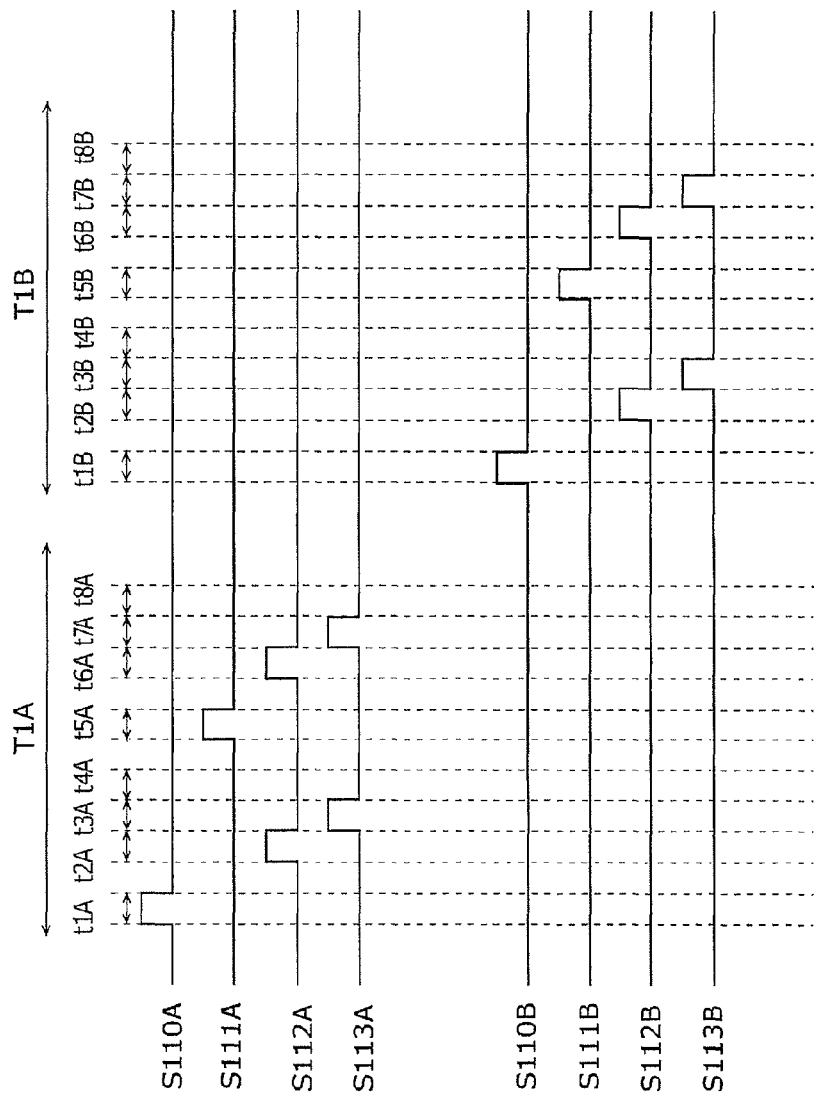
FIG. 22 is a timing chart illustrating temporal changes of major signals in the solid-state imaging device according to Variation in Embodiment 2.

FIG. 22 is a timing chart illustrating temporal change in the major signals in the solid-state imaging device according to Variation 2. Compared with the timing chart in FIG. 10, the timing chart in FIG. 22 is different in that the operation in the period T1 is performed for each group according to the grouping of the pixel circuits (for example, group 1 in the period T1, and group 2 in the period T1B). The following shall mainly focus on the changes from the timing chart in FIG. 10.

The period T1A in FIG. 22 is a period for generating the reset voltage and the signal voltage by the pixel circuits 1-1A and 1-2A, and for transferring the generated reset voltage and the signal voltage to the holding circuits 4-1A and 4-2B, and the period T1B is a period for generating the reset voltage and the signal voltage by the pixel circuits 1-1B and 1-2B, and for transferring the generated reset voltage and the signal voltage to the holding circuits 4-1B and 4-2B.

With this configuration, the operation, by the pixel circuits, for generating the reset voltage and the signal voltage and transferring the reset voltage and the signal voltage to the storage unit 4 is performed for each group. Thus, in return for losing the synchronism in the exposure period of all pixels, it is possible to reduce the time for holding the signal voltage by the pixel circuit.

As a result, compared to the case in which the reset voltage and the signal voltage are generated by all of the pixel circuits and transferred to the storage unit 4, the noise caused by the leakage current included in the signal voltage transferred from the pixel circuits to the storage unit 4 can be reduced.

As noted in the consideration in Variation 2 in Embodiment 1, this configuration is practical.

Embodiment 3

The solid-state imaging device according to Embodiment 3 includes a plurality of pixel circuits arranged in rows and columns, and each of which outputs an electric signal according to an amount of received light; a vertical scanning circuit which generates driving signals for driving the pixel circuits and selection signals for selecting the pixel circuits per row, a column signal line provided for each of the columns, and for sequentially transferring the electric signals from the pixel circuits in a corresponding column; a holding circuit provided for each of at least one pixel circuit in each column, and which holds the electric signal transferred from the corresponding pixel circuit through the column signal line in the corresponding column; and a difference circuit provided for each column signal line and which removes noise from the electric signals stored in the holding circuit by correlated double sampling. The durations of the valid periods of the driving signals supplied to the rows are identical, and the vertical scanning circuit starts, during the valid period of the driving signal, the valid period of the driving signal for another row. With this structure, it is possible for the electric signal to be transferred at high speed, reducing time difference in shutter operation for each row and the image distortion

Basic Configuration of Embodiment 3

Figure 23:
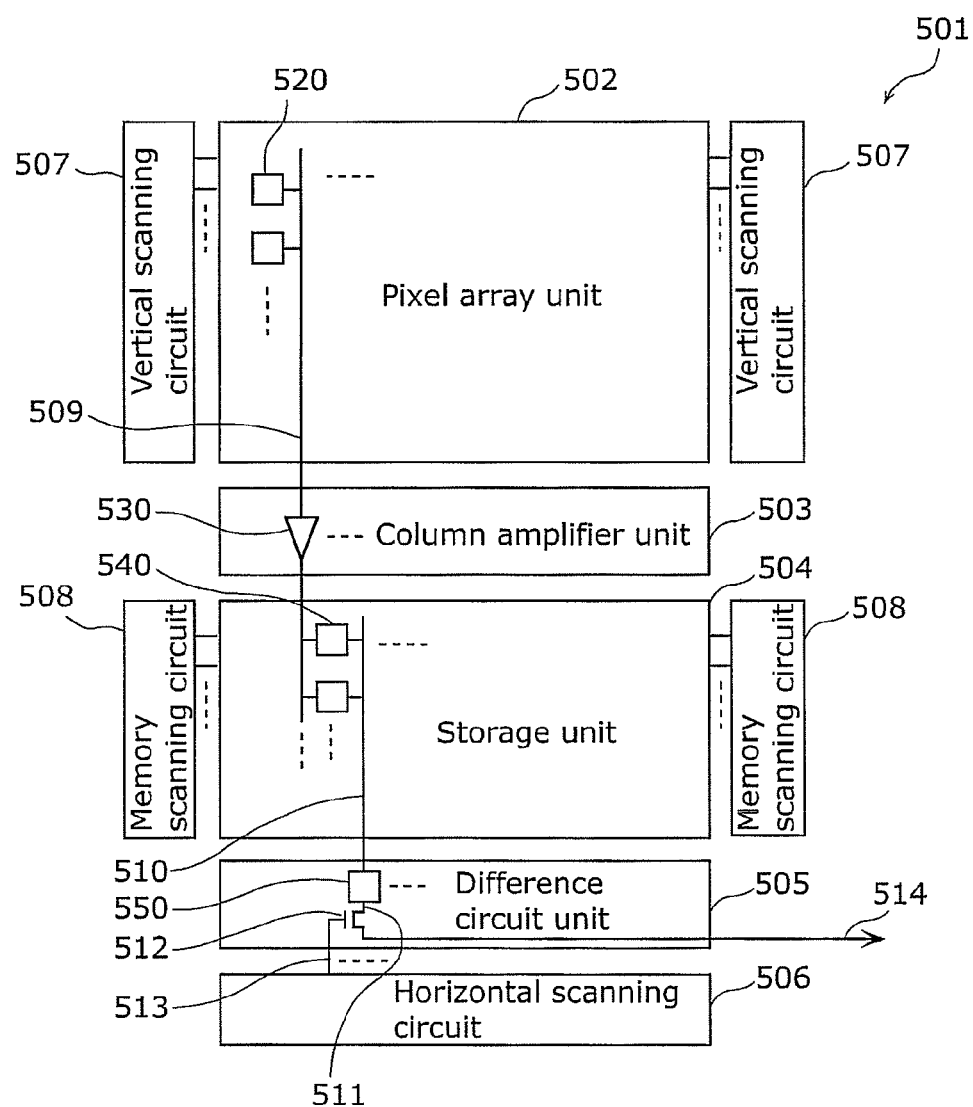
FIG. 23 is a schematic diagram illustrating the configuration of a solid-state imaging device according to Embodiment 3 of the present invention.

FIG. 23 illustrates the configuration of a MOS image sensor 501 as an example of the solid-state imaging device according to the present invention. As illustrated in FIG. 23, the MOS image sensor 501 includes a pixel array unit 502, a column amplifier unit 503, a storage unit 504, a difference circuit unit 505, a horizontal scanning circuit 506, a vertical scanning circuit 507, and a memory scanning circuit 508.

The pixel array unit 502 includes pixel circuits 520. The column amplifier unit 503 includes column amplifiers 530. The storage unit 504 includes holding circuits 540. The difference circuit unit 505 includes difference circuits 550 and the selection transistor 512.

The MOS image sensor 501 includes, for each column, a first column signal line 509, a second column signal line 510 which is an input line of the difference circuit 550, a third column signal line 511 which is an output line of the difference circuit 550, the column selection signal line 513, and the output signal line 514. Note that, in FIG. 23, these lines are illustrated only for one row.

The electric signal output from the pixel circuit 520 is transferred to the column amplifier 530 and the holding circuit 540 through the first column signal line 509. Furthermore, the signal output from the holding circuit 540 is input to the difference circuit 550 through the second column signal line 510. The signal output from the difference circuit 550 is transferred to the selection transistor 512. From the horizontal scanning circuit 506, the driving signal is supplied to the selection transistor 512 through the column selection signal line 513.

Figure 24:
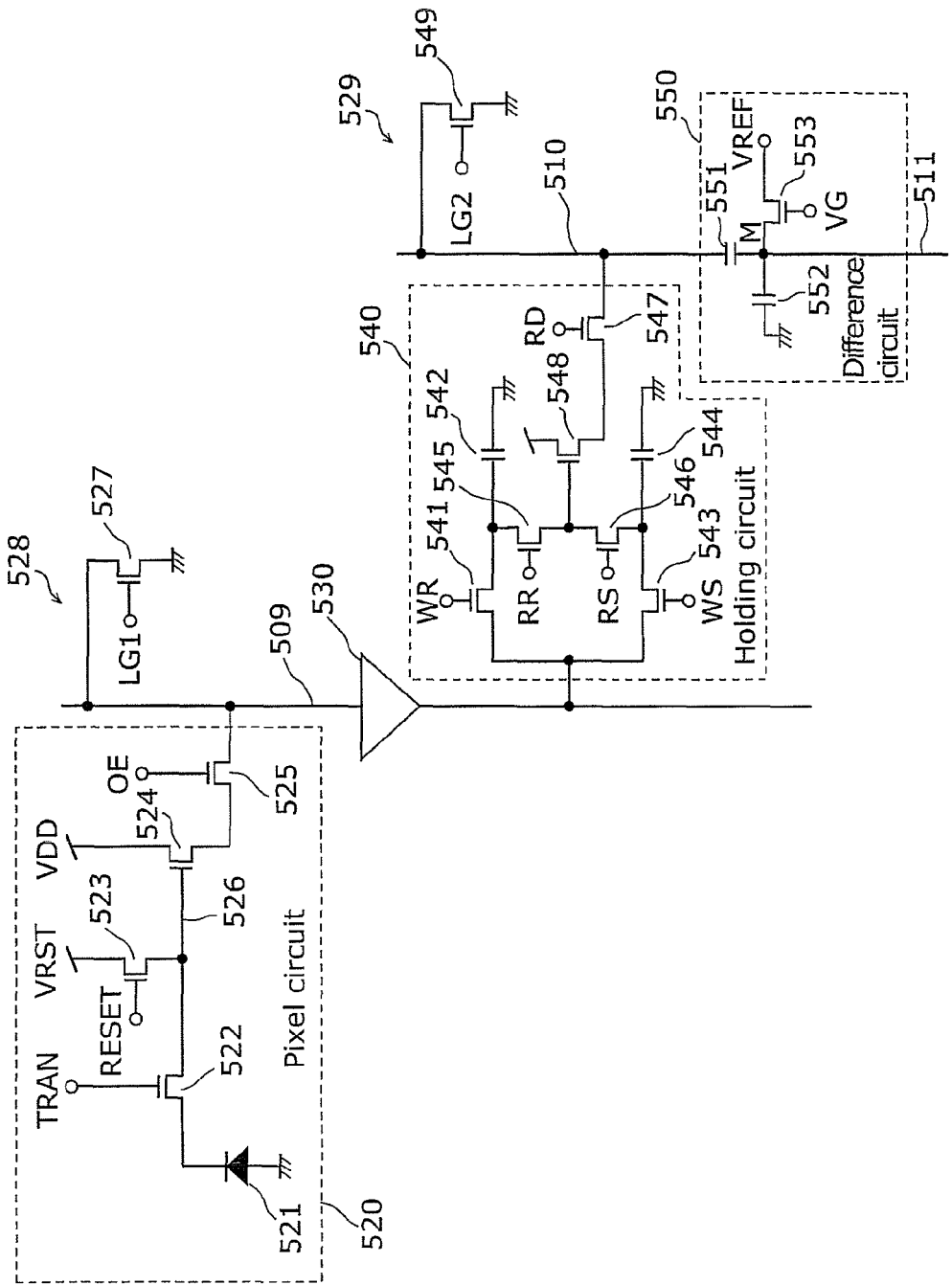
FIG. 24 is a circuit diagram illustrating configuration of the solid-state imaging device according to Embodiment 3.

The detailed configuration of the MOS image sensor 501 in FIG. 23 is illustrated in FIG. 24.

In FIG. 24, the pixel circuit 520 includes a photodiode 521, a transfer transistor 522, a reset transistor 523, an output transistor 524, and a selection transistor 525. An optical signal is photoelectrically converted by the photodiode 521, and electric signals according to the amount of received light are obtained.

More specifically, the photodiode 521 generates the electric charge according to the amount of incident light. The anode of the photodiode 521 is grounded, and the cathode is connected to the drain of the transfer transistor 522.

The gate terminal of the transfer transistor 522 is connected to the vertical scanning circuit 507 in FIG. 23, and supplied with a transfer gate driving signal TRAN. The source of the transfer transistor 522 is connected to the source of the reset transistor 523 and the gate of the output transistor 524, and this area forms a diffusion capacitance referred to as the FD unit 526. The FD unit 526 converts the electric charge transferred from the photodiode 521 through the transfer transistor 522 into a voltage signal.

The drain of the reset transistor 523 is connected to the power supply VRST, and the gate terminal is connected to the vertical scanning circuit 507 in FIG. 23. The reset transistor 523 is supplied with a reset gate driving signal RESET, and resets the electric charge transferred to the FD unit 526. With this, the FD unit 526 is set to a reset state.

The output transistor 524 has a gate connected to the FD unit 526, outputs the first electric signal with the FD unit 526 reset (set to the reset state), and outputs the second electric signal according to the voltage signal obtained by converting the electric charge transferred from the photodiode 521 at the FD unit 526.

In the following description, the first electric signal and the second electric signal are referred to as a reset signal and a voltage signal, respectively.

Here, the load transistor 527 connected to the first column signal line 509 compose a source follower circuit 528 with the output transistor 524, and sequentially outputs the electric signal from the pixel circuit 520 to the first column signal line 509. The gate of the load transistor 527 is connected to LG1, and is DC biased.

The selection transistor 525 has the gate connected to the vertical scanning circuit 507, and is conducted or not conducted according to a selection signal OE output from the vertical scanning circuit 507, and outputs the output from the output transistor 524 to the first column signal line 509 while in conduction state.

The column amplifier 530 amplifies the electric signal output from the pixel circuit 520 to the first column signal line 509 and outputs the amplified signal to the holding circuit 540.

The holding circuit 540 is provided for a corresponding one of the pixel circuits 520, and stores the voltage signal and the reset signal output from the FD unit 526 in the pixel circuit 520. More specifically, each of the holding circuits 540 includes a reset signal writing transistor 541, a reset signal capacitor 542, a voltage signal writing transistor 543, a voltage signal capacitor 544, a reset signal reading transistor 545, a voltage signal reading transistor 546, a selection transistor 547, and an output transistor 548.

Note that, the gates of the reset signal writing transistor 541, the voltage signal writing transistor 543, the reset signal reading transistor 545, and the voltage signal reading transistor 546 are connected to the memory scanning circuit 508.

The load transistor 549 connected to the second column signal line 510 forms a source follower circuit 529 with the output transistor 548, in the same manner as the load transistor 527. The gate of the load transistor 549 is connected to LG2, and is DC biased.

The difference circuit 550 includes capacitors 551 and 552, and a transistor 553. The second column signal line 510 is connected to the first terminal of the capacitor 551, and the second terminal of the capacitor 551 is connected to the first terminal of the capacitor 552 and the drain of the transistor 553. The second terminal of the capacitor 552 is grounded. The gate of the transistor 553 is connected to the terminal VG, and the source of the transistor 553 is connected to the terminal VREF. The terminal VREF is set at a reference voltage Vref. With this configuration, the difference circuit 550 detects, by the correlated double sampling, the voltage signals and the reset signals output per frame from the holding circuit 540, removes fixed pattern noise, and outputs an output signal according to the voltage signal detected by the photodiode 521 in the pixel circuit 520 to the third column signal line 511.

Furthermore, the connecting point M in the difference circuit 550 is connected tot the selection transistor 512 illustrated in FIG. 23. The selection transistor 512 is conducted or non-conducted according to a signal from the horizontal scanning circuit 506 through the column selection signal line 513, and a difference voltage at the connecting point M is output to the output signal line 514 while the selection transistor 512 is conducted.

Driving Method According to Embodiment 3

Figure 25:
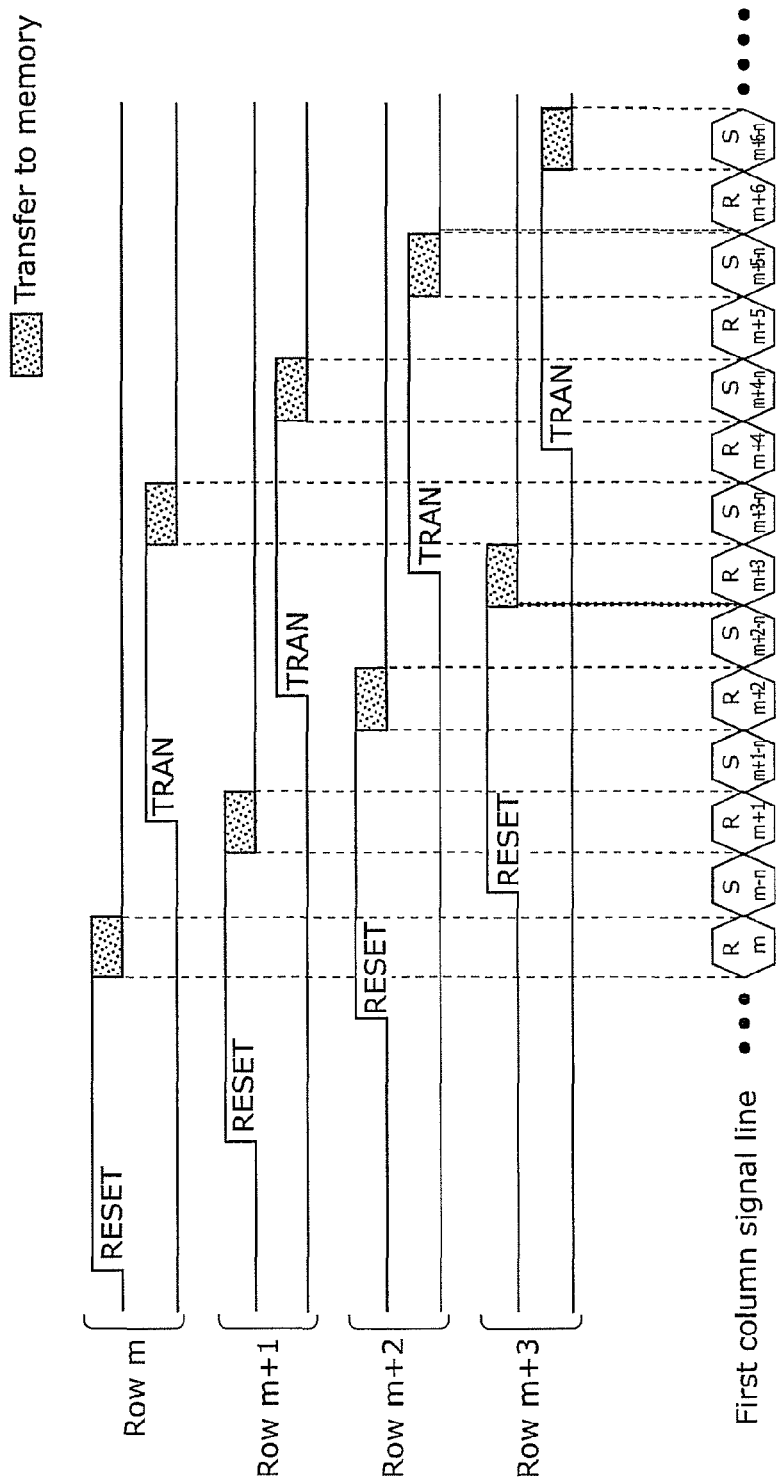
FIG. 25 is a diagram illustrating timing for driving the solid-state imaging device according to Embodiment 3.

Next, FIG. 25 illustrates a specific example of basic operation of the MOS image sensor 501.

FIG. 25 is a timing chart illustrating an example of timing for supplying a reset gate driving signal RESET and a transfer gate driving signal TRAN supplied from the vertical scanning circuit 507 to the pixel circuits 520 arranged in row m to row m+3 in the pixel array unit 502.

The gate of the reset transistor 523 and the gate of the transfer transistor 522 in each row are supplied with the driving signals, that is, the reset gate driving signal RESET and the transfer gate driving signal TRAN, respectively. As illustrated in FIG. 25, the reset gate driving signal RESET and the transfer gate driving signal TRAN supplies a signal at low level after supplying a signal at high level for a predetermined period. Note that, in Embodiment 3, a period in which the high level signal is supplied is referred to as a valid period, and the valid period of the reset gate driving signal RESET and the transfer gate driving signal TRAN are the same.

In a predetermined period immediately before the end of the valid period of the reset gate driving signal RESET, a transfer period in which the reset signal of the FD unit 526 in the pixel circuit 526 is transferred to the holding circuit 540 is provided. In a predetermined period immediately before the end of the valid period of the transfer gate driving signal TRAN, a transfer period in which the voltage signal in the FD unit 526 in the pixel circuit 520 is transferred to the holding circuit 540 is provided.

Furthermore, as illustrated in FIG. 25, for example, during the valid period of the reset gate signal RESET in the row m+1, the supply of the transfer gate driving signal TRAN in row m starts, and during the valid period of the transfer gate driving signal TRAN in row m−3 (not illustrated), the supply of the reset gate driving signal RESET in row m+3 starts. More specifically, while the reset signal or the voltage signal is transferred to the FD unit 526 in the pixel circuit 520 in one row, the supply of the transfer gate driving signal TRAN or RESET to another row start, and the reset signal or the voltage signal is transferred to the FD unit 526 in the pixel circuits 520 in more than one row. This operation is sequentially performed for all rows in the pixel array unit 502, starting from the top row to the end row, for example.

Figure 26:
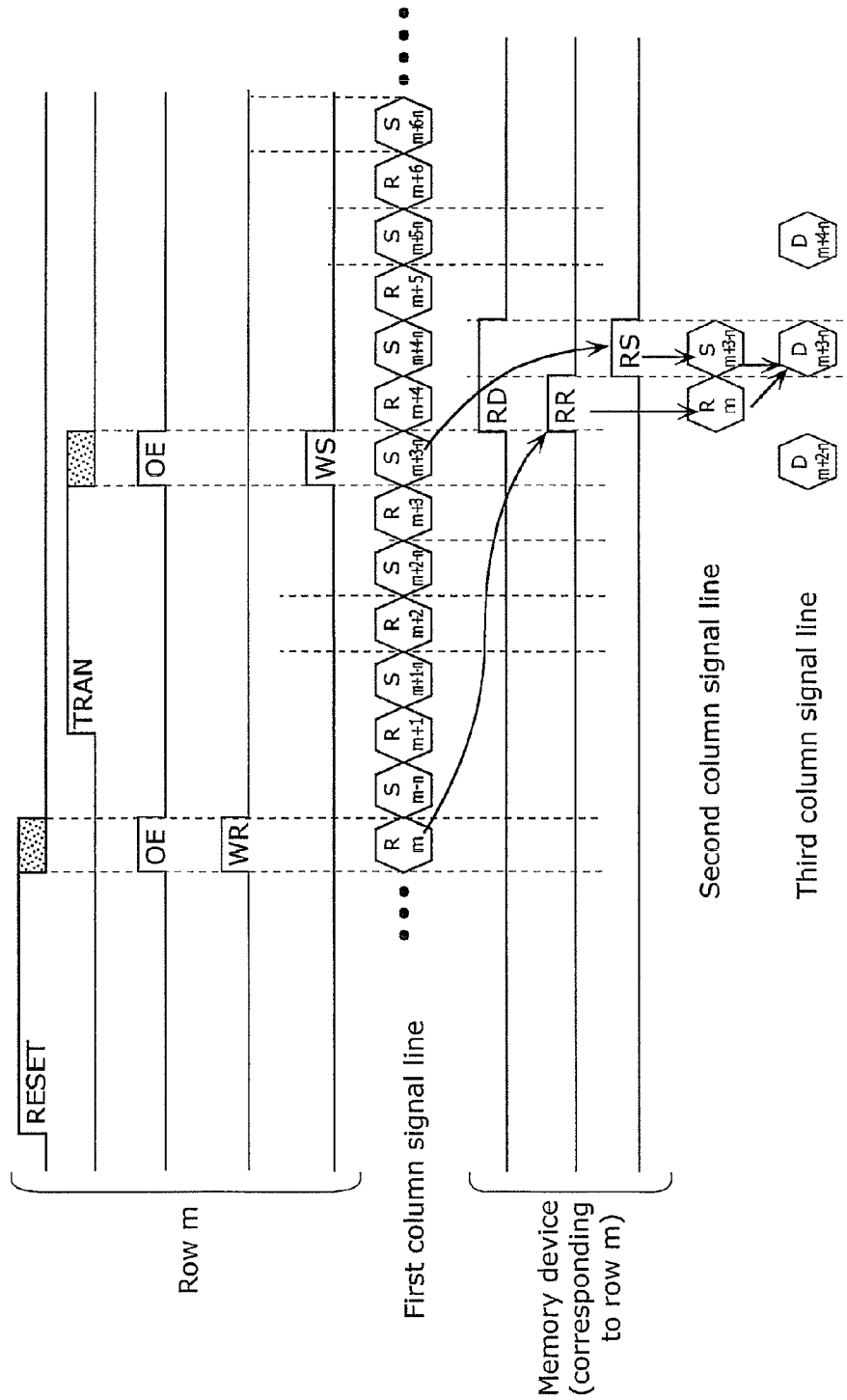
FIG. 26 is a diagram illustrating timing for driving the solid-state imaging device according to Embodiment 3.

FIG. 26 is a timing chart illustrating the supply timing for the reset gate driving signal RESET, the transfer gate driving signal TRAN, the selection signal OE, the reset writing signal WR, the voltage writing signal WS, the memory selection signal RD, the reset reading signal RR, and the voltage reading signal RS supplied to row m.

As illustrated in FIG. 26, in the transfer period of the reset gate driving signal RESET in row m, the vertical scanning circuit 507 supplies the gate of the selection transistor 525 in the pixel circuit 520 in row m with the selection signal OE, turning on the selection transistor 525. At the same time, the memory scanning circuit 508 supplies the gate of the reset signal writing transistor 541 in the holding circuit 540 corresponding to the pixel circuit 520 in row m with the reset writing signal WR, turning on the reset signal writing transistor 541. With this, the reset signal in the FD unit 526 in the pixel circuit 520 in row m is output to the first column signal line 509, and the reset signal is stored in the reset signal capacitor 542 in the holding circuit 540 corresponding to the pixel circuit 520 in row m.

In the transfer period of the transfer gate driving signal TRAN, the vertical scanning circuit 507 supplies the gate of the selection transistor 525 in the pixel circuit 520 in row m with the selection signal OE, turning on the selection transistor 525. At the same time, the memory scanning circuit 508 supplies the gate of the voltage signal writing transistor 543 in the holding circuit 540 corresponding to the pixel circuit 520 in row m with the voltage writing signal WS, turning on the voltage signal writing transistor 543. With this, the voltage signal of the FD unit 526 holding the electric charge transferred from the photodiode 521 is output to the first column signal line 509, and stored in the voltage signal capacitor 544 in the holding circuit 540 corresponding to the pixel circuit 520 in row m.

With this operation, to the first column signal 509, reset signals and voltage signals for different rows are alternately output in an order such as a reset signal Rm in the pixel circuit 520 in row m, a voltage signal Sm−n in row m−n in the pixel circuit 520 with a difference n from row m (n=3 in FIG. 26), a reset signal Rm+1 in the pixel circuit 520 in row m+1, a voltage signal Sm+1−n in the pixel circuit 520 with an interval of n rows from row m+1, and so on, as illustrated in FIGS. 25 and 26, and the reset signals and the voltage signals are stored in the holding circuit 540.

After that, for row m, the memory scanning circuit 508 supplies the gate of the selection transistor 547 in the holding circuit 540 with the memory selection signal RD so as to turn on the selection transistor 547, and supplies the gate of the reset signal reading transistor 545 with the reset reading signal RR so as to turn on the reset signal reading transistor 545. With this, as illustrated in FIG. 26, the reset signal Rm stored in the reset signal capacitor 542 is output to the second column signal line 510.

Subsequently, the memory scanning circuit 508 supplies the gate of the voltage signal reading transistor 546 in the holding circuit 540 with the voltage reading signal RS, turning on the voltage signal reading transistor 546. With this, the voltage signal Sm+3−n (n=3) stored in the reset signal capacitor 542 is output to the second column signal line 510.

Subsequently, the reset signal Rm and the voltage signal Sm+3−n output to the second column signal line 510 are detected, by the correlated double sampling, by the difference circuit 550, and the output signal Dm+3−n (n=3) according to the amount of incident light on the photodiode 521 the pixel circuit 520, that is, Dm is output.

Note that, the same operation is performed for the rows other than row m.

Figure 27:
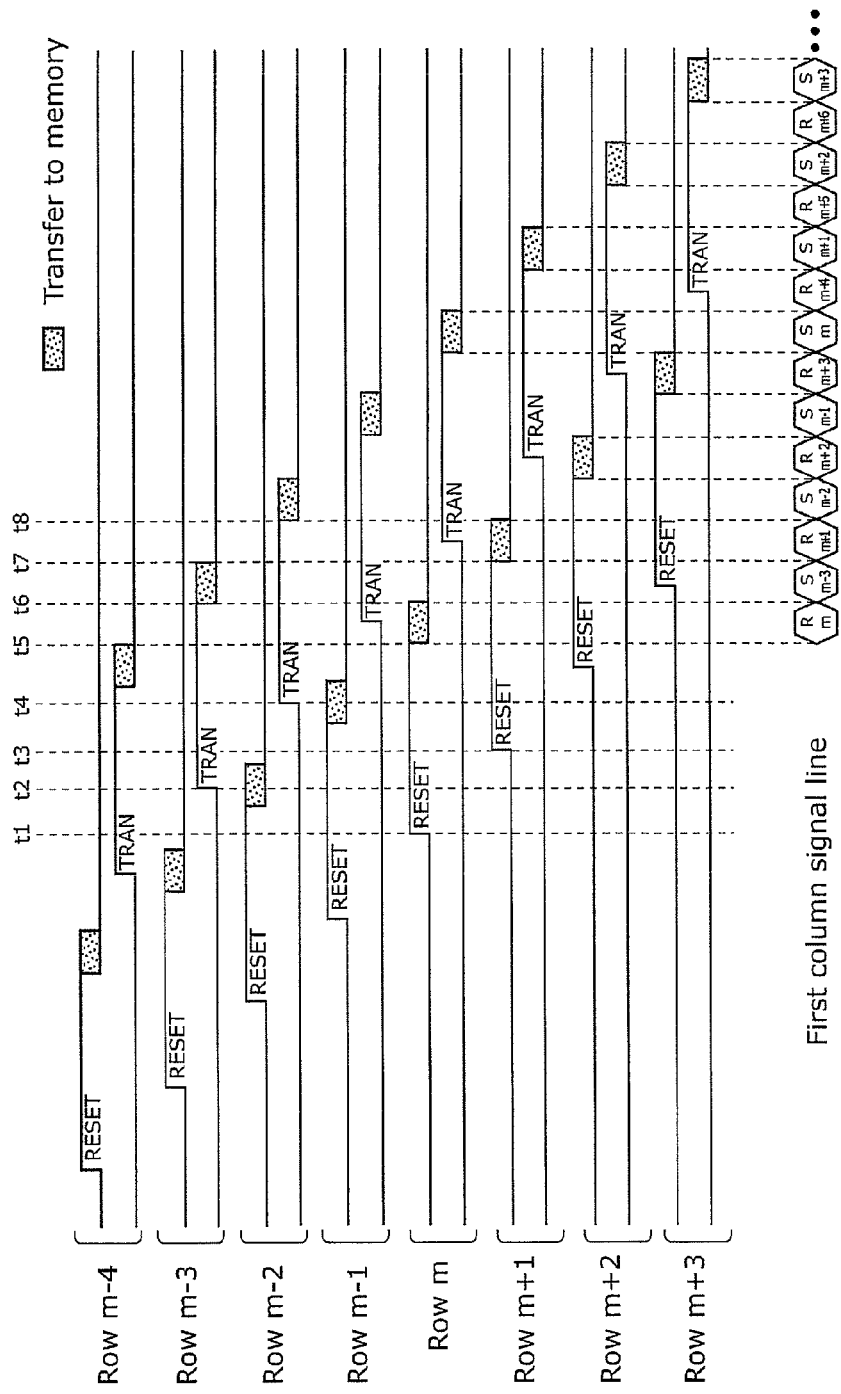
FIG. 27 is a diagram illustrating timing for driving the solid-state imaging device according to Embodiment 3.

FIG. 27 is a timing chart illustrating a timing for supplying the reset gate driving signal RESET and the transfer gate driving signal TRAN supplied from the vertical scanning circuit 507 to the pixel circuits 520 arranged from row m−4 to row m+3. The following shall describe the details of the basic operations of the MOS image sensor 501 when n=3 in FIG. 27.

(1) Time t1

The vertical scanning circuit 507 starts the valid period of the reset gate driving signal RESET at the gate of the reset transistor 523 in the pixel circuit 520 in row m. With this signal, the reset transistor 523 is turned on, starting resetting the FD unit 526 in the pixel circuit 520 in row m.

(2) Time t2

The vertical scanning circuit 507 starts the valid period of the transfer gate driving signal TRAN at the gate of the transfer transistor 522 in the pixel circuit 520 in row m−3. With this signal, the transfer transistor 522 is turned on, starting a transfer of charges from the photodiode 521 to the FD unit 526 which are in the pixel circuit 520 in row m−3.

(3) Time t3

The vertical scanning circuit 507 starts the valid period of the reset gate driving signal RESET in the reset transistor 523 in the pixel circuit 520 in row m+1. With this signal, the reset transistor 523 of the pixel circuit 520 in row m+1 is turned on, starting resetting the FD unit 526 in the pixel circuit 520 in row m+1.

(4) Time t4

The vertical scanning circuit 507 starts the valid period of the transfer gate driving signal TRAN at the gate of the transfer transistor 522 in the pixel circuit 520 in row m−2. With this signal, the transfer transistor 522 is turned on, starting a transfer of charges from the photodiode 521 to the FD unit 526 which are in the pixel circuit 520 in row m−2.

(5) Time t5

As illustrated in FIG. 26, the vertical scanning circuit 507 supplies the selection transistor 525 in the pixel circuit 520 in row m with the selection signal OE, turning on the selection transistor 525 and starting a transfer of the reset signal to the holding circuit 540. At the same time, the memory scanning circuit 508 supplies the gate of the reset signal writing transistor 541 in the holding circuit 540 corresponding to the pixel circuit 520 in row m with the reset writing signal WR, turning on the reset signal writing transistor 541. With this, the reset signal Rm in the FD unit 526 in the pixel circuit 520 in row m reset at the time t1 is output to the first column signal line 509, and stored in the reset signal capacitor 542 in the holding circuit 540 corresponding to the pixel circuit 520 in row m.

Furthermore, the vertical scanning circuit 507 starts the valid period of the transfer gate driving signal TRAN in row m−1 between t5 and t6.

(6) Time t6

As illustrated in FIG. 26, the vertical scanning circuit 507 supplies the selection transistor 525 in the pixel circuit 520 in row m−3 with the selection signal OE, turning on the selection transistor 525 and starting a transfer of the voltage signal to the holding circuit 540. At the same time, the memory scanning circuit 508 supplies the voltage signal writing transistor 543 in the holding circuit 540 corresponding to the pixel circuit 520 in row m−3 with the voltage writing signal WS, turning on the voltage signal writing transistor 543. With this, the voltage signal Sm−3 according to the charge transferred to the FD unit 526 from the photodiode 521 in time t2 is output to the first column signal line 509, and stored in the voltage signal capacitor 544 in the holding circuit 540 corresponding to the pixel circuit 520 in row m−3.

Furthermore, the vertical scanning circuit 507 starts the valid period of the reset gate driving signal RESET in row m+3 between t6 and t7.

(7) Time t7

As illustrated in FIG. 26, the vertical scanning circuit 507 supplies the selection transistor 525 in the pixel circuit 520 in row m+1 with the selection signal OE, turning on the selection transistor 525 and starting a transfer of the reset signal to the holding circuit 540. At the same time, the memory scanning circuit 508 writes the reset writing signal WR on the reset signal writing transistor 541 in the holding circuit 540 corresponding to the pixel circuit 520 in row m+1, turning on the reset signal writing transistor 541. With this, the reset signal Rm+1 in the FD unit 526 in the pixel circuit 520 in row m+1 reset in time t3 is output to the first column signal line 509 and stored in the reset signal capacitor 542 in the holding circuit 540 corresponding to the pixel circuit 520 in row m+1.

Furthermore, the vertical scanning circuit 507 starts the valid period of the transfer gate driving signal TRAN in row m between t7 and t8.

(8) Time t8

As illustrated in FIG. 26, the vertical scanning circuit 507 supplies the selection transistor 525 in the pixel circuit 520 in row m−2 with the selection signal OE, turning on the selection transistor 525 and starting a transfer of the voltage signal to the holding circuit 540. At the same time, the memory scanning circuit 508 supplies the voltage signal writing transistor 543 in the holding circuit 540 corresponding to the pixel circuit 520 in row m−2 with the voltage writing signal WS, turning on the voltage signal writing transistor 543. With this, the voltage signal Sm−2 according to the charge transferred to the FD unit 526 from the photodiode 521 in time t4 is output to the first column signal line 509, and stored in the voltage signal capacitor 544 in the holding circuit 540 corresponding to the pixel circuit 520 in row m−2.

The vertical scanning circuit 507 starts the valid period of the transfer gate driving signal TRAN in row m+4 (not illustrated) between t8 and t9 (not illustrated).

By repeating the reading operation described above, a reset signal Rm in row m, a voltage signal Sm−3 in row m−3, a reset signal Rm+1 in row m+1, a voltage signal Sm−2 in row m−2, and a reset signal Rm+2 in row m+2 are sequentially output to the column signal line. More specifically, the reset signal Rm in row m, a voltage signal Sm−n in row m−n, a reset signal Rm+1 in row m+1, a voltage signal Sm−(n−1) in row m−(n−1), and a reset signal Rm+2 in row m+2 are sequentially output to the column signal line. Subsequently, the reset signal and the voltage signal are stored in the holding circuit 540 corresponding to each of the pixel circuits 520, and the signals are read from the holding circuit 540 for each frame. More specifically, the reset signal reading transistor 545, the voltage signal reading transistor 546 and the selection transistor 547 in each holding circuit 540 transfers the signal levels of the reset signal capacitor 542 and the voltage signal capacitor 544 to the difference circuit 550, removing the fixed pattern noise, and the electric signal in each pixel circuit 520 is obtained.

With this, for example, in the period between t5 and t6 in FIG. 27, 6 rows from row m−3 to row m+2 are simultaneously driven by the transfer gate driving signal TRAN or the reset gate driving signal RESET.

On the other hand, in the conventional MOS image sensor, after reading the information for one row is read from the pixel circuits to the difference circuit altogether, the electric signal for one row is output by a horizontal transfer, and the electric signals in the next row is read. Accordingly, the time for (the number of pixel in one row)×(transfer rate) is necessary for each row, which takes a long time for reading out signals for one screen. Therefore, there is a time difference in the time corresponding to the frame rate in the first row and the last row, making a captured image of moving object skewed, for example.

In contrast, in the MOS image sensor, when performing the reading operation, another row is started to be driven during a driving period of one row, and the driving signals are supplied for multiple rows. This allows a high-speed transfer of the signal for one screen to the storage unit 504. After that, reading the information in the holding circuit 540 allows obtaining an image with a small difference at an approximately same time regardless of the output transfer time of the signal, reducing the image distortion by the rolling shutter, as described above.

Furthermore, according to the method of reading described above, the interval between the charge transfer from the photodiode 521 to the FD unit 526 to the signal readout from the FD unit 526 are constant. Thus, the conventional problem of difference in the amount of noise due to the difference in the interval among the pixel circuits can be solved.

Note that, the holding circuit 540 in the storage unit 504 may be as many as the number of the pixel circuits 520, or as many as the number of rows to be driven at the same time in each column. For example, in the driving method in FIG. 27 (N=3), at least 6 holding circuits may be provided for each column.

Variation in Embodiment 3

The following shall describe a Variation of Embodiment 3. This Variation is different from Embodiment 3 in that the MOS image sensor 501 uses a current-amplifier circuit instead of the source follower circuit using the load transistor 527. The rest of the configuration is identical to Embodiment 3.

Figure 28:
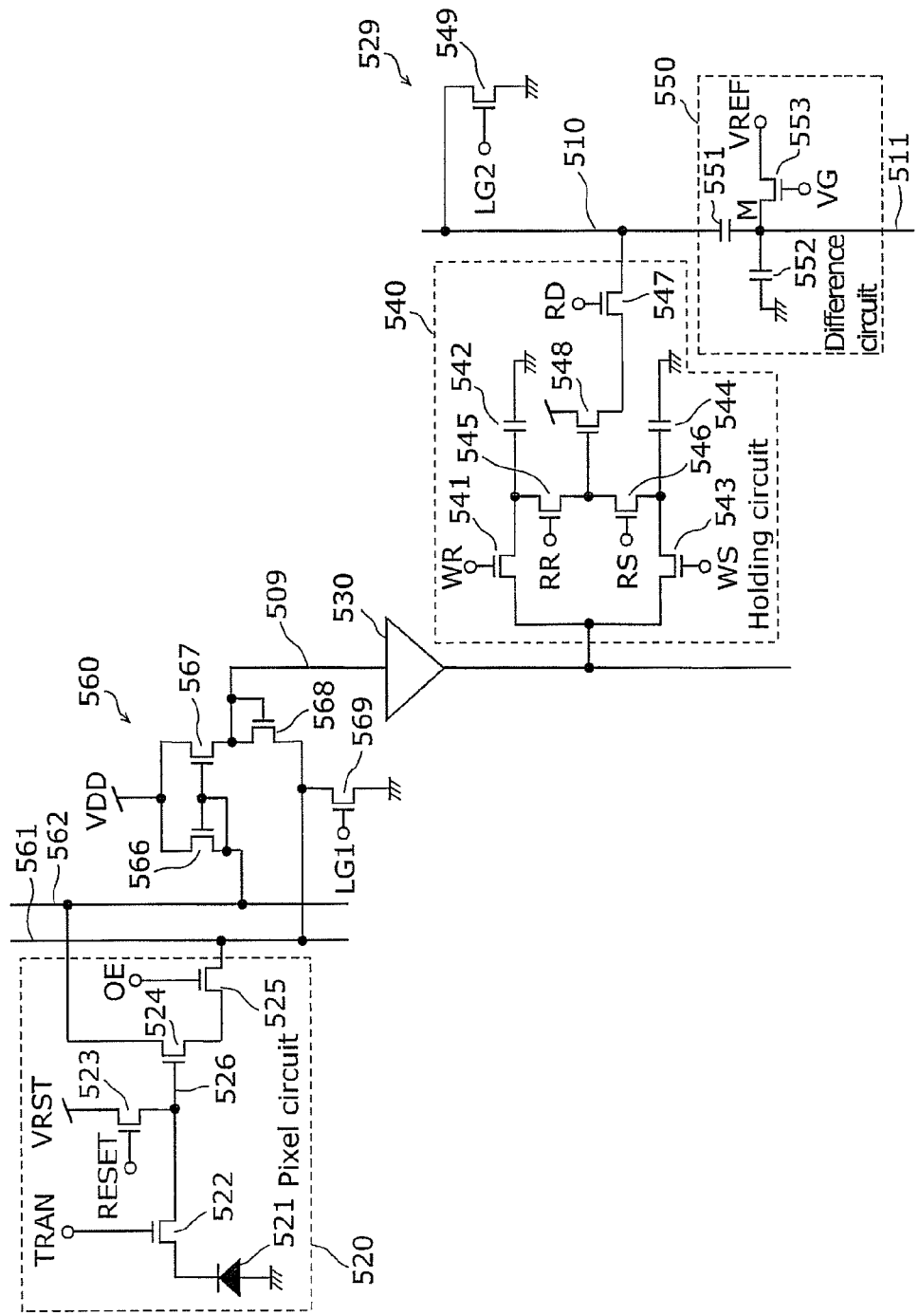
FIG. 28 is a circuit diagram illustrating configuration of the solid-state imaging device according to Variation in Embodiment 3.

FIG. 28 is a circuit diagram illustrating the configuration of the MOS image sensor 501 according to the Variation.

As illustrated in FIG. 28, the MOS image sensor 501 according to the Variation includes a pixel circuit 520, a column amplifier 530, a holding circuit 540, a difference circuit 550, and further includes a current-amplifier circuit 560.

The current-amplifier circuit 560 includes load transistors 566, 567, 568, and 569. The drains of the load transistors 566 and 567 are connected to the power supply VDD. The gates of the load transistors 566 and 567 are commonly connected, and are connected to the source of the load transistor 566. The source of the transistor 566 is connected to the common signal line 562.

The drain and the gate of the load transistor 568 are commonly connected to the source of the load transistor 567, and are connected to the holding circuit 540 through the first column signal line 509 and the column amplifier 530. The source of the transistor 568 is connected to the common signal line 561.

The drain of the load transistor 569 is connected to the common signal line 561, and the source is grounded. The gate is connected to the terminal LG1 and is DC biased.

Figure 29:
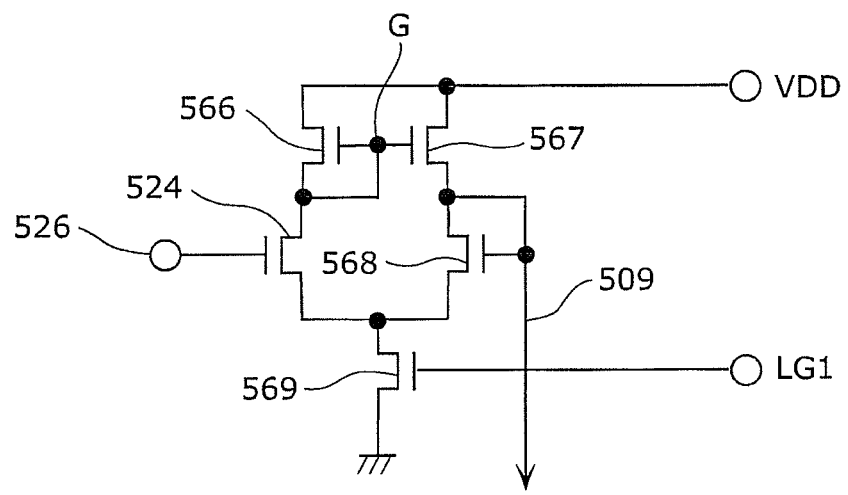
FIG. 29 is a circuit diagram illustrating a buffer circuit in the solid-state imaging device according to Variation in Embodiment 3.

Here, the MOS image sensor 501 functions as an equivalent of a buffer circuit illustrated in FIG. 29. The output transistor 524 in the pixel circuit 520 functions as an input transistor of the buffer circuit in FIG. 29.

The common signal line 562 in FIG. 28 corresponds to the circuit part G in FIG. 29, even if a signal voltage with large amplitude is input to the FD unit 526 which is the input terminal of the buffer circuit, the voltage amplitude at the circuit part G corresponding to the common signal line 562 is small, and the influence of the floating capacitance at the common signal line 562 is small. This allows high-speed operation. More specifically, the reset voltage of the FD unit 526 corresponding to the output transistor 524 is transferred to the holding circuit 540 at high speed.

As such, introducing the current-amplifier circuit 560 illustrated in FIG. 28 to the configuration of the MOS image sensor 501 allows the high-speed transfer operation of the electric signals to the holding circuit 540.

When transferring information from the pixel circuit 520 to the holding circuit 540, it takes time in the source follower circuit 528 illustrated in FIG. 24 until the output is stabilized. Thus, the source follower circuit is not very suitable for high-speed transfer. In contrast, using the current-amplifier circuit 560 as illustrated in FIG. 28 makes the amplitude of the first column signal line 509 smaller than the amplitude in the source follower circuit, stabilizing the output voltage at high speed.

Note that, the present invention is not limited to the Embodiments described above, and may be modified and changed within the scope of the present invention.

For example, the number of pixel rows driven at the same time may be arbitrarily changed, and is not limited the example illustrated in the Embodiments.

Furthermore, the number of the holding circuits may be identical to the number of the pixel circuits, or may be at least as many as the number of rows to be driven at the same time in each column.

Furthermore, the solid-state imaging device according to the present invention includes another embodiment implemented using a combination of components in the Embodiments, variations obtained by modifying the Embodiments by the one skilled in the art within the scope of the present invention, and devices including the solid-state imaging device according to the present invention. For example, a movie camera including the solid-state imaging device according to the present invention is also included in the present invention.

Embodiment 4

Figure 30:
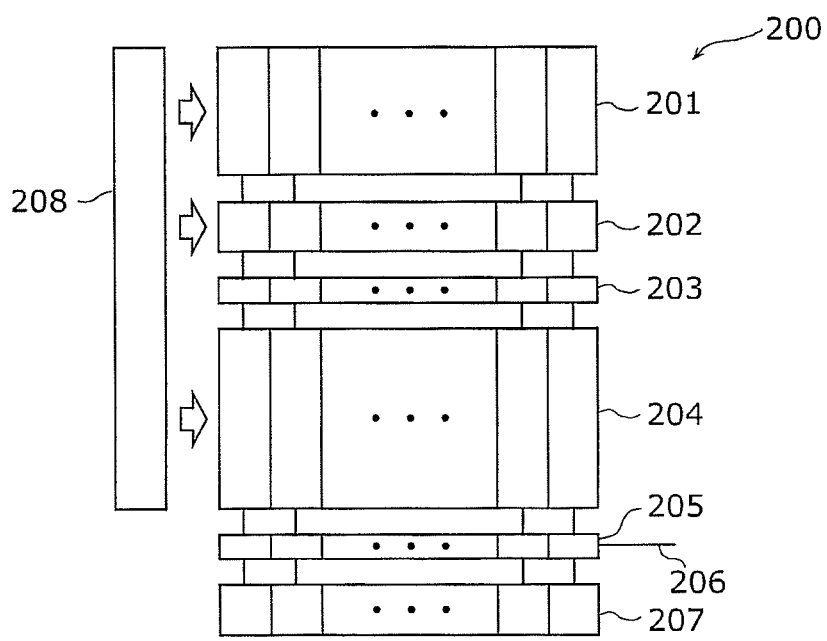
FIG. 30 is a block diagram illustrating the configuration of a solid-state imaging device according to Embodiment 4 of the present invention.

The following shall describe the solid-state imaging device according to Embodiment 4 of the present invention with reference to FIG. 30. FIG. 30 indicates the block configuration of the solid-state imaging device 200 according to Embodiment 4.

As illustrated in FIG. 30, the solid-state imaging device 200 includes, for example, a pixel array unit 201 in which pixel circuits are arranged in a matrix, a first storage unit 202, a first difference circuit 203, a second storage unit 204, a second difference circuit 205, an output line 206, a horizontal scanning circuit 207, and a vertical scanning circuit 208.

Here, the first storage unit 202 and the first difference circuit 203 in the solid-state imaging device 200 corresponds to the storage unit 4 and the difference circuit 5 in the solid-state imaging device 100 according to Embodiment 1. In the solid-state imaging device 200, the second storage unit 204 and the second difference circuit 205 which are not included in the solid-state imaging device 100 are provided at the later stage of the first storage unit 202 and the first difference circuit 203.

The pixel array unit 201 outputs a reference output which is the first electric signal, and a signal output which is the second electric signal. The first storage unit 202 holds the reference output and the signal output, or only the reference output. The first difference circuit 203 outputs a difference between the reference output and the signal output held in the first storage unit 202, or a difference between the reference output held in the first storage unit 202 and the signal output from the pixel array unit 201. The second storage unit 204 holds the difference output from the first difference circuit 203. The second difference circuit 205 calculates a difference between the difference output held in the second storage unit 204 and the reference voltage, and the difference signal is output to the output line 206 in synchronization with the output of the horizontal scanning circuit 207. The vertical scanning circuit 208 outputs a pulse signal to the pixel array unit 201, the first storage unit 202, and the second storage unit 204.

Figure 31:
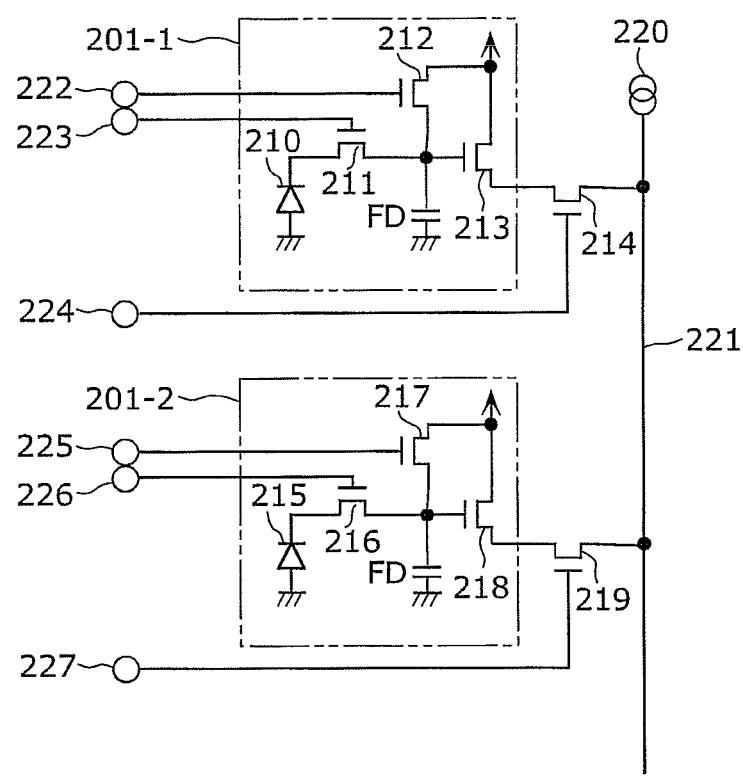
FIG. 31 is a circuit diagram illustrating an exemplary configuration of pixels for one column and two rows, according to the solid-state imaging device of Embodiment 4.

FIG. 31 illustrates a specific example of pixel circuits for one column and two rows in the pixel array unit 201. In FIG. 31, the pixel circuit 201-1 includes a photodiode 210, a transfer transistor 211, a reset transistor 212, and an output transistor 213. The pixel circuit 201-2 includes, in the same manner as the pixel circuit 201-1, a photodiode 215, a transfer transistor 216, a reset transistor 217, and an output transistor 218.

In the pixel circuit 201-1, the photodiode 210 has the anode grounded, and the cathode connected to the drain of the transfer transistor 211. The transfer transistor 211 has the source connected to the source of the reset transistor 212 and the gate of the output transistor 213, and the gate connected to the terminal 223. The area including the source of the transfer transistor 211, the source of the reset transistor 212, and the gate of the output transistor 213 forms diffusion capacitance referred to as the FD unit. The reset transistor 212 has the drain connected to the power supply and the gate connected to the terminal 222. The output transistor 213 has the drain connected to the power supply and the source connected to the drain of the row selection transistor 214. The current source 220 is connected to the column signal line 221. The row selection transistor 214 has the gate connected to the terminal 224, and when in conduction, the row selection transistor 214 forms a source follower circuit with the output transistor 213 and the current source 220.

The photodiode 215 has the anode grounded and the cathode connected to the drain of the transfer transistor 216 in the pixel circuit 201-2 as well. The transfer transistor 216 has the source connected to the source of the reset transistor 217 and the gate of the output transistor 218, and the gate connected to the terminal 226. An area including the source of the transfer transistor 216, the source of the reset transistor 217, and the gate of the output transistor 218 forms a diffusion capacitance referred to as the FD unit. The reset transistor 217 has the drain connected to the power supply and the gate connected to the terminal 225. The output transistor 218 has the drain connected to the power supply and the source connected to the drain of the row selection transistor 219. The row selection transistor 219 has the gate connected to the terminal 227, and when in conduction, the row selection transistor 219 forms a source follower circuit with the output transistor 218 and the current source 220.

Output signals from the pixel circuits 201-1 and 201-2 are output to the column signal line 221 through the column selection transistor 214 and the column selection transistor 219, respectively. The column signal line 221 provides input to the first storage unit 202 illustrated in FIG. 30.

Example 1 of Embodiment 4

Figure 32:
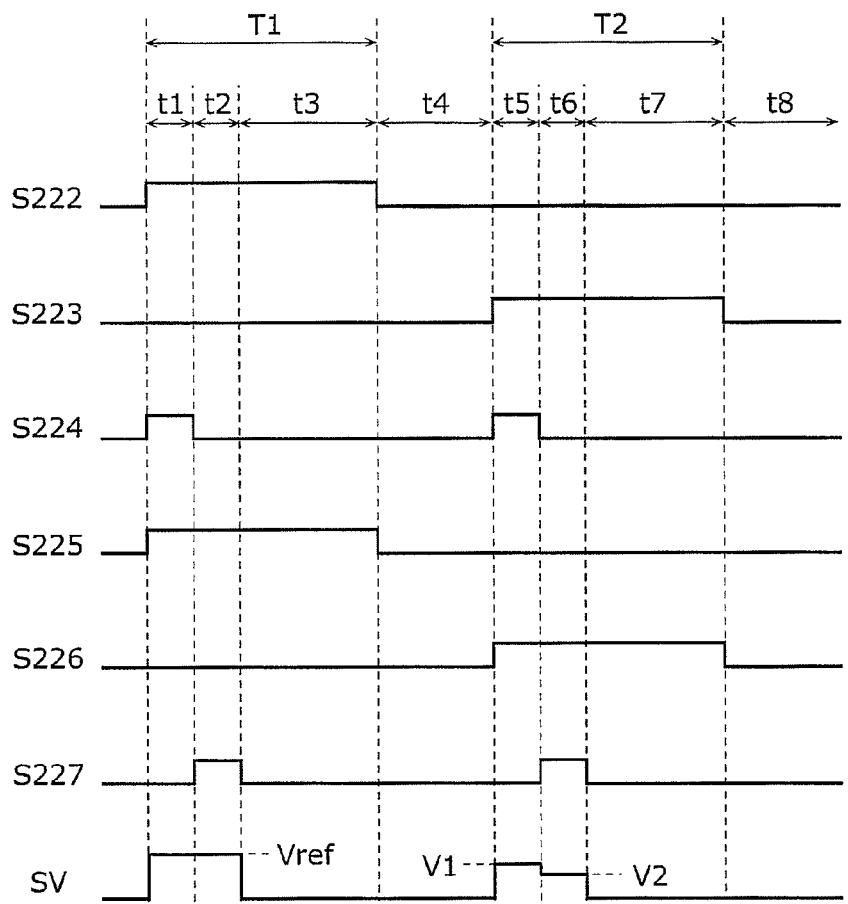
FIG. 32 is a timing chart illustrating temporal changes of major signals in the solid-state imaging device according to Variation 1 in Embodiment 4.

FIG. 32 is a timing chart illustrating temporal change in the major signals in the solid-state imaging device according to Example 1 of Embodiment 4.

FIG. 32 illustrates control signals applied to the terminals illustrated in FIG. 31. Each control signal is represented by a sign with S added to the sign of the terminal to which the control signal is applied.

The following shall describe the first method of driving the solid-state imaging device 200 according to Example 1 with reference to FIGS. 31 and 32.

As illustrated in FIG. 32, first, in period t1, the signals S222, S224, and S225 is switched to "HIGH", switching the gates of the reset transistors 212 and 217 in each pixel circuit to "HIGH" for conduction, connecting the FD units in the pixel circuits with the power supply simultaneously to reset the FD units. In addition, the gate of the row selection transistor 214 is also switched to "HIGH" for conduction. With this, the electric potential of the FD unit in the pixel circuit 201-1 in reset state is output to the column signal line 221 through the source follower circuit composed of the output transistor 213 and the current source 220 (the Vref value in period t1 in signal SV in FIG. 32).

Next, in the period t2, the signals S222, S225, and S227 are all "HIGH", switching the gates of the reset transistors 212 and 217 in the pixel circuits for conduction, simultaneously connecting the FD units in the pixel circuits to the power supply to maintain the reset state. Furthermore, the gate of the row selection transistor 219 is switched to "HIGH" for conduction, and the electric potential of the FD unit in the pixel circuit 201-2 in the reset state is output to the column signal line 221 through the source follower circuit composed of the output transistor 218 and the current source 220 (the Vref value in period t2 in the signals SV in FIG. 32).

Next, in the period t3, the signals S222 and S225 are maintained in "HIGH", and the signals 224 and S227 are "LOW". Note that, in FIG. 31, pixels for two rows are used as an example. When pixel circuits of three rows or more are actually provided, it is needless to say that the Vref value is output in signal SV even in the period t3.

Next, in the period t4, all of the signals are "LOW".

Next, in the period t5, the signals S223, S224, and S226 are changed to "HIGH", and the gates of the transfer transistors 211 and 216 of the pixel circuits are switched to "HIGH" for conduction, transferring the electric charge accumulated in the photodiodes 210 and 215 in the pixel circuits to the FD units. The transferred charge and the capacitance at the FD unit generate voltage at the gates of the output transistors 213 and 218. In addition, the gate of the row selection transistor 214 is also switched to "HIGH" for conduction, and the electric potential in the FD unit of the pixel circuit 201-1 is output to the column signal line 221 through the source follower circuit composed of the output transistor 213 and the current source 220 (the value V1 in period t5 in signal SV in FIG. 32).

Next, in the period t6, the signals S223 and S226 are maintained to be "HIGH", and the transferred charge and the capacitance at the FD unit keep generating the voltage at the gates of the output transistors 213 and 218. In addition, with the "HIGH" in the signal S227, the row selection transistor 219 conducts, and the electric potential at the FD unit in the pixel circuit 201-2 is output to the column signal line 221 through the source follower circuit composed of the output transistor 218 and the current source 220 (the value V2 in period t6 in signal SV in FIG. 32).

The first method of driving the pixel array unit 201 with the period T1 for simultaneously conducting the reset transistors 212 and 217 in the pixel circuits 201-1 and 201-2, and outputting the signal outputs (Vref) corresponding to the reset states of the FD units and the period T2 for simultaneously conducting the transfer transistors 211 and 216 in the pixel circuits 201-1 and 201-2, and outputting the signal outputs (V1, V2) corresponding to the electric charge accumulated in the photodiodes 210 and 215 has been described.

Example 2 of Embodiment 4

Figure 33:
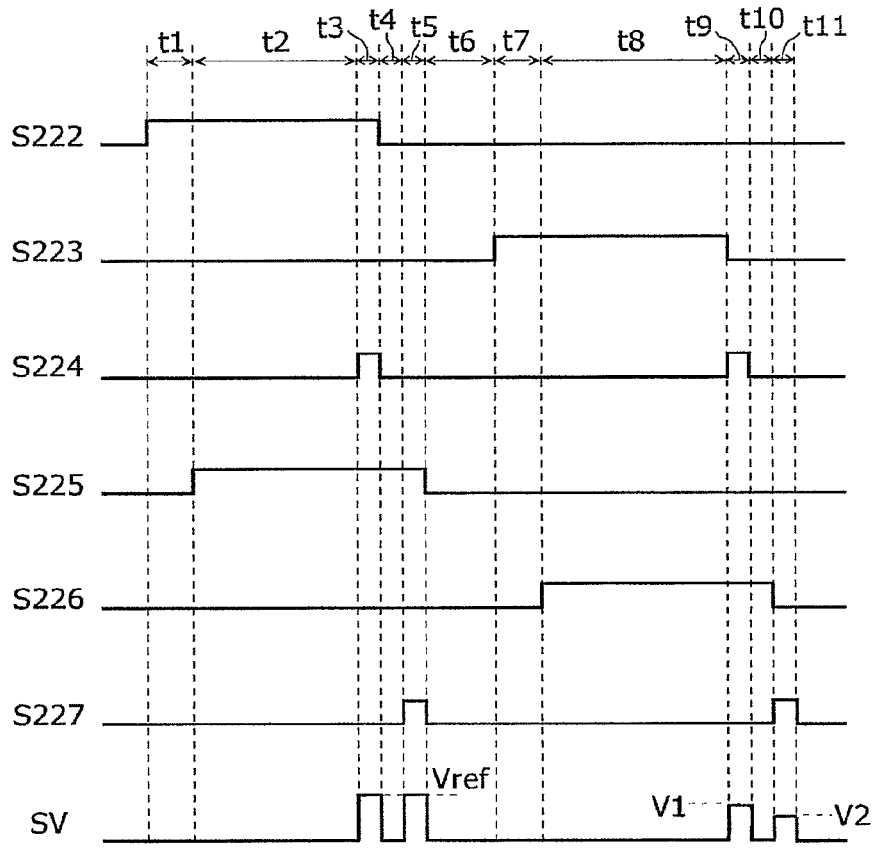
FIG. 33 is a timing chart illustrating temporal changes of major signals in the solid-state imaging device according to Example 2 in Embodiment 4.

FIG. 33 is a timing chart illustrating temporal change in the major signals in the solid-state imaging device according to Example 2 of Embodiment 4.

FIG. 33 illustrates control signals applied to the terminals illustrated in FIG. 31. Each control signal is represented by a sign with S added to the sign of the terminal to which the control signal is applied. The signals S222 to S227 and SV illustrated in FIG. 33 are identical to the signals in FIG. 32. Thus, the description is omitted here.

The following shall describe the second method of driving the solid-state imaging device according to Example 2 with reference to FIGS. 31 and 33.

The signal S222 in FIG. 33 is a signal applied to the terminal 222, and is applied to the gate of the reset transistor 212 in the pixel circuit 201-1, conducting the reset transistor 212 during the periods t1, t2, and t3. The signal S223 is a signal applied to the terminal 223, and is applied to the gate of the transfer transistor 211 in the pixel circuit 201-1, conducting the transfer transistor 211 during the periods t7 and t8. The signal S224 is a signal to be applied to the terminal 224, and is applied to the gate of the row selection transistor 214 in the pixel circuit 201-1, conducting the row selection transistor 214 during the periods t3 and t9. The signal S225 is a signal applied to the terminal 225, and is applied to the gate of the reset transistor 217 in the pixel circuit 201-2, conducting the reset transistor 217 during the periods t2, t3, t4, and t5. The signal S226 is a signal applied to the terminal 226, and is applied to the gate of the transfer transistor 216 in the pixel circuit 201-2, conducting the transfer transistor 216 during the periods t8, t9, and t10. The signal S227 is a signal to be applied to the terminal 227, and is applied to the gate of the row selection transistor 219 in the pixel circuit 201-2, conducting the row selection transistor 219 during the periods t5 and t11. The signals S222 and S225 applied to the reset transistor 212 in the pixel circuit 201-1 and the reset transistor 217 in the pixel circuit 201-2 are both "HIGH" at the same time during the periods t2 and t3. If the durations of the period t1 and the period t4+t5 are identical, the signal S225 has the same length of "HIGH" period as the signal S222. Accordingly, the signal S225 is delayed as much as the period t1. Similarly, the signals S223 and S226 applied to the transfer transistor 211 in the pixel circuit 201-1 and the transfer transistor 216 in the pixel circuit 201-2 are both "HIGH" at the same time in the period t8. If the durations of the period t7 and the period t9+t10 are identical, the signal S226 has the same length of "HIGH" period as the signal S223. Accordingly, the signal S226 is delayed as much as the period t7.

First, the pixel circuit 201-1 shall be described.

As illustrated in FIG. 33, in the periods t1, t2, and t3, the signal S222 is switched to "HIGH", and the gate in the reset transistor 212 is switched to "HIGH" for conduction, connecting the FD unit with the power supply to set to the reset state. In the period t3, the signal S224 is set to "HIGH", switching the gate of the row selection transistor 214 to "HIGH" for conduction. With this, the electric potential of the FD unit in reset state is output to the column signal line 221 through the source follower circuit composed with the output transistor 213 and the current source 220 (Vref value in the period t3 in the signal SV in FIG. 33).

Subsequently, in the periods t7 and t8, the signal S223 is "HIGH", switching the gate of the transfer transistor 211 to "HIGH" for conduction. With this, the electric charge accumulated in the photodiode 210 in the pixel circuit 201-1 is transferred to the FD unit. The transferred charge and the capacitance at the FD unit generate voltage at the gate of the output transistors 213. In the period t9, the signal S224 is set to "HIGH" again, switching the gate of the row selection transistor 214 to "HIGH" for conduction. The electric potential of the FD unit is output to the column signal line 221 through the source follower circuit composed of the output transistor 213 and the current source 220 (the value V1 in the period t9 in the signal SV in FIG. 33).

Next, the pixel circuit 201-2 shall be described.

In the periods t2, t3, t4, and t5, the signal S225 is switched to "HIGH", and the gate in the reset transistor 217 is switched to "HIGH" for conduction, connecting the FD unit with the power supply to set to the reset state. In the period t5, the signal S227 is set to "HIGH", switching the gate of the row selection transistor 219 to "HIGH" for conduction. With this, the electric potential of the FD unit in reset state is output to the column signal line 221 through the source follower circuit composed with the output transistor 218 and the current source 220 (Vref value in the period t5 in the signal SV in FIG. 33).

Subsequently, in the periods t8, t9, and t10, the signal S226 is "HIGH", switching the gate of the transfer transistor 216 to "HIGH" for conduction. With this, the electric charge accumulated in the photodiode 215 in the pixel circuit 201-2 is transferred to the FD unit. The transferred charge and the capacitance at the FD unit generate voltage at the gates of the output transistors 218. In the period t11, the signal S227 is set to "HIGH" again, switching the gate of the row selection transistor 219 to "HIGH" for conduction. The electric potential of the FD unit is output to the column signal line 221 through the source follower circuit composed of the output transistor 218 and the current source 220 (the value V2 in the period t11 in the signal SV in FIG. 33).

Here, if the durations of the periods t1, t4+t5, t7 and t9+t10 are identical (suppose this duration is t), the output signal SV output from the pixel circuit 201-1 to the column signal line 221 is Vref in the period t3 and V1 in the period t9, and the output signal SV output from the pixel circuit 201-2 to the column signal line 221 is Vref in the period t5 and V2 in the period t11. Accordingly, the output from the pixel circuit 201-2 is an output delayed from the output from the pixel circuit 201-1 as much as the duration t.

The second method of driving the pixel array unit 201 in which the signals applied to the reset transistors 212 and 217 and the transfer transistors 211 and 216 in the pixel circuits in different rows are applied with a delay as much as the same duration t has been described.

Figure 34A:
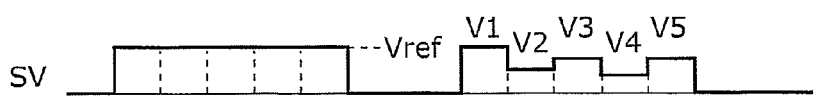
FIG. 34A is a timing chart illustrating an output form of the solid-state imaging device according to Example 1 in Embodiment 4.
Figure 34B:
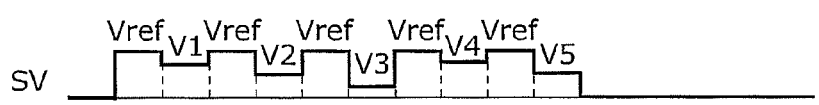
FIG. 34B is a timing chart illustrating an output form of the solid-state imaging device according to Example 2 in Embodiment 4.

FIG. 34A and FIG. 34B illustrate output waveform to the column signal line 221 when the pixel circuits are arranged for three rows or more in the row direction.

FIG. 34A corresponds to the first method of driving illustrated in FIG. 32, and is an output waveform when simultaneously conducting the reset transistors in the pixel circuits in multiple rows, and simultaneously conducting the transfer transistors. After the output of the signal outputs Vref corresponding to the reset states of the FD unit, the signal outputs V1, V2, V3, V4, and V5 corresponding to the electric charge accumulated in the photodiode are output.

FIG. 34B corresponds to the second method of driving illustrated in FIG. 33, and illustrates an output waveform when the signals applied to the reset transistor and the transfer transistor in the pixel circuit are applied with a delay of the same duration. After the signal output Vref corresponding to the reset state of the FD unit for one pixel, the signal output V1 for one pixel corresponding to the electric charge accumulated in the photodiode is output. After that, the signal outputs corresponding to the reset state of the FD unit and the signal output corresponding to the electric charge accumulated in the photodiode that is, Vref, V2, Vref, V3, Vref, V4, Vref, and V5 are alternately output.

Example 3 of Embodiment 4

Figure 35:
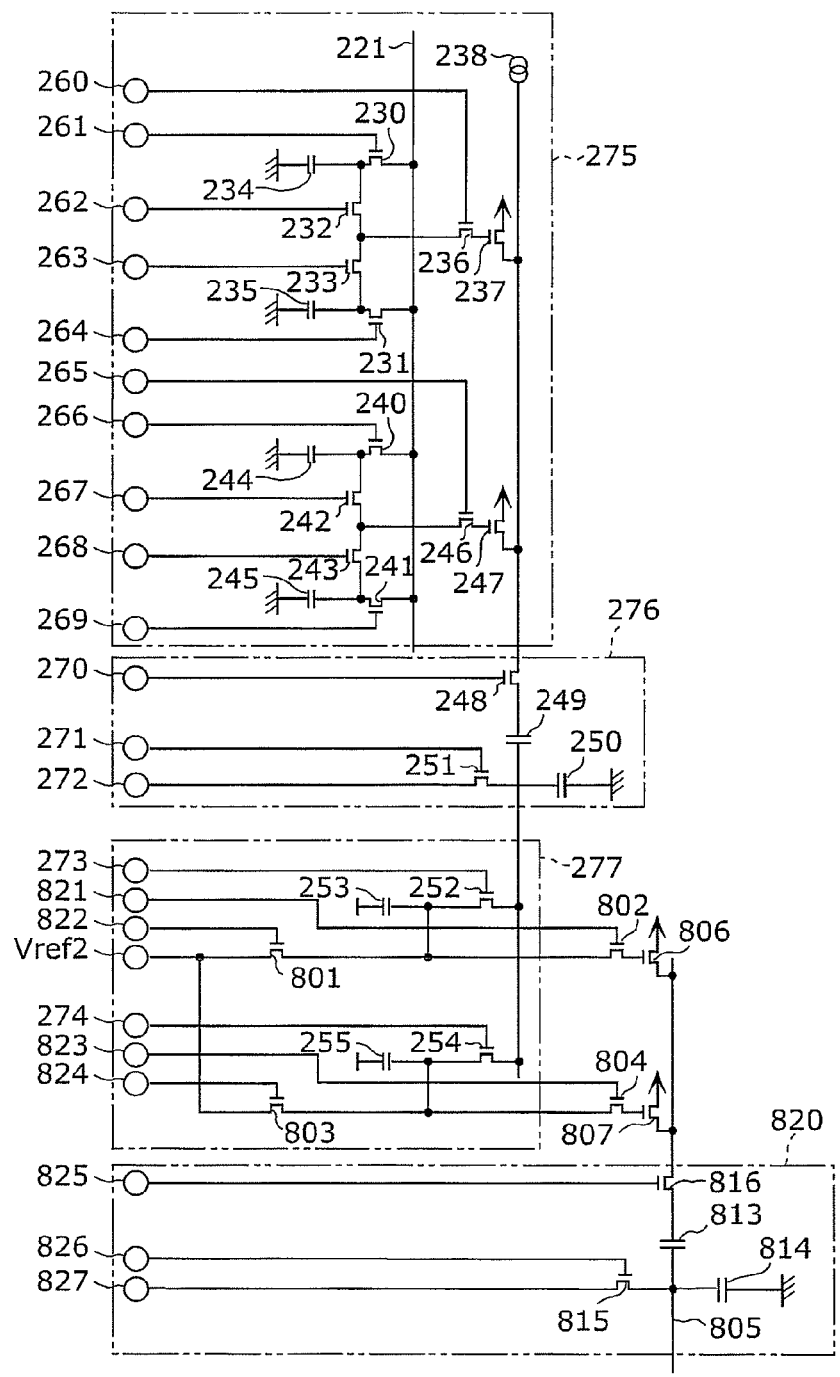
FIG. 35 is a circuit diagram illustrating a holding circuit according to Example 3 in the solid-state imaging device according to Example 1 in Embodiment 4.

FIG. 35 illustrates an example of specific internal configuration of the first storage unit 202, the first difference circuit 203, the second storage unit 204 and the second difference circuit 205 when the signal outputs V1, V2, V3, V4, and V5 corresponding to the electric charge accumulated in the photodiode after the signal outputs Vref corresponding to the reset state of the FD unit illustrated in FIG. 34A are output, as Example 3 corresponding to Example 1.

FIG. 35 illustrates a first holding circuit 275, a first difference circuit 276, a second holding circuit 277, and a second difference circuit 820 as an example of part corresponding to one column of each of the first storage unit 202, the first difference circuit 203, the second storage unit 204 and the second difference circuit 205 in FIG. 30.

As illustrated in FIG. 35, the gates of the transistors 230, 231, 232, 233, 236, 240, 241, 242, 243, 246, 248, 251, 252, 254, 801, 802, 803, 804, 816, and 815 are connected to the terminals 261, 264, 262, 263, 260, 266, 269, 267, 268, 265, 270, 271, 273, 274, 822, 821, 824, 823, 825, and 826, respectively.

The capacitor 234 is connected to the transistors 230 and 232, the capacitor 235 is connected to the transistors 231 and 233, the capacitor 244 is connected to the transistors 240 and 242, the capacitor 245 is connected to the transistors 241 and 243, the capacitors 249 and 250 are connected to the output line 256, the capacitor 253 is connected to the transistor 252, and the capacitor 255 is connected to the transistor 254. The capacitors 813 and 814 are connected to the output line 805.

The transistors 237 and 247 form source follower circuits with the current source 238 when the transistors 236 and 246 conduct, respectively.

Figure 36:
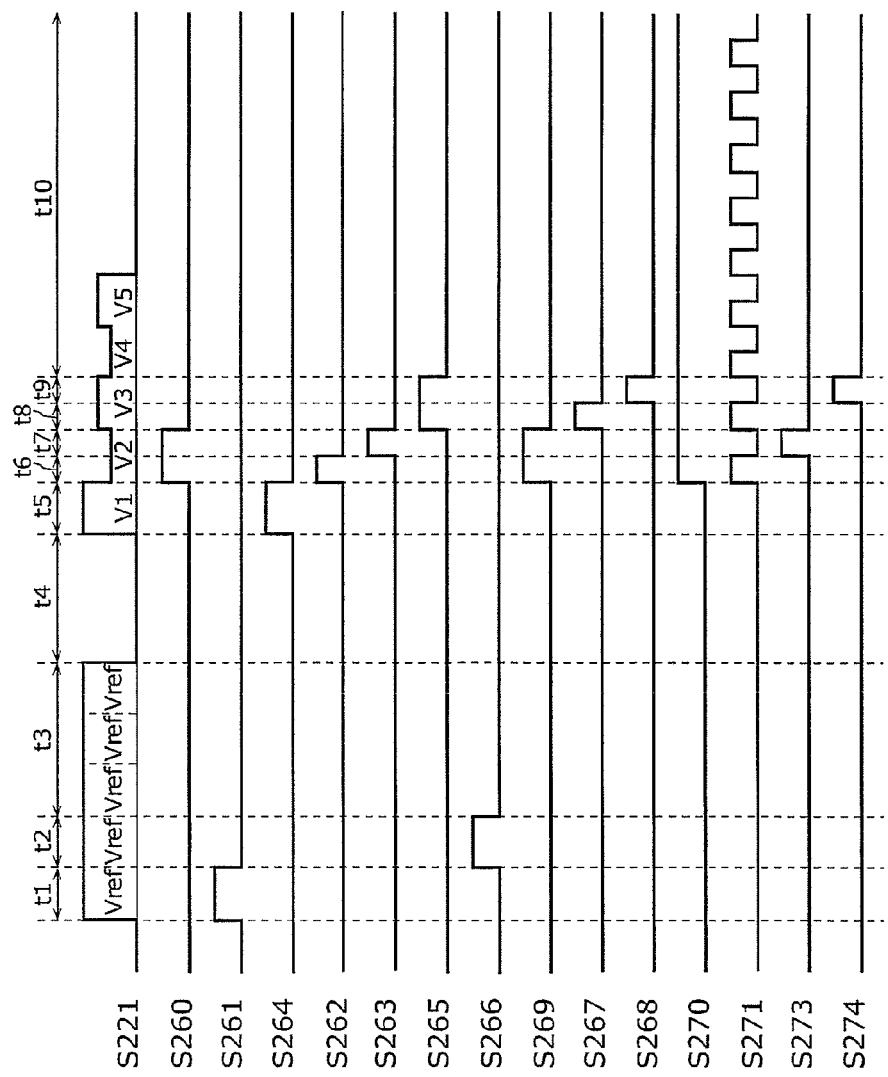
FIG. 36 is a timing chart for driving the holding circuit and the difference circuit according to Example 3 in Embodiment 4.
Figure 37:
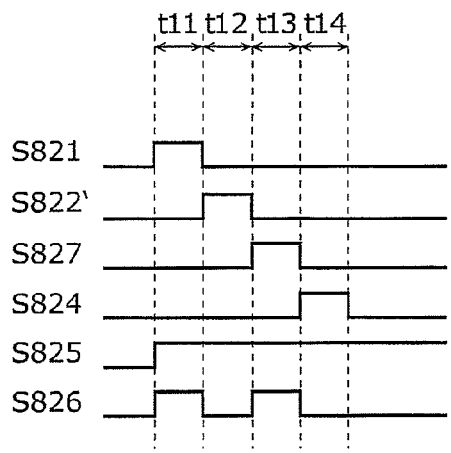
FIG. 37 is a timing chart for driving the holding circuit and the difference circuit according to Example 3 in Embodiment 4.

FIG. 36 is a timing chart illustrating temporal changes in the major signals in the first holding circuit 275, the first difference circuit 276, and the second holding circuit 277 in the solid-state imaging device 200. FIG. 37 is a timing chart illustrating the temporal change in the major signals in the second holding circuit 277 and the second difference circuit 820.

FIG. 36 illustrates control signals applied to the terminals illustrated in FIG. 35. Each control signal is represented by a sign with S added to the sign of the terminal to which the control signal is applied.

The following shall describe the method of driving the solid-state imaging device according to Example 3 with reference to FIGS. 35 and 36.

In FIG. 36, the signal S221 is a signal output to the column signal line 221, and after the output of the signal outputs Vref corresponding to the reset state of the FD unit, the signal outputs V1, V2, V3, V4, and V5 corresponding to the charges accumulated in the photodiode are sequentially output.

First, in the period t1, the signal S261 is "HIGH", conducting the transistor 230. Since the Vref signal in the pixel circuit in row 1 is output to the column signal line 221, the Vref value is held by the capacitor 234.

First, in the period t2, the signal S266 is "HIGH", conducting the transistor 240. Since the Vref signal in the pixel circuit in row 2 is output to the column signal line 221, the Vref value is held by the capacitor 244.

In the period t3, since Vref signals of the pixel circuits in row 3, row 4, and row 5 are sequentially output to the column signal line 221, the Vref value is held by the corresponding capacitor (not illustrated).

In the period t5 after the period t4, the signal S264 is "HIGH", conducting the transistor 231. Since the signal output V1 in the pixel circuit in row 1 is output to the column signal line 221, the V1 value is held by the capacitor 235.

In the periods t6 and t7, the signal 269 is "HIGH", conducting the transistor 241. Since the signal output V2 in the pixel circuit in row 2 is output to the column signal line 221, the V2 value is held by the capacitor 245.

On the other hand, in the period t6 which is the first half of the periods t6 and t7, the signals S260, S262, S270, and S271 are "HIGH", conducting the transistors 236, 232, 248, and 251. By conducting the transistors 232, 236, and 248, the Vref value of the pixel circuit in row 1 held by the capacitor 234 is transferred to an upper electrode of the capacitor 249 through the source follower circuit formed by the transistor 237 and the current source 238. A bias voltage Vb is applied to the terminal 272, and by conducting the transistor 251, the bias voltage Vb is transferred to the lower electrode of the capacitor 249. Accordingly, voltage ((Vref−Vt)−Vb) is held between the electrodes of the capacitor 249. Here, Vt is a threshold voltage of the transistor 237. With this, the capacitor 250 holds the Vb value, and the Vb value is output to the output line 256 in the first difference circuit 276.

In the subsequent period t7, the signals S260, S263, S270 and S273 are "HIGH", conducting the transistors 236, 233, 248, and 252. By conducting the transistors 233, 236, and 248, the V1 value of the pixel circuit in row 1 held by the capacitor 235 is transferred to the upper electrode of the capacitor 249 through the source follower circuit formed with the transistor 237 and the current source 38 as the voltage (V1−Vt) value. The value of the upper electrode of the capacitor 249 is (Vref−Vt) value in the period t6, and is (V1−Vt) in the period t7, and the amount of voltage change is (Vref−V1). Voltage of the output line 256 in the first difference circuit 276 changes from Vb to a value with a difference from Vb as much as a value obtained by dividing the amount of voltage change by the capacitor 249 (capacitance value C249) and the capacitor 250 (capacitance value C250), that is {(Vref−V1)×(C250/(C249+C250))}. Since the transistor 252 is conducted, the capacitor 253 holds a voltage value [Vb−{(Vref−V1)×(C250/(C249+C250))}].

Subsequently, in the periods t8 and t9, in the same manner as the periods t6 and t7, first, in the period t8, the signals S265, S267, S270 and S271 are "HIGH", conducting the transistors 246, 242, 248, and 251. By conducting the transistors 242, 246, and 248, the Vref value of the pixel circuit in row 2 held by the capacitor 244 is transferred to an upper electrode of the capacitor 249 through the source follower circuit formed by transistor 247 and the current source 238. A bias voltage Vb is applied to the terminal 272, and by conducting the transistor 251, the bias voltage Vb is transferred to the lower electrode of the capacitor 249. Accordingly, the voltage ((Vref−Vt)−Vb) is held between the electrodes of the capacitor 249, the Vb value is held by the capacitor 250, and the Vb value is output to the output line 256 in the first difference circuit 276.

In the subsequent period t9, the signals S265, S268, S270 and S274 are "HIGH", conducting the transistors 246, 243, 248, and 254. By conducting the transistors 243, 246, and 248, the V2 value in the pixel circuit in row 2 held by the capacitor 245 is transferred to the upper electrode of the capacitor 249 as the voltage (V2−Vt) value through the source follower circuit formed with the transistor 247 and the current source 238. The value of the upper electrode of the capacitor 249 is (Vref−Vt) value in the period t8, and is (V2−Vt) in the period t9, and the amount of voltage change is (Vref−V2). Furthermore, voltage of the output line 256 in the first difference circuit 276 changes from Vb to a value with a difference from Vb as much as a value obtained by dividing the amount of voltage change by the capacitor 249 (capacitance value C249) and the capacitor 250 (capacitance value C250), that is {(Vref−V2)×(C250/(C249+C250)}. Furthermore, since the transistor 254 is conducted, the capacitor 255 holds a voltage value [Vb−{(Vref−V2)×(C250/(C249+C250)}]. More specifically, in the first holding circuit 275 which includes the capacitors 234, 235, 244, and 245 and the transistors, two capacitors are used for each pixel circuit for holding the signal output Vref corresponding to the reset state of the FD unit and the signal outputs V1, V2, V3, V4, and V5 corresponding to the electric charge accumulated in the photodiode. In contrast, the second holding circuit 277 holds the difference signals of these signals output from the first difference circuit 276, using one capacitor for each pixel circuit.

Next, the description after the period t10 is made based on FIG. 37.

As illustrated in FIG. 37, in the period t11 and the period t12, the signals accumulated in the capacitor 253 in the second holding circuit 277 are read. First, in the period t11, the signals S821, S825, and S826 are "HIGH", conducting the transistors 802, 816, and 815. With this, the signals accumulated in the capacitor 253 are transmitted to the upper electrode of the capacitor 813 through the transistors 802, 806, and 816. At the same time, the voltage set at the terminal 827 is transmitted to the lower electrode of the capacitor 813 through the transistor 815.

Subsequently, in the period t12, the signals S822 is "HIGH", and the signals S826 is "LOW". Thus, the voltage value Vref 2 is transmitted to the upper electrode of the capacitor 813 through the transistor 801. After that, in the same manner as the description for the first difference circuit 276, the divided voltage value of the capacitor 813 and the capacitor 814 are output to the output line 805.

Subsequently, in the period t13 and the period t14, the divided voltage values of the signal at the capacitor 255 by the capacitor 813 and the capacitor 814 is output to the output line 805. By operating the second difference circuit 820, the variations in the threshold voltage values of the transistor 806 and the transistor 807 can be compensated.

Note that, the capacitance value of the capacitor composing the first holding circuit 275 is larger than the capacitance value of the capacitor composing the second holding circuit 277. This is because, the number of capacitors in the first holding circuit 275 is smaller than the number of capacitors in the second holding circuit 277, and kTC noise (thermal noise) is small when the capacitance value is large.

Example 4 of Embodiment 4

Figure 38:
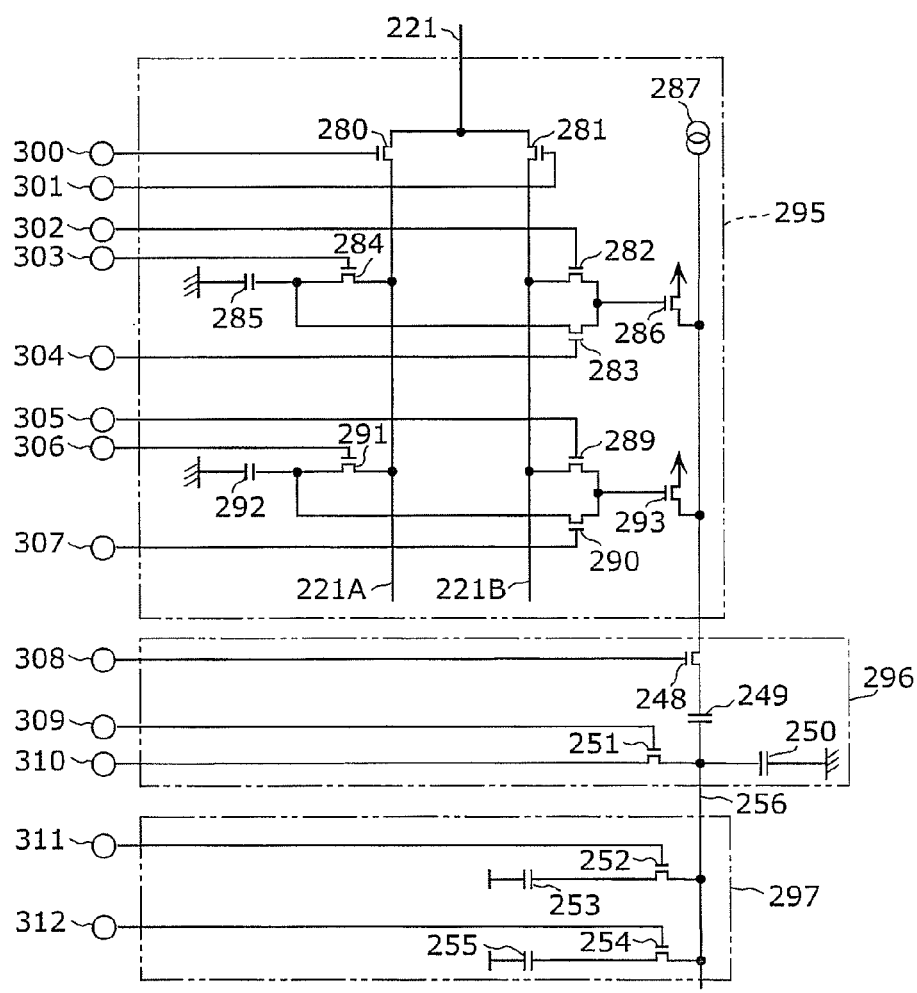
FIG. 38 is a circuit diagram illustrating a holding circuit according to Example 4 in the solid-state imaging device according to Example 2 in Embodiment 4.

FIG. 38 illustrates Example 4 corresponding to Example 2, which is an example of specific configuration in the first storage unit 202, the first difference circuit 203, and the second storage unit 204 when, after the output of the signal output Vref corresponding to the reset state of the FD unit illustrated in FIG. 34B for one pixel, to the column signal line 221, the signal output V1 for one pixel corresponding to the electric charge accumulated in the photodiode is output, and subsequently, the signal output corresponding to the reset state of the FD unit and the signal output for one pixel corresponding to the electric charge accumulated in the photodiode are alternately output such as the signal outputs Vref, V2, Vref, V3, Vref, V4, Vref, and V5, for example.

FIG. 38 illustrates a first holding circuit 295, a first difference circuit 296, and a second holding circuit 297 as an example of the part corresponding to a column of the first storage unit 202, the first difference circuit 203, and the second storage unit 204 in FIG. 30. Note that, at a stage after the second holding circuit 297, the second difference circuit as in Example 3 is connected. However, the configuration and the operations of the second difference circuit are omitted since the operation is the same as Example 3.

As illustrated in FIG. 38, the gates of the transistors 280, 281, 282, 283, 284, 289, 290, 291, 248, 251, 252, and 254 are connected to the terminals 300, 301, 302, 304, 303, 305, 307, 306, 308, 309, 311, and 312, respectively.

The capacitor 285 is connected to the transistors 283 and 284, the capacitor 292 is connected to the transistors 290 and 291, the capacitors 249 and 250 are connected to the output line 256, the capacitor 253 is connected to the transistor 252, and the capacitor 255 is connected to the transistor 254.

The transistors 286 and 293 form source follower circuits with the current source 287 when the transistors 286 and 293 conduct, respectively.

Furthermore, in the first holding circuit 295, the column signal line 221 is branching out into a first signal line 221A and a second signal line 221B, and the transistors 280, 284, and 291 are connected to the first signal line 221A, and the transistors 281, 282, and 289 are connected to the second signal line 221B.

Figure 39:
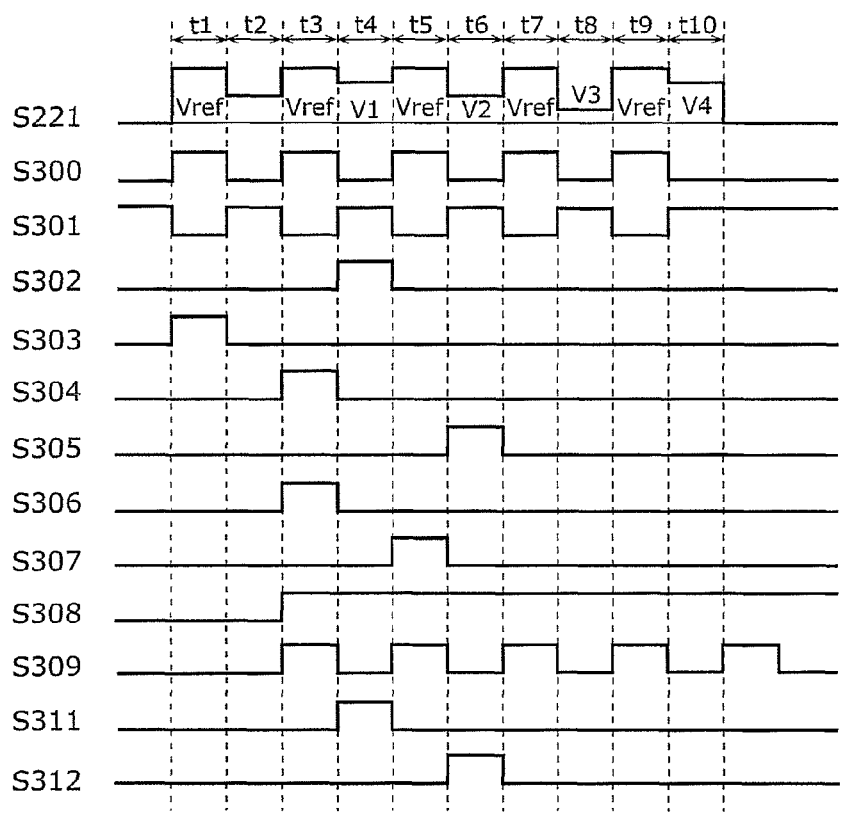
FIG. 39 is a driving timing chart for driving the holding circuit according to Example 4 in Embodiment 4.

FIG. 39 is a timing chart illustrating temporal change in the major signals in the first holding circuit, the first difference circuit, and the second holding circuit in the solid-state imaging device according to Example 4.

FIG. 39 illustrates control signals applied to the terminals illustrated in FIG. 38. Each control signal is represented by a sign with S added to the sign of the terminal to which the control signal is applied.

The following shall describe the second method of driving the solid-state imaging device according to Example 4 with reference to FIGS. 38 and 39.

In FIG. 39, the signal S221 is a signal output to the column signal line 221, and Vref corresponding to the reset state of the FD unit, the signal outputs V1, V2, V3, V4, and V5 corresponding to the charges accumulated in the photodiode are alternately output.

First, the Vref signal in the pixel circuit in row 1 is output in the period t1, and the V1 signal is output in the period t4. The description shall be made assuming that the Vref signal in the pixel circuit in row 2 is output in the period t3, and the V2 signal is output in the period t6, and the signals from the pixel circuits in row 3 and after are output in the same manner.

First, in the period t1, the signals S300 and S303 are "HIGH", conducting the transistors 280 and 284. When the transistor 280 conducts, the Vref signal in the pixel circuit in row 1 is transmitted to the first signal line 221A from the column signal line 221, and since the transistor 284 is conducted, the Vref value is held by the capacitor 285.

Next, in the period t2, the signal S301 is "HIGH", conducting the transistor 281 and the signals from the column signal line 221 is transmitted to the second signal line 221B.

Next, in the period t3, the signals S300, S304, S306, S308 and S309 are "HIGH", conducting the transistors 280, 283, 291, 248, and 251. By conducting the transistors 280 and 291, the Vref value in the pixel circuit in row 2 in the column signal line 221 is held by the capacitor 292. On the other hand, by the conducting the transistors 283, 248, and 251, the Vref signal in the pixel circuit in row 1 held by the capacitor 285 is transferred to the upper electrode of the capacitor 249 through the source follower circuit composed of the transistor 286 and the current source 287. A bias voltage Vb is applied to the terminal 310, and by conducting the transistor 251, the bias voltage Vb is transferred to the lower electrode of the capacitor 249. Accordingly, voltage ((Vref−Vt)−Vb) is held between the electrodes of the capacitor 249. Here, Vt is a threshold voltage of the transistor 286. With this, the capacitor 250 holds the Vb value, and the Vb value is output to the output line 256 in the first difference circuit 296.

Next, in the period t4, the signals S301, S302, S308, and S311 are "HIGH", conducting the transistors 281, 282, and 252. By conducting the transistors 281 and 282, the V1 value in the pixel circuit in row 1 is guided to the second signal line 221B from the column signal line 221, and the voltage (V1−Vt) value is transferred to the upper electrode of the capacitor 249 through the source follower circuit formed with the transistor 286 and the current source 287. The value of the upper electrode of the capacitor 249 is (Vref−Vt) value in the period t3, and is (V1−Vt) in the period t4, and the voltage change is (Vref−V1). Furthermore, voltage output from the output line 256 in the first difference circuit 276 is a voltage changed from Vb to a value with a difference from Vb as much as a value obtained by dividing the amount of voltage change by the capacitor 249 (capacitance value C249) and the capacitor 250 (capacitance value C250), that is {(Vref−V1)×(C250/(C249+C250)}. Furthermore, since the transistor 252 is conducted, the capacitor 253 holds a voltage value [Vb−{(Vref−V1)×(C250/(C249+C250)}]. More specifically, a value according to a difference between the Vref value in the pixel circuit in row 1 and the V1 value is held by the capacitor 253.

Subsequently, in the period t5, the Vref value of the pixel circuit in row 3 is held by the capacitor which is not illustrated, and Vref of the pixel circuit in row 2 held by the capacitor 292 is transferred to the upper electrode of the capacitor 249.

Furthermore, in the period t6, by the operation similar to the operation in the period t4, the V2 value of the column signal line 221 is guided to the upper electrode of the capacitor 249, and the capacitor 255 holds a voltage value [Vb−{(Vref−V2)×(C250/(C249+C250)}]. More specifically, a value according to a difference between the Vref value in the pixel circuit in row 2 and the V2 value is held by the capacitor 255.

As such, according to Example 4, in the same manner as Example 3, the difference signals each of which is a difference signal between Vref of the signal output corresponding to the reset state of the FD units and the signal outputs V1, V2, V3, V4, or V5 corresponding to the electric charge accumulated in the photodiode are output by the first difference circuit 296, and the difference signals are held by the second holding circuit 297 using one capacitor for each pixel circuit.

As described above, the capacitors 234, 235, 244, 245, 249, 253, and 255, and the capacitors 285, 292, 249, 253, and 255 hold signal voltage in analog values.

Note that, the capacitance value of the capacitor composing the first holding circuit 295 according to Embodiment 4 illustrated in FIG. 38 is set to be larger than the capacitance value of the capacitor composing the second holding circuit 297. This is because, the number of capacitors in the first holding circuit 295 is smaller than the number of capacitors in the second holding circuit 297, and kTC noise (thermal noise) is small when the capacitance value is large.

As described above, according to Embodiment 4, the holding circuit for holding the electric signals output from each pixel is provided outside of the pixel circuit with no strong demand for reducing the area of the footprint. Thus, it is possible to use a relatively large capacitor for the holding circuit, allowing holding the electric signals with low noise for a longer time, compared to the case when the electric signals are held in the pixel circuits. Furthermore, the holding circuit is divided into the first holding circuit and the second holding circuit, and a first difference circuit is provided between the first holding circuit and the second holding circuit. With this, a difference electric signal between the electric signal in the reset state of the corresponding pixel circuit and the electric signal after the pixel circuit receives light can be obtained by the first holding circuit and the first difference circuit, and the difference electric signal may be held by the second holding circuit. With this, it is possible to reduce the area for the holding circuit.

Although only some exemplary embodiments of the solid-state imaging device according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The solid-state imaging device according to the present invention is applicable to imaging device which requires high image quality and high function such as high-grade compact camera and a digital single-lens reflex camera as a CMOS image sensor applicable to the shutter operations including global shutter operations and capable of suppressing the reduction in the image quality of the obtained image.

What is claimed is:
1. A solid-state imaging device comprising:
   a plurality of pixel circuits which are arranged in rows and columns, and each of which outputs an electric signal according to an amount of received light;
   a column signal line, provided for each of the columns, for sequentially transferring electric signals from pixel circuits in a corresponding column;
   at least three holding circuits which are connected to the column signal line in the corresponding column, and respectively hold the electric signal transferred from a corresponding pixel circuit of the plurality of pixel circuits in the corresponding column through the column signal line; and
   a vertical scanning circuit which generates a plurality of driving signals, each of the plurality of driving signals being supplied to pixel circuits in a corresponding row and having a corresponding valid period, wherein:
   the plurality of driving signals includes a first driving signal having a first valid period and a second driving signal having a second valid period,
   the first driving signal drives pixel circuits in a first row and the second driving signal drives pixel circuits in a second row, and
   the second valid period starts within the first valid period.
2. The solid-state imaging device according to claim 1, wherein:
   each of the at least three holding circuits includes:
      a first capacitor which holds a first electric signal of the corresponding pixel circuit in a reset state; and
      a second capacitor which holds a second electric signal after the corresponding pixel circuit receives light, and
   the solid-state imaging device further comprises a difference circuit provided for each column, and the difference circuit calculates a difference between the first electric signal held by the first capacitor and the second electric signal held by the second capacitor.

3. The solid-state imaging device according to claim 1, wherein:
each of the plurality of pixel circuits includes:
a photodiode which generates electric charge according to the amount of received light;
a transfer transistor connected to an output of the photodiode;
a floating diffusion unit configured to convert the electric charge generated by the photodiode and transferred via the transfer transistor into voltage;
a reset transistor which sets the floating diffusion unit to a reset state; and
an output transistor having a gate connected to the floating diffusion unit,
the output transistor outputs an electric signal according to the voltage converted by the floating diffusion unit, and
gates of the transfer transistors are commonly connected and gates of the reset transistor are commonly connected.

4. The solid-state imaging device according to claim 1, wherein:
each of the plurality of pixel circuits includes:
a photodiode which generates electric charge according to the amount of received light;
a transfer transistor connected to an output of the photodiode;
a floating diffusion unit configured to convert the electric charge generated by the photodiode and transferred via the transfer transistor into voltage;
a reset transistor which sets the floating diffusion unit to a reset state; and
an output transistor having a gate connected to the floating diffusion unit, and
the output transistor outputs an electric signal according to the voltage converted by the floating diffusion unit,
the plurality of pixel circuits are grouped for each predetermined number of rows, and
gates of the transfer transistors in the plurality of pixel circuits in a group are commonly connected and gates of the reset transistor in the plurality of pixel circuits in a group are commonly connected.

5. The solid-state imaging device according to claim 3, wherein each of the plurality of pixel circuits further includes another transfer transistor, which is different from the transfer transistor, inserted between the floating diffusion unit and the output transistor.

6. The solid-state imaging device according to claim 1, wherein each of the at least three holding circuits holds the electric signal as an analog value.

7. The solid-state imaging device according to claim 1, further comprising a buffer circuit provided for each column and configured to sequentially output a voltage signal according to an output current from the plurality of pixel circuits in the corresponding column to the column signal line in the corresponding column,
wherein the corresponding one of the at least three holding circuits in each column holds the voltage signal transferred from the buffer circuit in the corresponding column through the column signal line of the corresponding column.

8. The solid-state imaging device according to claim 7, wherein said the buffer circuit includes a current mirror circuit and a difference circuit.

9. The solid-state imaging device according to claim 7, further comprising a plurality of sets of the buffer circuit and the column signal line, each of the sets being provided for a corresponding column,
wherein the buffer circuit in each set outputs the voltage signal according to an output current from the plurality of pixel circuits to the column signal line in the set, the plurality of pixel circuits being different for each set of the corresponding column, and
each of the at least three holding circuits in each column holds the voltage signal transferred from the buffer circuit in the set in the corresponding column through the column signal line in the set.

10. The solid-state imaging device according to claim 1, further comprising a column amplifier inserted between the column signal line in the corresponding column and the corresponding one of the at least three holding circuits in the corresponding column, for each column.

11. The solid-state imaging device according to claim 1 wherein the first valid period and the second valid period have a same length of time, and are independent from each other.

12. The solid-state imaging device according to claim 1, wherein:
each of the plurality of pixel circuits includes:
a photodiode which generates electric charge according to an amount of received light;
a transfer transistor connected to an output of the photodiode;
a floating diffusion unit configured to convert the electric charge generated by the photodiode and transferred via the transfer transistor into voltage;
a reset transistor which sets the floating diffusion unit to a reset state; and
an output transistor having a gate connected to the floating diffusion unit,
the output transistor outputs a first electric signal when the floating diffusion unit is in reset state and a second electric signal according to the voltage signal,
each of the plurality of driving signals includes a reset gate driving signal for turning ON the reset transistor included in the pixel circuit and a transfer gate driving signal for turning ON the transfer transistor included in the pixel circuit, and
the vertical scanning circuit generates one of or both of the reset gate driving signal and the transfer gate driving signal to supply the generated signal to the pixel circuit in the corresponding row.

13. The solid-state imaging device according to claim 12, wherein, after supplying the pixel circuit in one row with the reset-gate driving signal and supplying the pixel circuit in another row with the reset-gate driving signal, the vertical scanning circuit supplies the pixel circuit in the one row with the transfer gate signal.

14. The solid-state imaging device according to claim 12, wherein output of the first electric signal from the pixel circuit in one row and the second electric signal from the pixel circuit in another row is sequentially provided to the column signal line.

15. The solid-state imaging device according to claim 12, further comprising a memory scanning circuit for selecting, among the at least three holding circuits, a holding circuit to hold the first electric signal, and a holding circuit to hold the second electric signal, in synchronization with the vertical scanning circuit.

16. The solid-state imaging device according to claim 12, wherein:

the column signal line includes a load transistor included in a source follower circuit together with the output transistor, and the source follower circuit sequentially outputs the electric signals from the plurality of pixel circuits to the column signal line.

17. The solid-state imaging device according to claim 12, wherein:

the column signal line includes a load transistor included in a current amplifier circuit together with the output transistor, and the current amplifier circuit sequentially outputs the electric signals from the plurality of pixel circuits to the column signal line.

18. The solid-state imaging device according to claim 1, wherein the vertical scanning circuit generates a selection signal for the pixel circuits in the first row to output the electric signal in a part of the first valid period of the first driving signal, and supplies the pixel circuits in the first row with the selection signal.

19. The solid-state imaging device according to claim 18, wherein the vertical scanning circuit generates the selection signal in a predetermined period immediately before an end of the first driving signal in the first row.

20. The solid-state imaging device according to claim 1, further comprising a second holding circuit for holding an output signal from a first holding circuit, which is one of the at least three holding circuits.

21. The solid-state imaging device according to claim 20, wherein:

the first holding circuit includes:
a first capacitor which holds a first electric signal of the pixel circuit in a reset state; and
a second capacitor which holds a second electric signal after the corresponding pixel circuit receives light, the solid-state imaging device further comprises a difference circuit provided for each column, which calculates a difference between the first electric signal held by the first capacitor and the second electric signal held by the second capacitor, the first capacitor and the second capacitor being included in the first holding circuit, and the second holding circuit holds an electric signal representing the difference calculated by the difference circuit.

22. The solid-state imaging device according to claim 21, wherein:

the first holding circuit includes a capacitor which holds an electric signal of a corresponding pixel circuit in a reset state, the solid-state imaging device further comprises a difference circuit provided for each column, which calculates a difference between a first electric signal held by the capacitor in the first holding circuit in a corresponding column and the first electric signal after the corresponding pixel circuit receives light, and the second holding circuit holds an electric signal representing the difference in the difference circuit.

23. The solid-state imaging device according to claim 21, wherein the first holding circuit and the second holding circuit hold the electric signal as an analog value.

24. The solid-state imaging device according to claim 21, wherein a capacitance value of the first holding circuit is larger than a capacitance value of the second holding circuit.

25. A driving method for driving a solid-state imaging including: a plurality of pixel circuits arranged in rows and columns; a column signal line provided for each of the columns; and at least three holding circuits connected to the column signal line in each column, the driving method comprising steps of:

outputting electric signals, each of the electric signals being output by one of the plurality of pixel circuits according to an amount of received light;

sequentially transferring the electric signals from pixel circuits of the plurality of pixel circuits in a corresponding column through the column signal line;

holding each of the electric signals transferred from the pixel circuits in a corresponding one of the at least three holding circuits through the column signal line in the corresponding column; and generating a plurality of driving signals each having a corresponding valid period; and supplying each of the plurality of driving signals to pixel circuits in a corresponding row, wherein:

the plurality of driving signals includes a first driving signal having a first valid period and a second driving signal having a second valid period, the first driving signal drives pixel circuits in a first row and the second driving signal drives pixel circuits in a second row, and the second valid period starts within the first valid period.

26. The driving method according to claim 25, wherein:

the solid state imaging device further includes a difference circuit provided for each column, and each of the at least three holding circuits includes a first capacitor and a second capacitor, the step of holding includes holding, by the first capacitor, a first electric signal of the corresponding pixel circuit in a reset state; and holding, by the second capacitor, a second electric signal after the corresponding pixel circuit receives light, and the driving method further comprises a step of calculating, by the at least three holding circuits provided for each column, a difference between the first electric signal held by the first capacitor and the second electric signal held by the second capacitor.

27. The driving method according to claim 25, wherein:

the first valid period and the second valid period have a same length of time, and are independent from each other.

28. The driving method according to claim 25, wherein:

each of the plurality of driving signals includes a reset gate driving signal for resetting the pixel circuit and a transfer gate driving signal for transferring an electric charge generated in the pixel circuit according to an amount of received light, and in the step of supplying, after supplying the pixel circuit in one row with the reset-gate driving signal and supplying the pixel circuit in another row with the reset-gate driving signal, the vertical scanning circuit supplies the pixel circuit in the one row with the transfer gate signal.

29. The driving method according to claim 25, wherein:

in the step of outputting, the pixel circuit outputs a first electric signal in reset state and a second electric signal after receiving light, and in the step of transferring, the column signal line sequentially transfers the first electric signal from the pixel circuit in one row and the second electric signal from the pixel circuit in another row.

* * * * *